US009024632B2

(12) United States Patent
Furuichi et al.

(10) Patent No.: US 9,024,632 B2
(45) Date of Patent: May 5, 2015

(54) MAGNETIC SENSOR WITH A PLURALITY OF HEATER PORTIONS TO FIX THE DIRECTION OF MAGNETIZATION OF A PINNED MAGNETIC LAYER

(75) Inventors: Takamoto Furuichi, Nagoya (JP); Hisanori Yokura, Obu (JP); Toshifumi Yano, Obu (JP)

(73) Assignee: DENSO CORPORATION, Kariya (JP)

( * ) Notice: Subject to any disclaimer, the term of this patent is extended or adjusted under 35 U.S.C. 154(b) by 339 days.

(21) Appl. No.: 13/477,208

(22) Filed: May 22, 2012

(65) Prior Publication Data

US 2012/0306490 A1 Dec. 6, 2012

(30) Foreign Application Priority Data

May 30, 2011 (JP) .................................. 2011-120103
Sep. 19, 2011 (JP) .................................. 2011-203972
Apr. 20, 2012 (JP) .................................. 2012-096696

(51) Int. Cl.
*G01R 33/09* (2006.01)
*H01L 43/08* (2006.01)
*H01L 43/12* (2006.01)
*H01L 27/22* (2006.01)

(52) U.S. Cl.
CPC ............ *G01R 33/093* (2013.01); *G01R 33/098* (2013.01); *H01L 43/08* (2013.01); *H01L 43/12* (2013.01); *H01L 27/22* (2013.01)

(58) Field of Classification Search
USPC ..................................... 324/207.21, 251, 252
See application file for complete search history.

(56) References Cited

U.S. PATENT DOCUMENTS 5,561,368 A * 10/1996 Dovek et al. ................... 324/252
5,691,867 A    11/1997 Onuma et al.
5,869,963 A *  2/1999 Saito et al. ..................... 324/252
5,958,612 A    9/1999 Saito et al.

(Continued)

FOREIGN PATENT DOCUMENTS

JP     A-06-160427     6/1994
JP     A-06-275887     9/1994

(Continued)

OTHER PUBLICATIONS

Office Action mailed May 28, 2013 in corresponding JP patent application No. 2012-096696 (and English translation).

(Continued)

*Primary Examiner* — Jay Patidar
(74) *Attorney, Agent, or Firm* — Posz Law Group, PLC

(57) ABSTRACT

A magnetic sensor is provided, including: a substrate; a plurality of magneto resistance element portions, disposed above the substrate, each including: a free magnetic layer having a magnetization direction changeable by an external magnetic field; and a pin magnetic layer having a fixed magnetization direction; and a plurality of heater portions corresponding to the magneto resistance element portions, respectively, and configured to heat a corresponding pin magnetic layer, wherein the magnetization direction of the pin magnetic layer of one magneto resistance element portion is different from the magnetization direction of the pin magnetic layer of another magneto resistance element portion on a plane parallel to a surface of the substrate, when the external magnetic field is applied to each of the magneto resistance element portions, the magnetic sensor detects a physical amount based on a change in a resistance of each of the magneto resistance element portions.

38 Claims, 33 Drawing Sheets

(56) References Cited

U.S. PATENT DOCUMENTS

| | | | |
|---|---|---|---|
| 6,462,541 B1 * | 10/2002 | Wang et al. | 324/252 |
| 6,501,678 B1 | 12/2002 | Lenssen et al. | |
| 2001/0020847 A1 * | 9/2001 | Mattheis et al. | 324/207.21 |
| 2004/0104724 A1 | 6/2004 | Sato | |
| 2004/0112469 A1 | 6/2004 | De Haas et al. | |
| 2005/0104146 A1 | 5/2005 | Nickel et al. | |
| 2006/0127701 A1 | 6/2006 | Ruigrok et al. | |
| 2009/0279212 A1 | 11/2009 | Engel et al. | |
| 2011/0121826 A1 | 5/2011 | Engel et al. | |

FOREIGN PATENT DOCUMENTS

| | | |
|---|---|---|
| JP | A-09-22510 | 1/1997 |
| JP | H09-097895 A | 4/1997 |
| JP | A-H11-505966 | 5/1999 |
| JP | A-2001-183433 | 7/2001 |
| JP | A-2001-221668 | 8/2001 |
| JP | A-2006-269866 | 10/2006 |

OTHER PUBLICATIONS

Office Action mailed Jul. 9, 2013 in the corresponding JP application No. 2011-203972 (English translation).

Office Action dated Apr. 23, 2014 issued in the corresponding CN patent application No. 201210174051.7 (and English translation).

* cited by examiner

THICK DIRECTION

MAGNETIC SENSOR WITH A PLURALITY OF HEATER PORTIONS TO FIX THE DIRECTION OF MAGNETIZATION OF A PINNED MAGNETIC LAYER

CROSS REFERENCE TO RELATED APPLICATIONS

This application is based on Japanese Patent Applications No. 2011-120103 filed on May 30, 2011, No. 2011-203972 filed on Sep. 19, 2011, and No. 2012-096696 filed on Apr. 20, 2012, the disclosures of which are incorporated herein by reference.

TECHNICAL FIELD

The present disclosure relates to a magnetic sensor and a manufacturing method of the same.

BACKGROUND

As a known technology, a magnetic sensor which detects a rotation angle of an object using a GMR element (Giant Magneto Resistance; GMR), or a TMR element (Tunneling Magneto Resistance; TMR), which has a free magnetic layer and a pin magnetic layer, is known. With these elements, an angle can be detected by the output of the element varying in accordance with a difference between the magnetization direction of the pin magnetic layer fixed in one direction and the magnetization direction of the free magnetic layer influenced by an external magnetic field.

Normally, the magnetization direction of the pin magnetic layer is determined by carrying out annealing at in the order of 300° while applying a magnetic field. In this case, as the magnetization of each pin magnetic layer is carried out while applying a magnetic field to the whole of a wafer on which a plurality of elements are formed, all the magnetization directions of the pin magnetic layers are the same direction in one wafer. Because of this, an output signal is of one of a cosine curve or a sine curve, and 360° cannot be detected using one element.

Hence, in order to enable a detection of 360°, there is a need for a structure wherein a cosine curve and a sine curve can be obtained by disposing two chips so that the magnetization directions of the pin magnetic layers differ 90° from one another. In order to realize this structure, heretofore, a plurality of elements having pin magnetic layers whose magnetization directions are the same have been formed on one wafer, as heretofore described, and after the wafer has been divided into chips, one for each of the elements, two chips have been packaged so that the magnetization directions of the pin magnetic layers differ 90° from one another.

However, with this method, as the number of chips increases, there has been a problem in that the method leads to an increase in cost. Also, as it is necessary to control the directions of the chips so that the magnetization directions of the pin magnetic layers differ 90° from one another, there has been a possibility of rotation detection accuracy decreasing due to an assembly error. Because of this, a pin magnetic layer multipolarization technology wherein a large number of magnetization directions are provided in one wafer is demanded.

Hence, Patent Document 1 proposes a method whereby a magnetic field is applied to a wafer on which a large number of elements are formed, and an element, the magnetization direction of whose pin magnetic layer is intended to be fixed, is irradiated with a current pulse or a laser pulse, thus fixing the pin magnetic layer of the element irradiated with the pulse. With this method, the magnetization direction of each pin magnetic layer can be controlled without dividing the wafer.

However, in Patent Document 1, as the element on the wafer is irradiated with a current pulse or a laser pulse, the heat of the pulse diffuses to the wafer. Because of this, there is a problem in that the accuracy of magnetization of the pin magnetic layer of the element decreases, and thus detection accuracy decreases.

As another technology of heating elements, a technology whereby an action of an MRAM device is aided by the heat of a heater material is proposed in JP-A-2005-150739. However, as it is necessary, when magnetizing a pin magnetic layer, to heat the pin magnetic layer at a temperature of approximately 300° C., the heater material for aiding the action of the MRAM device cannot be used in magnetization.

Also, Patent Document 2 proposes a method of providing a difference in magnetization angle between a heating region and a non-heating region by heating one portion of elements. Specifically, as a method for changing the magnetization directions of elements in the same chip in a reproduction magnetic head, a magnetization angle adjusting method using the fact that a difference in holding power occurs between magnetic bodies when heating one portion of the elements is proposed in Patent Document 2.

As a structure of a magnetic head, Patent Documents 3 and 4 propose a structure wherein a recessed portion is provided in a substrate, an insulating body is formed in the recessed portion, and a coil is formed on the insulating body.

However, with the heating method shown in Patent Document 2, when long time heating is carried out on one portion of the elements in order to carry out sufficient magnetization, thermal diffusion occurs wherein heat conducts through the substrate, and there is a problem in that another element is also overheated. Because of this, an angle error occurs in each element, affecting detection accuracy. Consequently, in a magnetic sensor, of which angle detection accuracy is required, such as detects a rotation angle, a structure is demanded wherein magnetization directions can be changed on one chip while reducing an angle error caused by thermal diffusion.

Patent Document 1: JP-A-2003-502876
Patent Document 2: JP-A-2006-269866
Patent Document 3: JP-A-H9-22510
Patent Document 4: JP-A-H9-22512

SUMMARY

It is an object of the present disclosure to provide a magnetic sensor manufacturing method with which, even in the event that pin magnetic layers of a plurality of magneto resistance element portions formed on one substrate are magnetized in any direction, a decrease in the detection accuracy of the magneto resistance element portions can be prevented. Also, the present disclosure has another object to provide a semiconductor device having a magnetic sensor including a structure for realizing the method. Furthermore, the present disclosure has a third object to provide a magnetic sensor manufacturing method with which, even in the event that pin magnetic layers of a plurality of magneto resistance element portions formed on one substrate are magnetized in any direction, the influence of thermal diffusion caused by the magnetization can be reduced. Also, the present disclosure has a fourth object to provide a magnetic sensor including a structure for realizing this method.

According to a first aspect of the present disclosure, a manufacturing method of a magnetic sensor which includes:

a substrate having one surface; and a plurality of magneto resistance element portions, arranged above the one surface of the substrate, each of which includes a free magnetic layer having a magnetization direction changeable in accordance with an external magnetic field and a pin magnetic layer having a fixed magnetization direction, wherein the fixed magnetization direction of the pin magnetic layer of one of the magneto resistance element portions is different from the fixed magnetization direction of the pin magnetic layer of another one of the magneto resistance element portions on a plane parallel to the one surface of the substrate, and wherein, when the external magnetic field is applied to each of the magneto resistance element portions, the magnetic sensor detects a physical amount based on a change in a resistance of each of the magneto resistance element portions, the manufacturing method of the magnetic sensor comprises: preparing the substrate; forming each of the magneto resistance element portions above the one surface of the substrate; forming a plurality of heater portions corresponding to the magneto resistance element portions, respectively; arranging the substrate, on which each of the magneto resistance element portions is formed, in the external magnetic field having an external magnetic field direction set to a first direction on the plane, heating with one portion of the heater portions corresponding to one portion of the plurality of magneto resistance element portions so as to execute a magnetic field annealing process, and thereby, magnetizing the pin magnetic layers of the one portion of the magneto resistance element portions in the first direction as the fixed magnetization direction; and arranging the substrate, on which each of the magneto resistance element portions is formed, in another external magnetic field having another external magnetic field direction set to a second direction on the plane different from the first direction, heating with another portion of the heater portions corresponding to another portion of the plurality of magneto resistance element portions different from the one portion of the plurality of magneto resistance element portions so as to execute another magnetic field annealing process, and thereby, magnetizing the pin magnetic layers of the another portion of the magneto resistance element portions in the second direction as the fixed magnetization direction.

According to this, by the heater portion corresponding to the magneto resistance element portion intended to be magnetized being heated in a magnetic field, only the relevant magneto resistance element portion can be magnetized. Also, by changing the direction of applied magnetic field, and heating the heater portion corresponding to another magneto resistance element portion, only the relevant magneto resistance element portion can be magnetized. In this way, each of the magneto resistance element portions formed on one substrate can be selectively magnetized in a differing magnetization direction. Also, as the direction of the substrate in the magnetic field can be adjusted while confirming the output of the magnetic sensor in the magnetization steps, variation in the output of the magnetic sensor can be corrected more in comparison with a case of realizing multipolarization by combining chips differing in magnetization direction. Because of this, a decrease in detection accuracy due to an assembly error of chips differing in magnetization direction can be prevented. Also, as the heater portions are heated by causing current to flow through the heater portions, the magneto resistance element portions can be extensively heated at one time, and a processing time can be shortened.

According to a second aspect of the present disclosure, a magnetic sensor comprises: a substrate having one surface; and a plurality of magneto resistance element portions, disposed above the one surface of the substrate, each of which includes: a free magnetic layer having a magnetization direction changeable in accordance with an external magnetic field; and a pin magnetic layer having a fixed magnetization direction. The magnetization direction of the pin magnetic layer of one of the magneto resistance element portions is different from the magnetization direction of the pin magnetic layer of another one of the magneto resistance element portions on a plane parallel to the one surface of the substrate. When the external magnetic field is applied to each of the magneto resistance element portions, the magnetic sensor detects a physical amount based on a change in a resistance of each of the magneto resistance element portions. The magnetic sensor further comprises: a plurality of heater portions corresponding to the magneto resistance element portions, respectively, wherein each heater portion heats a corresponding pin magnetic layer when the pin magnetic layer is magnetized, so that the pin magnetic layer of the one of the magneto resistance element portions is magnetized in a direction as the fixed magnetization direction, which is different from the fixed magnetization direction of the pin magnetic layer of the another one of the magneto resistance element portions.

According to the heretofore described magnetic sensor, as the substrate has the heater portions corresponding to the magneto resistance element portions, a magnetic sensor which can selectively magnetize the pin magnetic layer of the magneto resistance element portion intended to be magnetized can be provided. Also, as magnetization can be carried out while adjusting the direction of the substrate in a magnetic field while confirming the output of the magnetic sensor, variation in the output of the magnetic sensor can be corrected more in comparison with a case of realizing multipolarization by combining chips differing in magnetization direction. Because of this, a magnetic sensor with no decrease in detection accuracy due to an assembly error of chips differing in magnetization direction, and with good detection accuracy, can be provided. Also, as the heater portions are heated by causing current to flow through the heater portions, the magneto resistance element portions can be extensively heated at one time, and a processing time can be shortened.

According to a third aspect of the present disclosure, a manufacturing method of a magnetic sensor which includes: a substrate having one surface; and a plurality of magneto resistance element portions, arranged above the one surface of the substrate, each of which includes a free magnetic layer having a magnetization direction changeable in accordance with an external magnetic field and a pin magnetic layer having a fixed magnetization direction, wherein the fixed magnetization direction of the pin magnetic layer of one of the magneto resistance element portions is different from the fixed magnetization direction of the pin magnetic layer of another one of the magneto resistance element portions on a plane parallel to the one surface of the substrate, and wherein, when the external magnetic field is applied to each of the magneto resistance element portions, the magnetic sensor detects a physical amount based on a change in a resistance of each of the magneto resistance element portions, the manufacturing method of the magnetic sensor comprises: preparing the substrate; forming each of the magneto resistance element portions above the one surface of the substrate; forming a plurality of space portions in certain portions of the substrate corresponding to the magneto resistance element portions, respectively, so that a thickness of each certain portion of the substrate is smaller than a thickness of another portion of the substrate different from the certain portions; arranging the substrate, on which each of the magneto resistance element portions is formed, in the external magnetic field having an external magnetic field direction set to a first direction on the plane, heating one portion of the plurality of magneto resistance element portions locally so as to execute a magnetic field annealing process, and thereby, magnetizing the pin magnetic layers of the one portion of the magneto resistance element portions in the first direction as the fixed magnetization direction; and arranging the substrate, on which each of the magneto resistance element portions is formed, in another external magnetic field having another external magnetic field direction set to a second direction on the plane different from the first direction, heating another portion of the plurality of magneto resistance element portions different from the one portion of the plurality of magneto resistance element portions so as to execute a magnetic field annealing process, and thereby, magnetizing the pin magnetic layers of the another portion of the magneto resistance element portions in the second direction as the fixed magnetization direction.

According to the heretofore described manufacturing method, as the space portions are provided in portions of the substrate corresponding to the magneto resistance element portions, the thermal conduction of portions of the substrate reduced in thickness by the space portions can be suppressed. Consequently, the influence of thermal diffusion on the other magneto resistance element portions can be reduced in the magnetization steps.

According to a fourth aspect of the present disclosure, a magnetic sensor comprises: a substrate having one surface; and a plurality of magneto resistance element portions, disposed above the one surface of the substrate, each of which includes: a free magnetic layer having a magnetization direction changeable in accordance with an external magnetic field; and a pin magnetic layer having a fixed magnetization direction. The magnetization direction of the pin magnetic layer of one of the magneto resistance element portions is different from the magnetization direction of the pin magnetic layer of another one of the magneto resistance element portions on a plane parallel to the one surface of the substrate. When the external magnetic field is applied to each of the magneto resistance element portions, the magnetic sensor detects a physical amount based on a change in a resistance of each of the magneto resistance element portions. The substrate includes a plurality of space portions disposed in certain portions of the substrate corresponding to the magneto resistance element portions, respectively, so that a thickness of each certain portion of the substrate is smaller than a thickness of another portion of the substrate different from the certain portions.

As the substrate has the space portions corresponding to the magneto resistance element portions in this way, a structure wherein the thermal conduction of the portions of the substrate reduced in thickness by the space portions can be suppressed can be adopted. Consequently, a structure wherein, when magnetizing the pin magnetic layer of the magneto resistance element portion, the influence of thermal diffusion on the other magneto resistance element portion can be reduced can be adopted.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION (First Embodiment)

Figure 1A:
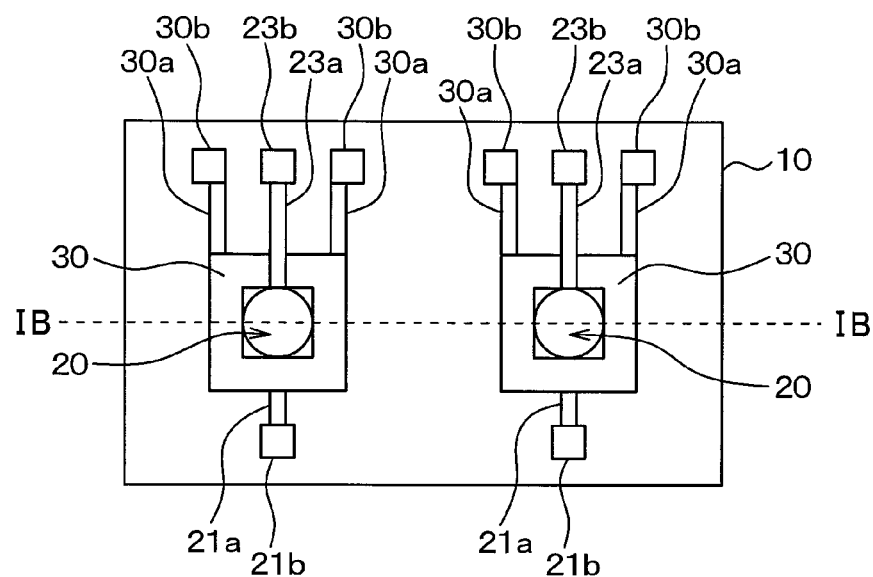
FIG. 1A is a plan view of a magnetic sensor device according to a first embodiment of the present disclosure.

Hereafter, a description will be given, referring to the drawings, of a first embodiment of the present disclosure. A magnetic sensor device according to the embodiment is used for, for example, an automobile's engine rotation speed detection or wheel rotation angle detection. In the embodiment, a description will be given taking a rotation angle sensor, which detects a rotation angle, as an example of the magnetic sensor device.

Figure 1B:
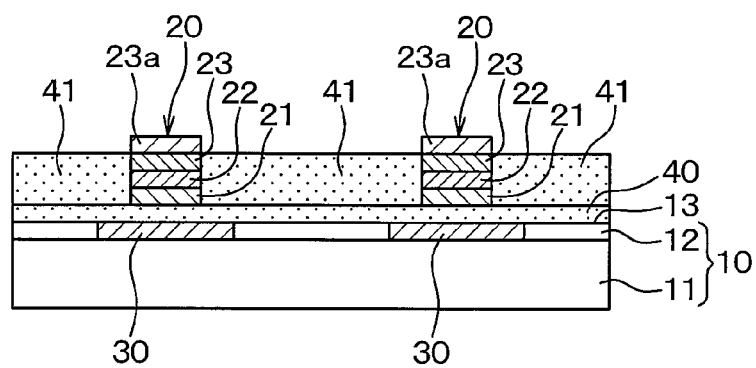
FIG. 1B is a IB-IB sectional view of FIG. 1A.

FIG. 1A is a plan view of the magnetic sensor device according to the embodiment, and FIG. 1B is a IB-IB sectional view of FIG. 1A. The magnetic sensor device includes two sensor portions 20 on a substrate 10, as shown in FIGS. 1A and 1B. The sensor portions 20 are elements whose resistance values change when the elements are influenced by an external magnetic field. The sensor portions 20 according to the embodiment are configured as tunneling magneto resistance elements (TMR elements).

The substrate 10 is configured by a several hundred μm thick semiconductor substrate 11 formed from Si or the like and a several μm thick polysilicon layer 12 being stacked, as shown in FIG. 1B. Also, the substrate 10 has one surface 13. In the embodiment, the front surface of the polysilicon layer 12 corresponds to the one surface 13 of the substrate 10.

Also, heater portions 30 are formed in the polysilicon layer 12. The heater portions 30, being provided corresponding to the sensor portions 20, are for heating pin magnetic layers 22a of magneto resistance element portions 22, to be described hereafter, when magnetizing the pin magnetic layers 22a. Specifically, the heater portions 30 are heating units for magnetizing the pin magnetic layers 22a so that the magnetization directions thereof differ between one magneto resistance element portion 22 and the other magneto resistance element portion 22 in a planar direction parallel to the one surface 13 of the substrate 10.

Heater portions 30 are highly concentrated portions of a portion of the polysilicon layer 12. The heater portions 30 are laid out in a square form.

An insulating film 40 is formed on the substrate 10. In addition, the sensor portions 20 are formed on the insulating film 40. Each of the sensor portions 20 includes a lower electrode 21 provided on the insulating film 40, the magneto resistance element portion 22, and an upper electrode 23 provided on the magneto resistance element portion 22.

Figure 2:
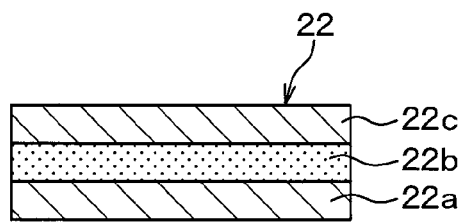
FIG. 2 is a sectional view of a magneto resistance element portion shown in FIG. 1A.

FIG. 2 is a sectional view of the magneto resistance element portion 22. As shown in this diagram, the magneto resistance element portion 22 is such that a TMR element is configured by the pin magnetic layer 22a, a tunneling layer 22b, and a free magnetic layer 22c being formed in order on the lower electrode 21.

The pin magnetic layer 22a is a ferromagnetic metal layer, positioned on the insulating film 40 side of the free magnetic layer 22c, whose magnetization direction is fixed. The tunneling layer 22b is an insulating film layer for causing current to flow from the free magnetic layer 22c to the pin magnetic layer 22a using the tunneling effect. The free magnetic layer 22c is a ferromagnetic metal layer whose magnetization direction changes by the layer being influenced by an external magnetic field.

The magneto resistance element portions 22 with this kind of configuration are positioned above the one surface 13 of the substrate 10. In addition, the magnetization directions of the pin magnetic layers 22a differ between one magneto resistance element portion 22 and the other magneto resistance element portion 22 in the planar direction of the one surface 13 of the substrate 10. In the embodiment, the magnetization directions differ 90° from one another. Because of this, the resistance value of one magneto resistance element portion 22 is, for example, a cosine curve output in accordance with the rotation angle, while the resistance value of the other magneto resistance element portion 22 is, for example, a sine curve output in accordance with the rotation angle.

The sensor portions 20 are laid out in a circular form, as shown in FIG. 1A. The reason for making the planar layout of the sensor portions 20 circular in this way is that magnetization characteristics improve. The planar layout of the sensor portions 20 may be elliptical, rather than being perfectly circular. Of course, the planar layout of the sensor portions 20, not being limited to being circular or elliptical, may be polygonal.

Furthermore, the sensor portions 20 are smaller in area than the heater portions 30 in the one surface 13 of the substrate 10. That is, the area of the heater portions 30 in the one surface 13 of the substrate 10 is larger than that of the magneto resistance element portions 22. Because of this, a structure is such that the whole of each of the magneto resistance element portions 22 is reliably heated by the corresponding heater portion 30 when magnetizing the pin magnetic layers 22a.

Also, an insulating film 41 is formed around the layered structures of the sensor portions 20 so as to make contact with the side surfaces of the layered structures. An insulating material, such as a high-dielectric thermally oxidized film, CVD oxide film, CVD nitride film, or TEOS oxide film, is used for the insulating film 41 and the heretofore described insulating film 40. As a specific example, the insulating films 40 and 41 are of $SiO_2$, SiN, or the like.

In addition, each heater portion 30 is connected to a heater portion pad 30b formed on the insulating film 40 via a heater portion wire 30a connected to the relevant heater portion 30. One portion of each heater portion wire 30a is formed in the polysilicon layer 12, and the remaining portion is formed so as to penetrate the insulating films 40 and 41. The heater portion pads 30b are used when magnetizing the pin magnetic layers 22a.

Each lower electrode 21 is connected to a lower electrode pad 21b formed on the insulating film 40 via a lower electrode wire 21a connected to the relevant lower electrode 21. The lower electrode wire 21a are formed so as to penetrate the insulating film 41. The lower electrode pads 21b are connected one to each unshown signal processing chip.

Also, each upper electrode 23 is connected to an upper electrode pad 23b formed on the insulating film 40, via an upper electrode wire 23a connected to the relevant upper electrode 23. The upper electrode wires 23a are formed on the insulating film 41. The upper electrode pads 23b are connected one to each unshown signal processing chip.

The above is the overall configuration of the magnetic sensor device according to the embodiment. Next, a description will be given, referring to FIGS. 3A to 5B, of a manufacturing method of the magnetic sensor device with the heretofore described configuration. Each of FIGS. 3A to 3C and 4A to 4C corresponds to the IB-IB section of FIG. 1A. Also, FIGS. 5A and 5B schematically show the substrate 10 and the sensor portions 20.

Figure 3A:
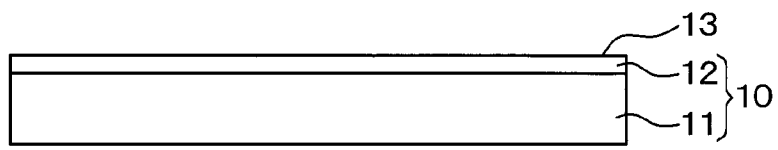
FIGS. 3A to 3C are diagrams showing manufacturing steps of the magnetic sensor device shown in FIGS. 1A and 2.

Firstly, in the step shown in FIG. 3A, the polysilicon layer 12 with a thickness of, for example, several μm is formed on the semiconductor substrate 11 by a CVD method or the like. The substrate 10 is prepared in this way.

Figure 3B:
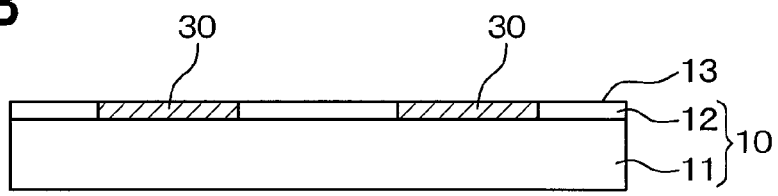

In the step shown in FIG. 3B, ion implantation is carried out on the one surface 13 side of the substrate 10 using, for example, an unshown mask, thus carrying out a thermal diffusion treatment. By so doing, the heater portions 30 corresponding to the magneto resistance element portions 22 are formed in the polysilicon layer 12 (a heater portion formation step). At this time, a portion which forms one portion of each heater portion wire 30a is also formed in the polysilicon layer 12.

As the heater portions 30 can be formed by carrying out ion implantation and thermal diffusion on the polysilicon layer 12 in this way, using polysilicon as a material of the heater portions 30 has an advantage of easily making the heater portions 30.

At this point, the heater portions 30 are formed so that the area of the heater portions 30 in the one surface 13 of the substrate 10 is larger than that of the magneto resistance element portions 22. By so doing, the pin magnetic layers 22a configuring the magneto resistance element portions 22 can be reliably heated in subsequent magnetization steps.

Figure 3C:
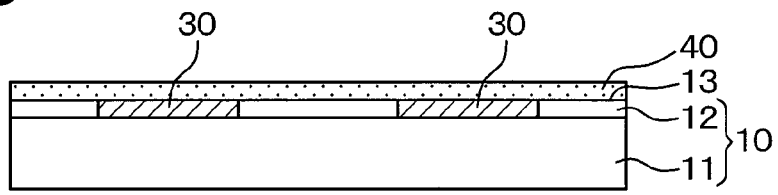

In the step shown in FIG. 3C, the insulating film 40 with a thickness of, for example, several μm is formed on the one surface 13 of the substrate 10 by a CVD method or the like.

Figure 4A:
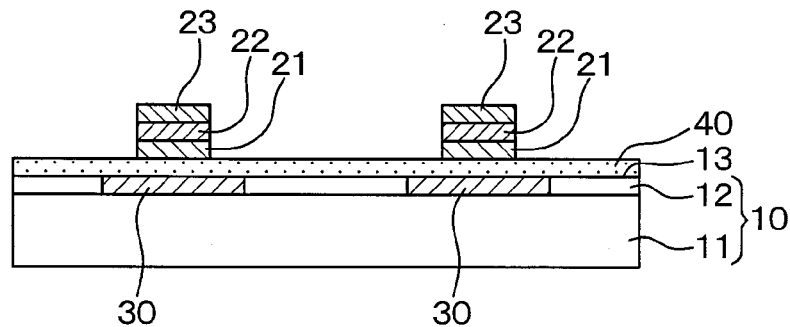
FIGS. 4A to 4C are diagrams showing manufacturing steps following FIGS. 3A to 3C.
Figure 5A:
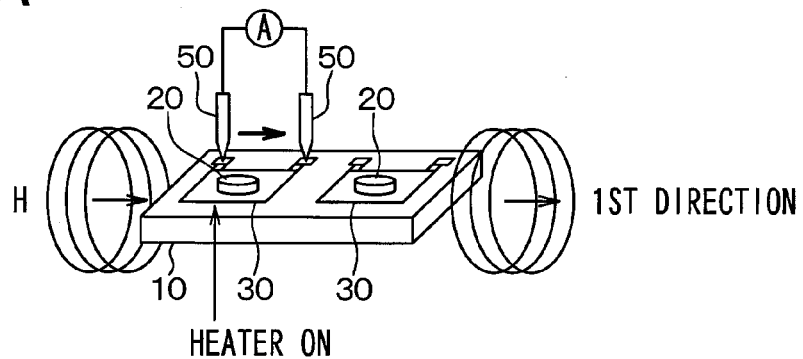
FIGS. 5A and 5B are diagrams showing manufacturing steps following FIGS. 4A to 4C, particularly, diagrams showing magnetization steps.
Figure 5B:
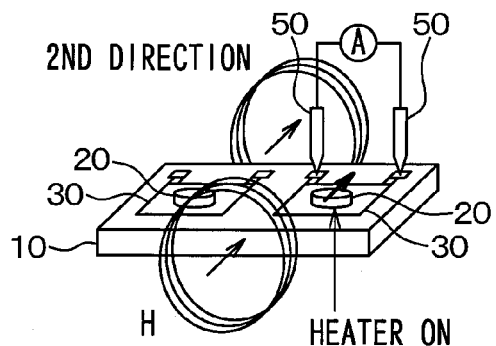

Continuing, in the step shown in FIG. 4A, the individual layers forming the lower electrodes 21, the magneto resistance element portions 22, and the upper electrodes 23 are formed in order by sputtering or the like. In addition, patterning is carried out so that portions of the layered bodies positioned above the corresponding heater portions 30 are left (an element portion formation step). At this time, the patterning is carried out so that the planar layout of the layered bodies to be left is circular or elliptical. Layered body patterning is carried out on the metal layer forming the lower electrodes 21 so that one portion of each lower electrode wire 21a is left.

Figure 4B:
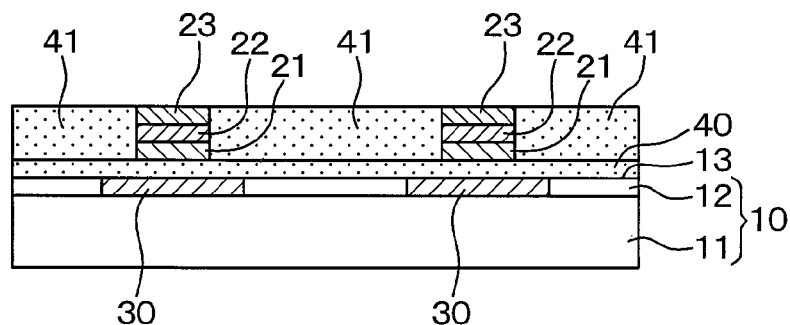

In the step shown in FIG. 4B, the insulating film 41 is formed on the one surface 13 of the substrate 10 by a CVD method, or the like, so as to cover the side surfaces of the lower electrodes 21, the magneto resistance element portions 22, and the upper electrodes 23. Also, unshown hole portions connecting with the heater portion wires 30a formed in the polysilicon layer 12 are formed in the insulating films 40 and 41, and unshown hole portions each connecting with one portion of the corresponding lower electrode wire 21a are formed in the insulating film 40.

Figure 4C:
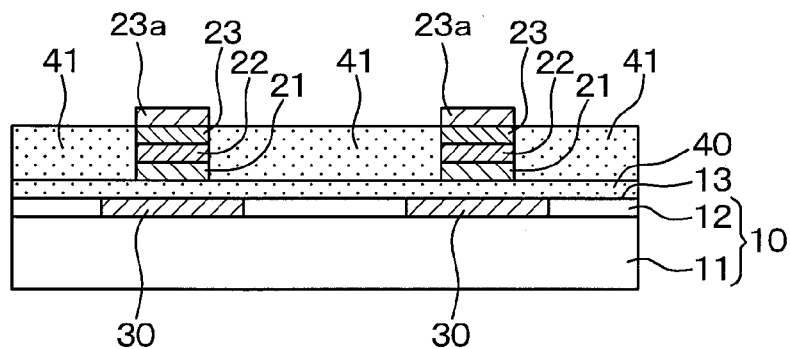

In the step shown in FIG. 4C, as well as the unshown hole portions formed in the insulating films 40 and 41 being filled with a metal material, a metal material is deposited on the insulating film 40 by sputtering or the like, and patterning is carried out. By so doing, the heater portion wires 30a connected to the heater portions 30, the lower electrode wires 21a connected to the lower electrodes 21, the upper electrode wires 23a connected to the upper electrodes 23, and the heater portion pads 30b, the lower electrode pads 21b, and the upper electrode pads 23b, which are connected to these respective wires, are formed. Two sensor portions 20 are formed on the substrate 10 in this way.

Subsequently, the magnetization steps shown in FIGS. 5A and 5B are carried out. Firstly, in the step shown in FIG. 5A, the substrate 10 on which the magneto resistance element portions 22 are formed is disposed in a chamber in which magnetic field generation, and heating by a hot plate and probes 50, are possible, and magnetization of the pin magnetic layer 22a of one magneto resistance element portion 22 is carried out (a first magnetization step). Specifically, the substrate 10 on which the magneto resistance element portions 22 are formed is disposed in a magnetic field (H) whose magnetization direction is set to a first direction in the planar direction of the one surface 13 of the substrate 10. In addition, one magneto resistance element portion 22 is heated, and the heater portion 30 corresponding to the one magneto resistance element portion 22 is heated, by the hot plate, thus carrying out an in-field annealing. That is, an external magnetic field is applied to all the sensor portions 20, and only the heater portion 30 corresponding to the sensor portion 20 intended to be magnetized is locally and selectively heated to around 300° C. Subsequently, the heating by the heater portion 30 is stopped in a condition in which the external magnetic field is maintained applying to all the sensor portions 20, thus cooling the sensor portion 20 intended to be magnetized. Subsequently, the sensor portion 20 becomes equal to or lower than a temperature equal to or higher than the Curie point. Because of this, the pin magnetic layer 22a configuring the one magneto resistance element portion 22 is magnetized so that the magnetization direction of the pin magnetic layer 22a is the first direction. At this time, the magnetization can be carried out while confirming the output of the magnetic sensor device, At this point, the heating of the heater portion 30 is carried out by, for example, pressing the probes 50 against the heater portion pads 30b and causing a current of, for example, several mA to several tens of mA to flow through the heater portion 30 via the probes 50. Also, the "in-field annealing" refers to carrying out annealing in a magnetic field, and means that the temperature of the pin magnetic layers 22a is raised to the Curie point or higher by heating the sensor portion 20 intended to be magnetized in a condition in which an external magnetic field is applied to the sensor portion 20 intended to be magnetized.

When heating, two-stage heating wherein, firstly, the whole of the magnetic sensor device is heated to in the order to 150° C., after which local heating by the heater portion 30 is implemented, may be carried out.

Continuing, in the step shown in FIG. 5B, magnetization of the pin magnetic layer 22a of the other magneto resistance element portion 22 is carried out (a second magnetization step). Specifically, the substrate 10 on which the magneto resistance element portions 22 are formed is disposed in a magnetic field whose magnetization direction is set to a second direction differing from the first direction in the planar direction of the one surface 13 of the substrate 10. The second direction is a direction tilted at 90° to the first direction.

In addition, in the same way as in the first magnetization step, the heater portion 30 corresponding to the other magneto resistance element portion 22 is heated by current being applied by the probes 50, thus carrying out an in-field annealing. By so doing, the pin magnetic layer 22a configuring the other magneto resistance element portion 22 is magnetized in the second direction. At this time, the magnetization direction can be adjusted with a high degree of accuracy by adjusting the direction of the substrate 10 in the magnetic field while confirming the output of the magnetic sensor device.

By so doing, a magnetic sensor device wherein the pin magnetic layers 22a, one for each of two sensor portions 20 formed on one substrate 10, are magnetized in differing directions is completed. That is, the output of one magneto resistance element portion 22 is of a cosine-curve resistance value, and the output of the other magneto resistance element portion 22 is of a sine-curve resistance value.

Next, a description will be given of a method of detecting a rotation angle as a physical amount when the magnetic sensor device is influenced by an external magnetic field. In order to detect a rotation angle, current is caused to flow through the magneto resistance element portions 22 via the lower electrode pads 21b and the upper electrode pads 23b.

In addition, for example, an unshown magnet is disposed above the magnetic sensor device, and on the magnet rotating by a handle being operated, a magnetic field which the free magnetic layers 22c receive from the magnet changes. That is, by each magneto resistance element portion 22 being influenced by an external magnetic field, the size of current flowing through each magneto resistance element portion 22, that is, the resistance value, changes based on a change in the resistance value of each magneto resistance element portion 22.

At this point, each of the cosine-curve resistance value output by one magneto resistance element portion 22 and the sine-curve resistance value output by the other magneto resistance element portion 22 is loaded into an external computing chip, and arc-tangent computed by this chip. By so doing, an output which changes at regular angles in accordance with a rotation angle of −180° to +180°, that is, 360°, is obtained, Consequently, a magnet rotation angle corresponding to the size of the output can be obtained.

As heretofore described, in the embodiment, the magnetic sensor device is characterized in that the heater portions 30 are provided one below each magneto resistance element portion 22, and when magnetizing the pin magnetic layers 22a, only the heater portion 30 corresponding to the pin magnetic layer 22a intended to be magnetized is heated.

By the heater portion 30 corresponding to the magneto resistance element portion 22 intended to be magnetized being locally and selectively heated in a magnetic field in this way, only one magneto resistance element portion 22 of two magneto resistance element portions 22 can be magnetized. Also, by changing the direction of the applied magnetic field and heating the heater portion 30 corresponding, to the other magneto resistance element portion 22, only the other magneto resistance element portion 22 of the two magneto resistance element portions 22 can be magnetized. Consequently, multipolarization of the pin magnetic layers 22a of the corresponding magneto resistance element portions 22 formed on one substrate 10 can be realized.

Also, as each pin magnetic layer 22a is magnetized after a plurality of magneto resistance element portions 22 have been formed on one substrate 10, it does not happen that an assembly error occurs when combining chips differing in magnetization direction. In addition, as magnetization can be carried out while confirming the output of the magnetic sensor device in the second magnetization step, variation in the output of the magnetic sensor device can be corrected. Consequently, a decrease in detection accuracy of the magnetic sensor device due to an assembly error of chips differing in magnetization direction can be prevented.

Also, as the heater portion is heated by causing current to flow through the heater portion, the magneto resistance element portion can be extensively heated at one time, and a processing time can be shortened.

One magneto resistance element portion 22 corresponds to "one portion of a plurality of magneto resistance element portions 22", and the other magneto resistance element portion 22 corresponds to "one portion differing from the one portion of the plurality of magneto resistance element portions 22".

(Second Embodiment)

In this embodiment, a description will be given of a portion differing from the first embodiment. In the first embodiment, the output of each magneto resistance element portion 22 is loaded into the external computing chip, and a rotation angle is computed on the exterior, but this embodiment is characterized in that a computing circuit unit is provided on the substrate 10.

Figure 6:
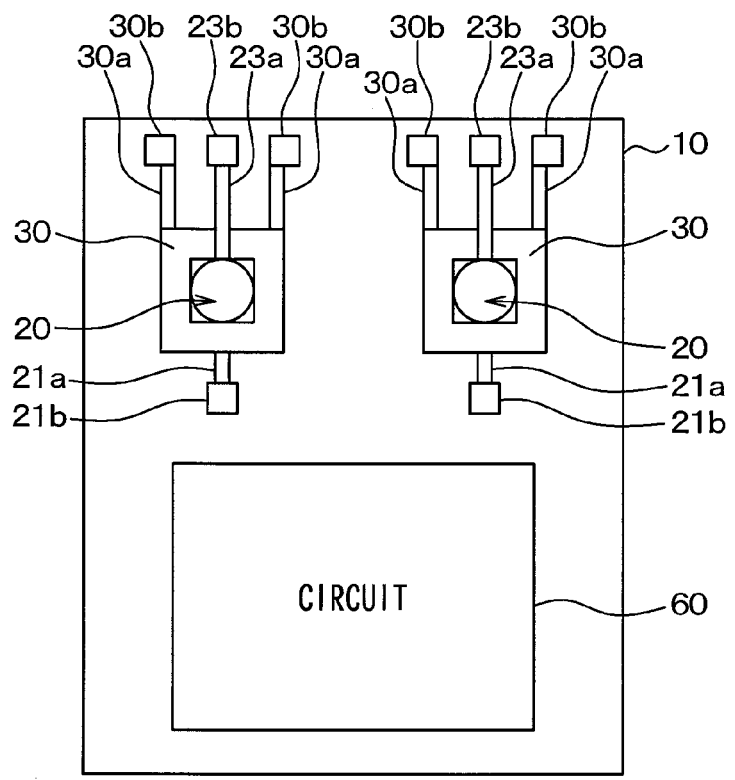
FIG. 6 is a plan view of a magnetic sensor device according to a second embodiment of the present disclosure.

FIG. 6 is a plan view of a magnetic sensor device according to this embodiment. As shown in this diagram, the substrate 10 has a circuit portion 60. The circuit portion 60 is configured in such a way as to compute a rotation angle as a physical amount based on the output of each magneto resistance element portion 22.

This kind of circuit portion 60 can be formed in a step the same as the step of forming the heater portions 30 in the heater portion formation step shown in FIG. 3B. At this point, it is preferable to use an SOI substrate as the substrate 10. In addition, the circuit portion 60 is formed in a region bounded by an unshown trench.

By providing the circuit portion 60 on the substrate 10 in the above way, it is not necessary to carry out a rotation angle computation with a separate chip, meaning that each sensor portion 20 and the circuit portion 60 can be integrated on one substrate 10.

(Third Embodiment)

Figure 7A:
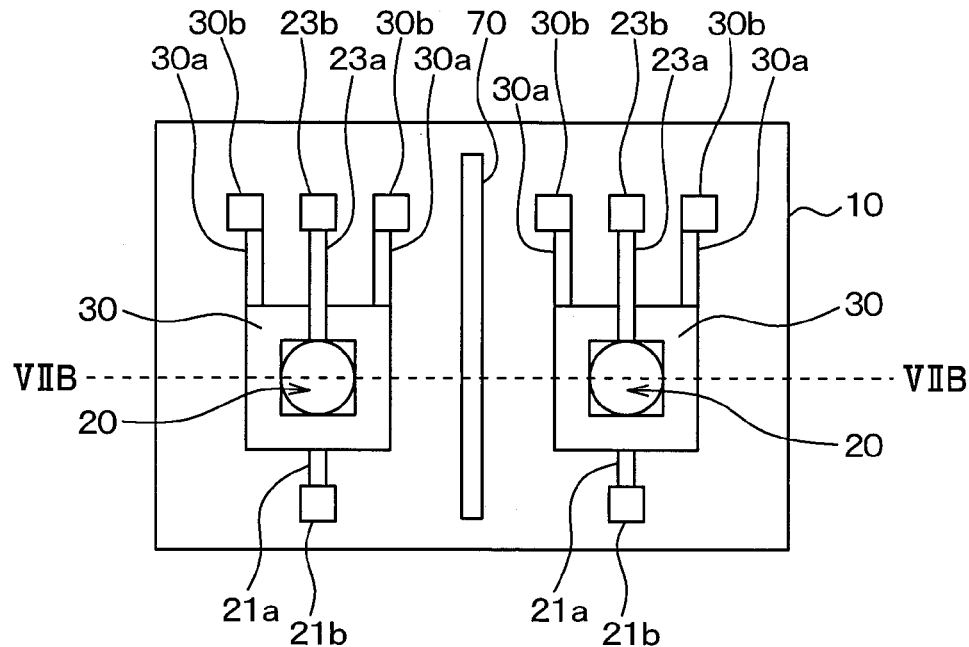
FIG. 7A is a plan view of a magnetic sensor device according to a third embodiment of the present disclosure.
Figure 7B:
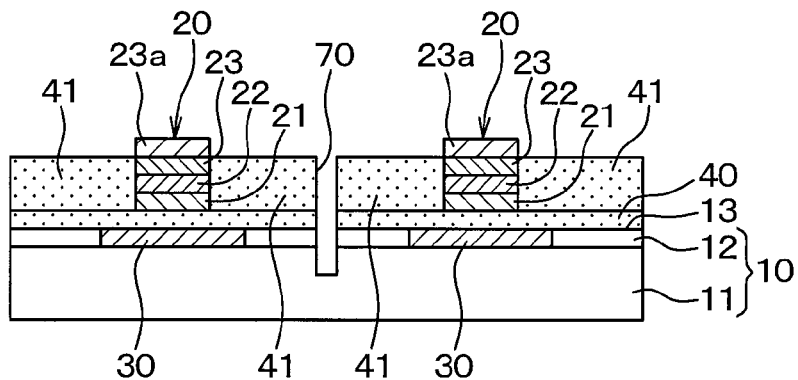
FIG. 7B is a VIIB-VIIB sectional view of FIG. 7A.

In this embodiment, a description will be given of a portion differing from the first and second embodiments. FIG. 7A is a plan view of a magnetic sensor device according to this embodiment, and FIG. 7B is a VIIB-VIIB sectional view of FIG. 7A. As shown in FIGS. 7A and 7B, the magnetic sensor device has a trench 70 for preventing thermal diffusion of the heater portions 30.

The trench 70 is provided between the heater portion 30 corresponding to one magneto resistance element portion 22 and the heater portion 30 corresponding to the other magneto resistance element portion 22. Specifically, the trench 70 is formed so as to penetrate the insulating films 40 and 41 and the polysilicon layer 12 and reach the semiconductor substrate 11. In this embodiment, the trench 70 is laid out linearly between the two sensor portions 20, as shown in FIG. 7A, This kind of trench 70 can be formed by a photolithography etching process, or the like, after forming the insulating film 41 in the element portion formation step.

By providing the trench 70 between the heater portions 30 in the magnetic sensor device in the above way, it becomes difficult for the heat of one heater portion 30 to transfer to the other heater portion 30 owing to the existence of the trench 70. Consequently, thermal diffusion of the heater portions 30 can be suppressed, and the accuracy of local heating of the heater portions 30 can be improved.

In FIGS. 7A and 7B, the trench 70 is formed so as to penetrate the insulating films 40 and 41, which configure the magnetic sensor device, and the polysilicon layer 12, and reach the semiconductor substrate 11. As it is sufficient that the trench 70 can prevent thermal diffusion of the heater portions 30, it is sufficient that the trench 70 is formed in at least the polysilicon layer 12 and the semiconductor substrate 11, which configure the substrate 10. Also, when providing the trench 70 in only the substrate 10 in this way, the trench 70 can be formed in the step shown in FIG. 3B.

(Fourth Embodiment)

Figure 8:
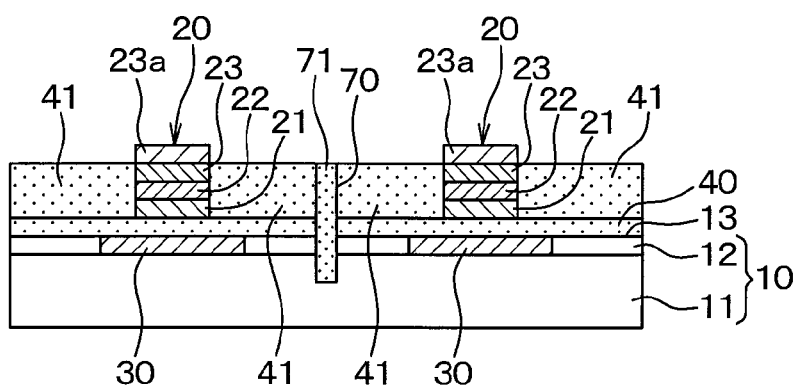
FIG. 8 is a sectional view of a magnetic sensor device according to a fourth embodiment of the present disclosure.

In this embodiment, a description will be given of a portion differing from the third embodiment. FIG. 8, being a sectional view of a magnetic sensor device according to this embodiment, is a diagram corresponding to the VIIB-VIIB section of FIG. 7A. As shown in this diagram, an insulating body 71 is embedded in the trench 70. The insulating body 71, performing a role of making the heat of the heater portions 30 unlikely to transfer, is configured from a material with a small heat capacity for use in an oxide film or a nitride film. The insulating body 71 can be embedded in the trench 70 by a CVD method, or the like, after forming the trench 70. Because of the above, thermal diffusion of the heater portions 30 can be effectively suppressed owing to the existence of the insulating body 71.

(Fifth Embodiment)

In this embodiment, a description will be given of a portion differing from the third embodiment. In the third embodiment, the trench 70 is laid out linearly, but this embodiment is characterized in that trenches are formed so as to surround the corresponding heater portions 30.

Figure 9A:
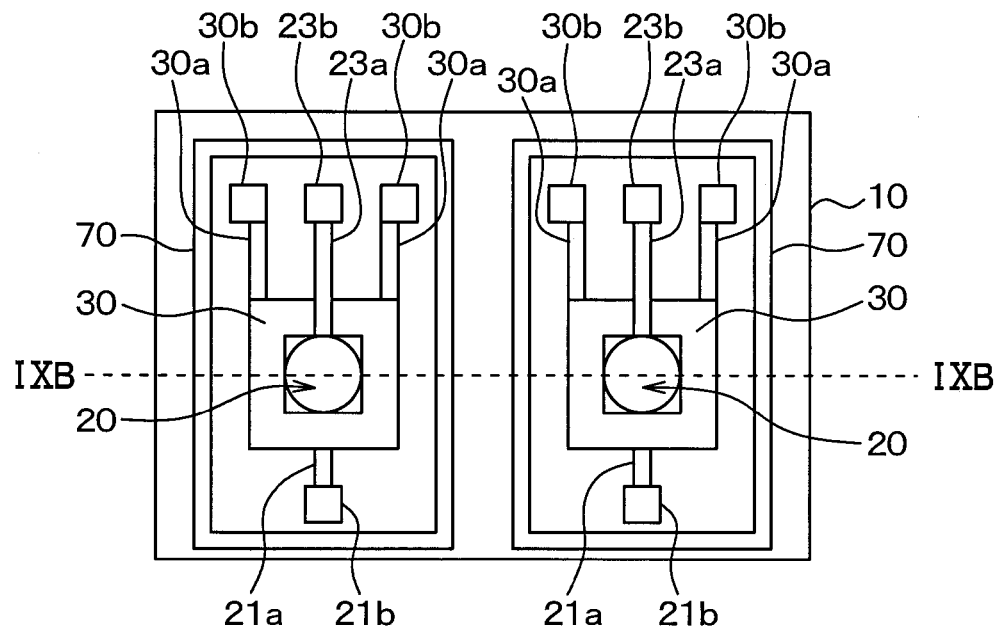
FIG. 9A is a plan view of a magnetic sensor device according to a fifth embodiment of the present disclosure.
Figure 9B:
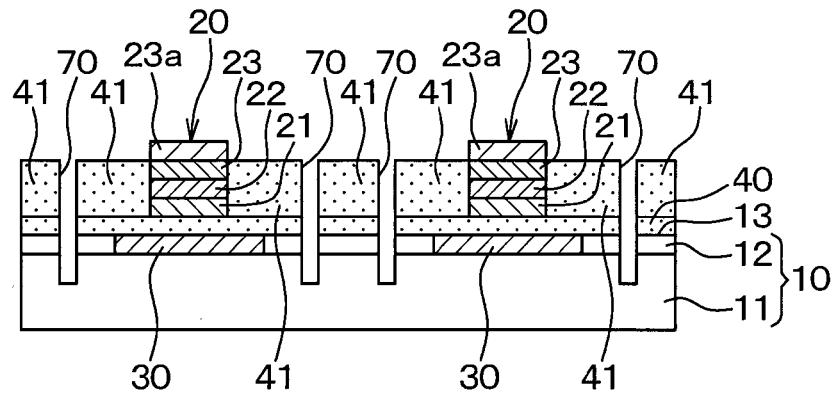
FIG. 9B is a IXB-IXB sectional view of FIG. 9A.

FIG. 9A is a plan view of a magnetic sensor device according to this embodiment, and FIG. 9B is a IXB-IXB sectional view of FIG. 9A. As shown in FIGS. 9A and 9B, the trenches 70 are formed so as to completely surround the corresponding sensor portions 20. Because of this, thermal diffusion of the heater portions 30 can be more effectively suppressed.

As described in the third embodiment, in this embodiment too, the trenches 70 may be formed in only the substrate 10. Also, the insulating body 71 described in the fourth embodiment may be embedded in the trenches 70.

(Sixth Embodiment)

In this embodiment, a description will be given of a portion differing from the first embodiment. In the heretofore described first to fifth embodiments, a description has been given of a most basic configuration configured of two sensor portions 20. In this embodiment, a description will be given of a configuration close to one actually used.

Figure 10A:
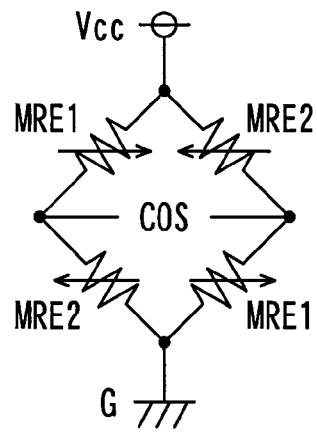
FIG. 10A is a diagram showing one example of a circuit configuration of a magnetic sensor device according to a sixth embodiment of the present disclosure.

Firstly, a bridge configuration is necessary for a reduction in angle error or a suppression of temperature fluctuation. Consequently, a bridge circuit is configured by "magneto resistance elements 1" and "magneto resistance elements 2" being combined, as shown in FIG. 10A. The magnetization directions of the differing elements differ 180° from one another. That is, the magnetization directions are reversed.

The bridge circuit, being connected between a power source (Vcc) and a ground (G), takes out a potential difference between the connection points of adjacent series connected elements as an output of the bridge circuit. Although FIG. 10A shows a bridge circuit which carries out a cosine curve output, a sine curve output is also configured by the bridge circuit in the same way.

Also, each element is configured by a plurality of sensor portions 20 being connected in series. For example, the magneto resistance element 1 is configured by five sensor portions 20 being connected in series. Consequently, twenty sensor portions 20 are formed on the substrate 10, and each of them is connected to the elements in such a way as to configure the bridge circuit.

Figure 10B:
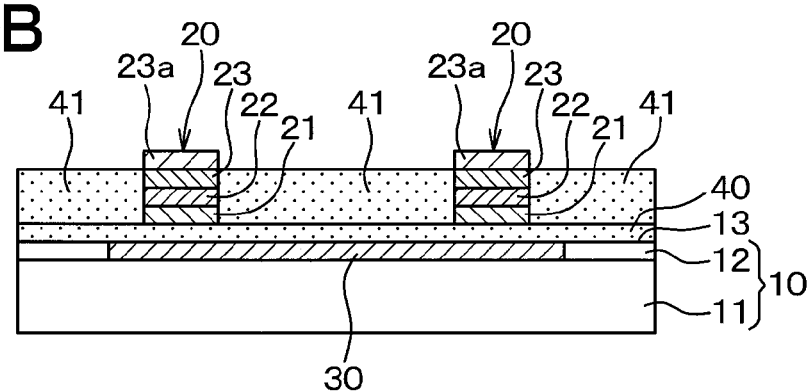
FIG. 10B is a sectional view wherein a heater portion is shared by a plurality of magneto resistance element portions.

When the plurality of sensor portions 20 are formed on the substrate 10, the heater portions 30 may be provided so as to correspond to the magneto resistance element portions 22 of the corresponding sensor portions 20, but the heater portion 30 can also be shared by each element, as shown in FIG. 10B. FIG. 10B shows a sectional view wherein the heater portion 30 is shared by two sensor portions 20.

By the heater portion 30 being shared by a plurality of the magneto resistance element portions 22 in this way, all the plurality of magneto resistance element portions 22 can be heated together by one heater portion 30, and the plurality of magneto resistance element portions 22 can be magnetized together. Also, as it is sufficient that application of bias by the probes 50 is carried out on one heater portion 30, it is not necessary to carry out a heating operation on each of the plurality of heater portions 30, and an operation of heating the heater portions 30 can be easily carried out.

Of course, it is preferable that the area of the heater portions 30 is formed to be larger than the area of a region in which a plurality of magneto resistance element portions 22 are disposed. Also, it is preferable that the trench 70 is formed, and that the insulating body 71 is embedded in the trench 70. The trench 70 may be provided linearly between the elements, or the trench 70 may be provided so as to surround each element.

(Seventh Embodiment)

In this embodiment, a description will be given of a portion differing from the first to sixth embodiments. In each heretofore described embodiment, the heater portions 30 are formed from polysilicon, but this embodiment is characterized in that single-crystal silicon is used as a material of the heater portions 30.

Figure 11A:
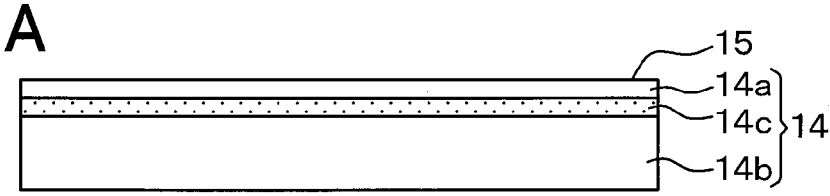
FIGS. 11A to 11C are diagrams showing one portion of manufacturing steps of a magnetic sensor device according to a seventh embodiment of the present disclosure.

In this case, the heater portions 30 are formed in the following way. Firstly, in the step shown in FIG. 11A, an SOI substrate 14 is prepared. The SOI substrate 14 is configured by an insulating layer 14c being sandwiched by single-crystal silicon layers 14a and 14b. In the SOI substrate 14, the front surface of the single-crystal silicon layer 14a corresponds to one surface 15 of the substrate.

Figure 11B:
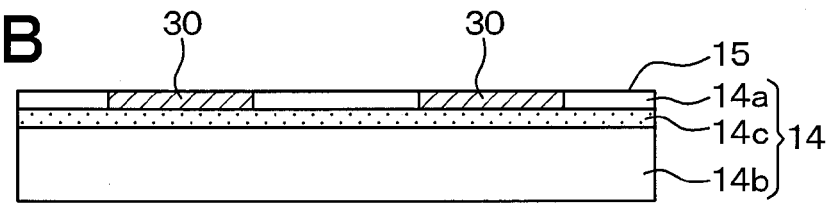

Continuing, in the step shown in FIG. 11B, ion implantation is carried out on the single-crystal silicon layer 14a using, for example, an unshown mask, and a thermal diffusion treatment is carried out, in the same way as in the step shown in FIG. 3B. By so doing, the heater portions 30 are formed in the single-crystal silicon layer 14a.

Figure 11C:
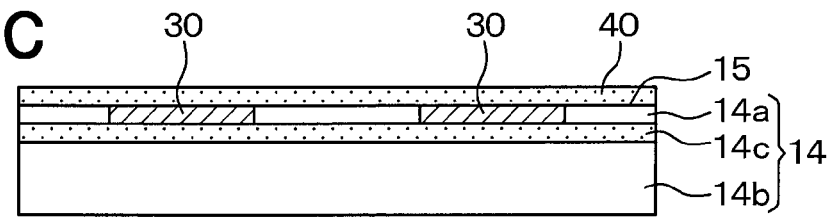

In addition, in the step shown in FIG. 11C, the insulating film 40 is formed on the one surface 15 of the SOI substrate 14 by a CVD method, or the like, in the same way as in the step shown in FIG. 3C.

In the subsequent steps, a magnetic sensor device can be manufactured by carrying out the steps shown in FIGS. 4A to 5B. By using single-crystal silicon as a material of the heater portions 30 in the above way, the temperature of the heater portions 30 can be accurately controlled when heating the heater portions 30.

The SOI substrate 14 corresponds to a "substrate", and the one surface 15 of the SOI substrate 14 corresponds to "one surface".

(Eighth Embodiment)

In this embodiment, a description will be given of a portion differing from the first to seventh embodiments. This embodiment is characterized in that platinum (Pt) is used as a material of the heater portions 30.

Figure 12A:
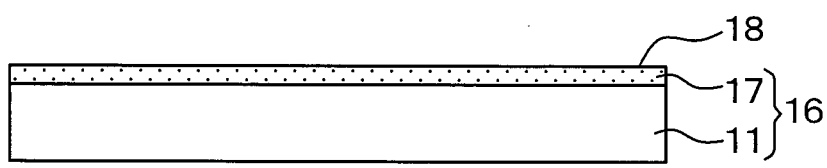
FIGS. 12A to 12D are diagrams showing one portion of manufacturing steps of a magnetic sensor device according to an eighth embodiment of the present disclosure.

In this case, the heater portions 30 are formed in the following way. Firstly, a substrate 16 is prepared in the step shown in FIG. 12A. The substrate 16 is such that a several μm thick insulating layer 17 is formed on the semiconductor substrate 11 by a CVD method or the like. The front surface of the insulating layer 17 corresponds to one surface 18 of the substrate 16.

Figure 12B:
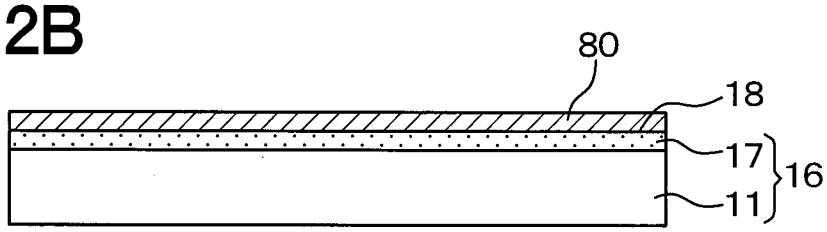

Continuing, in the step shown in FIG. 12B, a metal layer 80 is formed by depositing platinum on the insulating layer 17 using vapor deposition, sputtering, or the like.

Figure 12C:
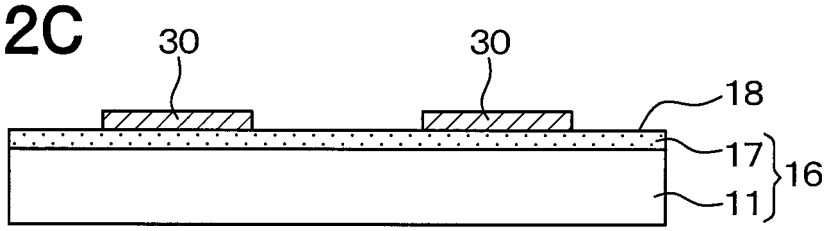
Figure 12D:
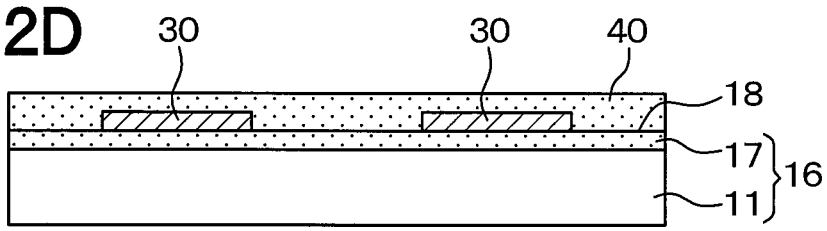

In the step shown in FIG. 12C, the heater portions 30 are formed by patterning the metal layer 80. In addition, in the step shown in FIG. 12D, the insulating layer 40 is formed on the one surface 18 of the substrate 16 by a CVD method, or the like, so as to cover the heater portions 30.

In the subsequent steps, a magnetic sensor device can be manufactured by carrying out the steps shown in FIGS. 4A to 5B. By using platinum as a material of the heater portions 30 in the above way, the heater portions 30 can be formed at low cost.

The substrate 16 corresponds to a "substrate", and the one surface 18 of the substrate 16 corresponds to "one surface".

(Ninth Embodiment)

In the heretofore described first embodiment, a description has been given of an example wherein the heater portions 30 are formed so as to surround the corresponding sensor portions 20, but in the ninth embodiment, a description will be given of an example wherein the heater portions 30 are formed into a plate instead.

Figure 13A:
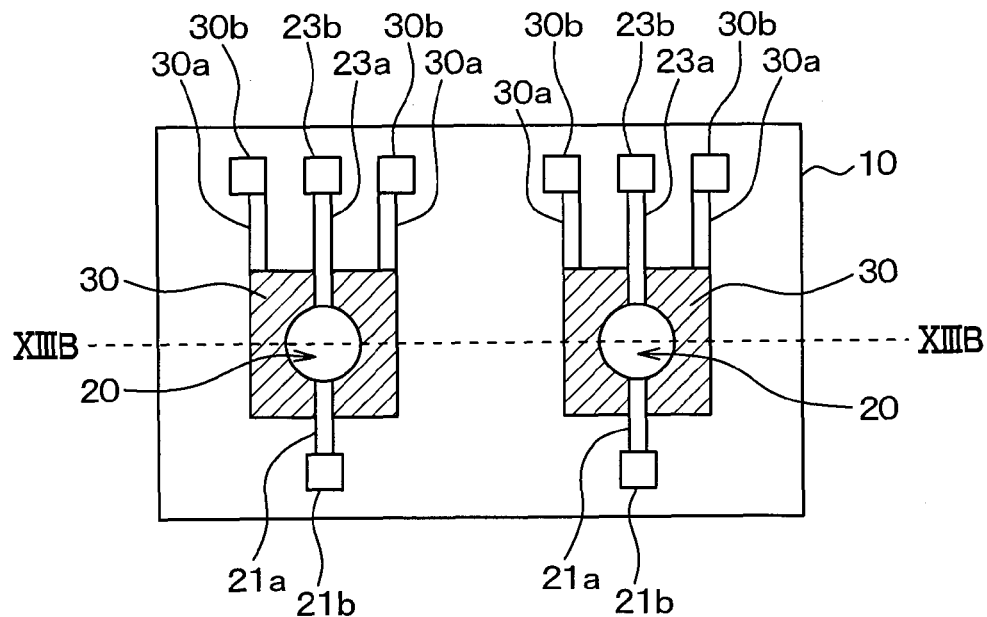
FIG. 13A is a plan view of a magnetic sensor device according to a ninth embodiment of the present disclosure.
Figure 13B:
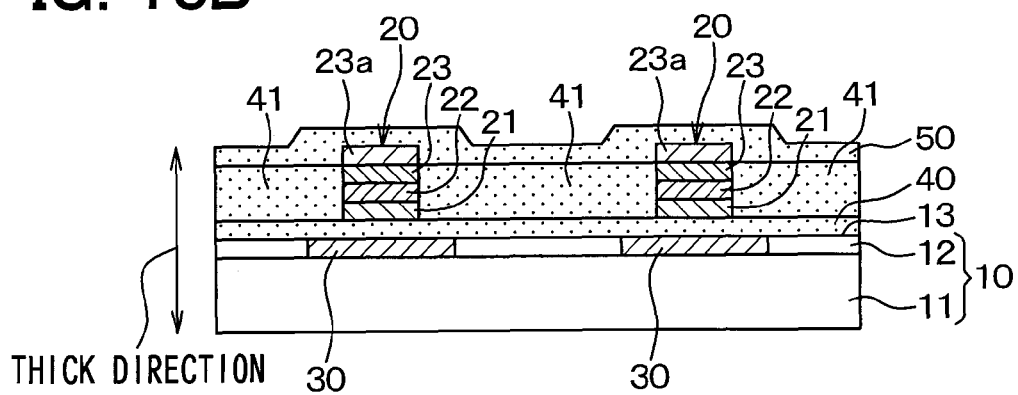
FIG. 13B is a XIIIB-XIIIB sectional view of FIG. 13A.
Figure 14A:
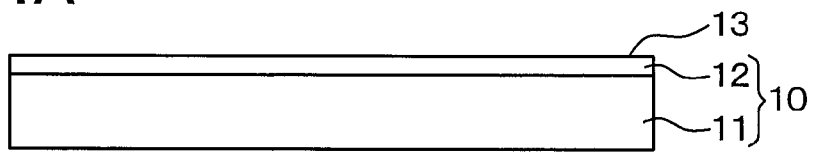
FIGS. 14A to 14E are diagrams showing one portion of manufacturing steps of the magnetic sensor device according to the ninth embodiment.
Figure 14B:
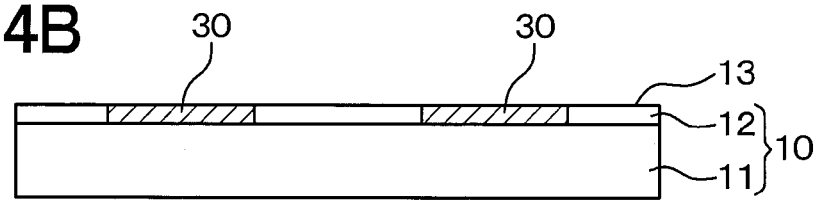
Figure 14C:
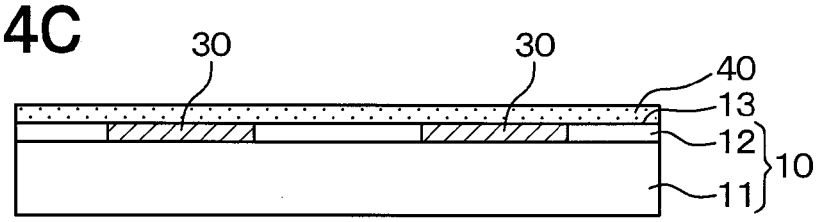
Figure 14D:
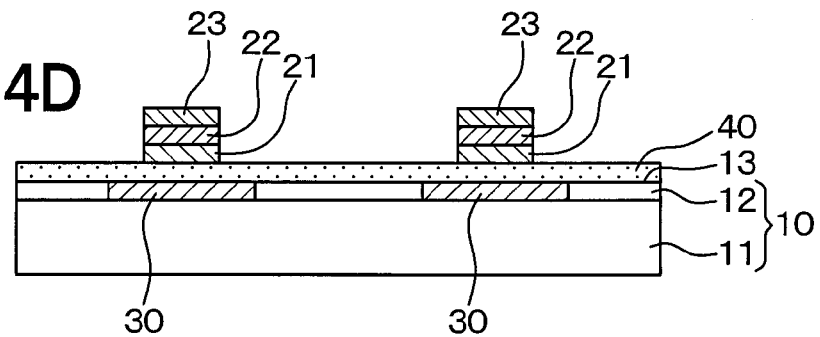
Figure 14E:
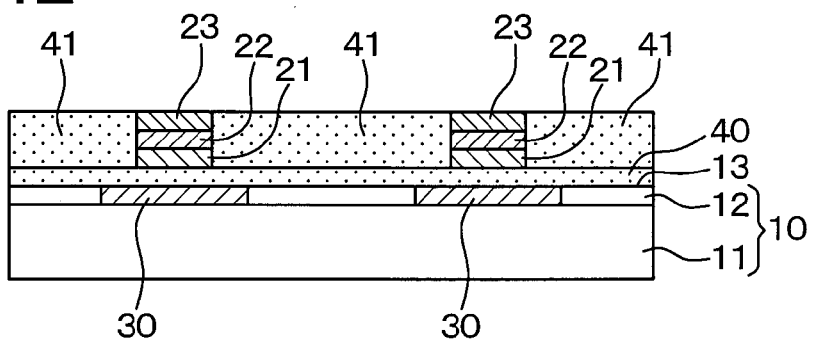

FIG. 13A is a plan view of a magnetic sensor device according to this embodiment, and FIG. 13B is a XIIIB-XIIIB sectional view of FIG. 13A. In FIGS. 13A and 13B, numerals and signs the same as those in FIGS. 1A and 1B indicate the same portions.

The heater portions 30 of the magnetic sensor device of this embodiment are formed into a plate of a square shape seen in a thickness direction, The planar direction area of the heater portions 30 is larger than the planar direction area of the sensor portions 20.

Also, in the magnetic sensor device of this embodiment, a protective film 50 covering the insulating film 41 and the upper electrode wires 23a is provided. The upper electrode pads 23b, the lower electrode pads 21b, and the heater portion pads 30b are disposed on the upper side of the protective film 50.

Next, a description will be given, referring to FIGS. 14A to 14E and 15A to 15C, of a manufacturing method of the magnetic sensor device of this embodiment. FIGS. 14A to 14E and 15A to 15C correspond to the XIIIB-XIIIB section of FIG. 13A.

Firstly, in the steps in FIGS. 14A to 14E and 15A, two sensor portions 20 are formed on the substrate 10 in the same way as in the heretofore described first embodiment. FIGS. 14A to 14E correspond to FIGS. 3A to 3C, 4A, and 4B.

Figure 15A:
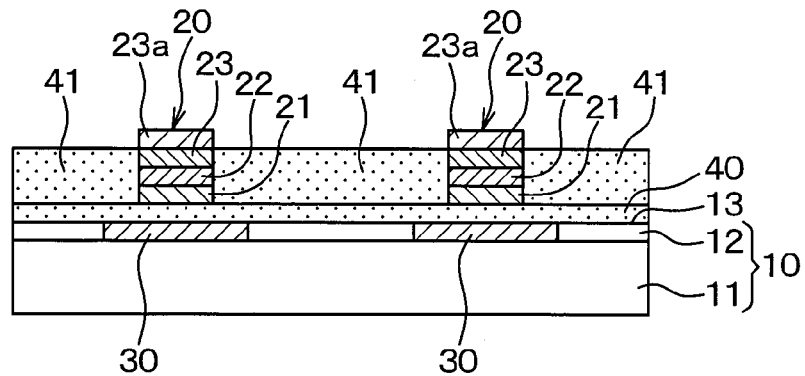
FIGS. 15A to 15C are diagrams showing one portion of manufacturing steps of the magnetic sensor device according to the ninth embodiment.
Figure 15B:
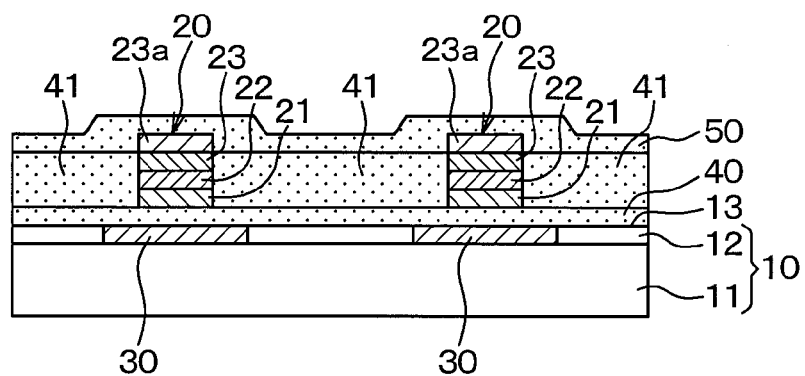
Figure 15C:
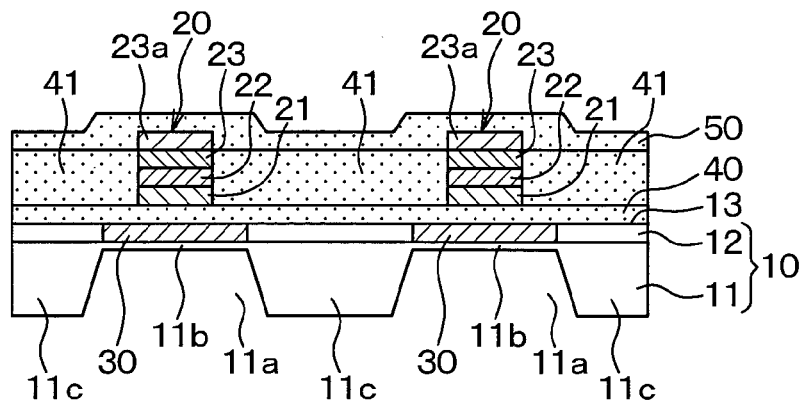

In the next step in FIG. 15B, the protective film 50 covering the insulating film 41 and the upper electrode wires 23a is formed by sputtering or the like. For example, $SiO_2$ or SiN is used for the protective film 50.

Next, in the same way as in the heretofore described first embodiment, by using the heater portion 30 corresponding to the sensor portion 20 intended to be magnetized, magnetization of the pin magnetic layer 22a of the magneto resistance element portion 22 of the relevant sensor portion 20 is carried out (a first magnetization step). Subsequently, in the same way as in the heretofore described first embodiment, magnetization of the pin magnetic layer 22a of the remaining magneto resistance element portion 22 is carried out using the heater portion 30 corresponding to the remaining sensor portion 20 (a second magnetization step).

According to the heretofore described embodiment, in the same way as in the heretofore described first embodiment, the magnetic sensor device is characterized in that the heater portions 30 are provided one below each of the corresponding magneto resistance elements 22 and, when magnetizing the pin magnetic layers 22a, only the heater portion 30 corresponding to the pin magnetic layer 22a intended to be magnetized is heated. By the heater portion 30 corresponding to the magneto resistance element portion 22 intended to be magnetized being locally and selectively heated in a magnetic field in this way, only one magneto resistance element portion 22 of two magneto resistance element portions 22 can be magnetized. Also, by changing the direction of applied magnetic field and heating the heater portion 30 corresponding to the other magneto resistance element portion 22, it is possible to magnetize only the other magneto resistance element portion 22 of the two magneto resistance element portions 22.

(Tenth Embodiment)

In this embodiment, a description will be given of an example wherein a membrane is provided in a region of the substrate 10 of the magnetic sensor device of the heretofore described ninth embodiment corresponding to each heater portion 30.

Figure 16A:
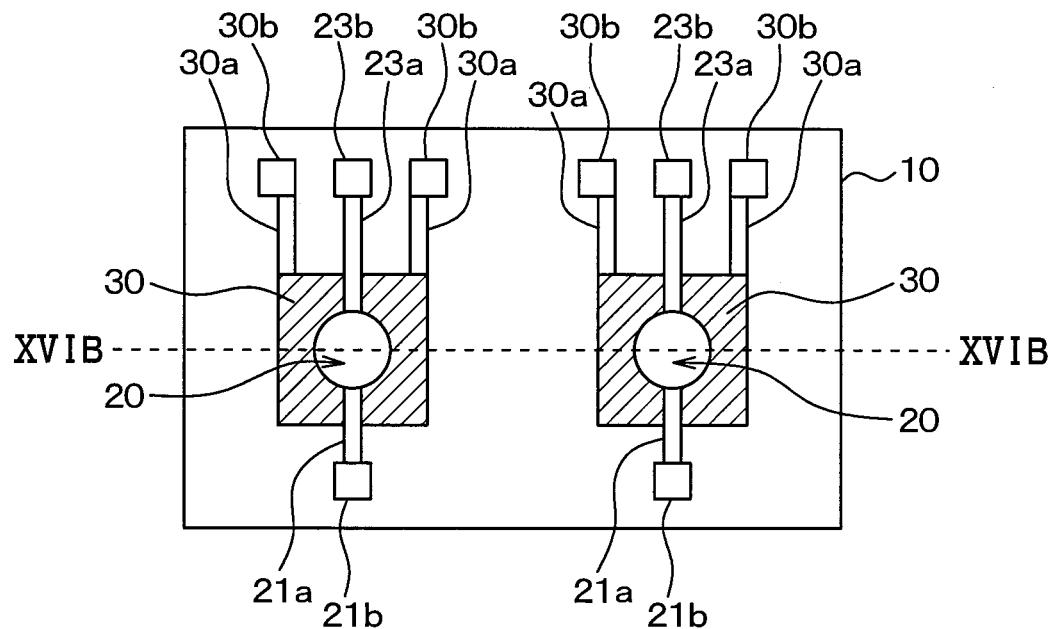
FIG. 16A is a plan view of a magnetic sensor device according to a tenth embodiment of the present disclosure.
Figure 16B:
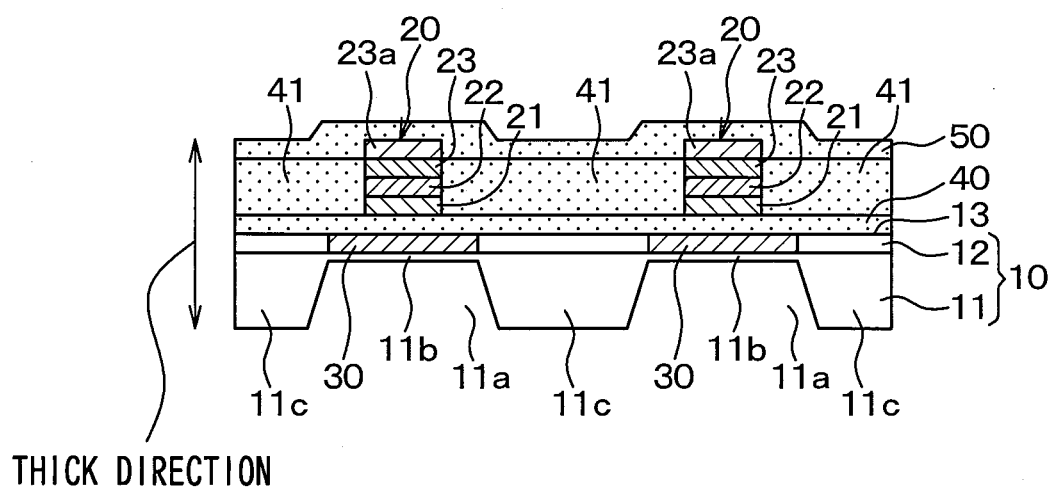
FIG. 16B is a XVIB-XVIB sectional view of FIG. 16A.

FIG. 16A is a plan view of a magnetic sensor device of this embodiment, and FIG. 16B is a XVIB-XVIB sectional view of FIG. 16A. In FIGS. 16A and 16B, numerals and signs the same as those in FIGS. 13A and 13B indicate the same portions.

A recessed portion 11a is provided in a region of the substrate 10 of the magnetic sensor device of this embodiment corresponding to the heater portion 30 for each sensor portion 20, as shown in FIG. 16B.

The recessed portions 11a are formed so as to be recessed toward the one surface 13 side (upward as seen in the drawings) from the side opposite to the one surface 13 of the substrate 10 (downward as seen in the drawings). Because of this, the thickness direction dimension of regions of the substrate 10 corresponding to the heater portions 30 is smaller than that of regions 11c other than the regions corresponding to the heater portions 30. That is, membranes (thin films) 11b are formed one in each of the regions of the substrate 10 corresponding to the heater portions 30.

Next, a description will be given, referring to FIGS. 14A to 15C, of a manufacturing method of the magnetic sensor device of this embodiment. Each of FIGS. 14A to 15C corresponds to the XVIB-XVIB section of FIG. 16A.

Firstly, after the steps in FIGS. 14A to 14E, 15A, and 15B are finished, the recessed portion 11a is formed in the region of the substrate 10 corresponding to the heater portion 30 for each sensor portion 20 by wet etching or dry etching (a substrate formation step). By so doing, the membrane 11b is formed in the substrate 10 on the lower side of the heater portion 30 for each sensor portion 20.

Next, in the same way as in the heretofore described first embodiment, by using the heater portion 30 corresponding to the sensor portion 20 intended to be magnetized, magnetization of the pin magnetic layer 22a of the magneto resistance element portion 22 of the relevant sensor portion 20 is carried out (a first magnetization step). Subsequently, in the same way as in the heretofore described embodiment, magnetization of the pin magnetic layer 22a of the remaining magneto resistance element portion 22 is carried out using the heater portion 30 corresponding to the remaining sensor portion 20 (a second magnetization step).

According to this embodiment heretofore described, the membranes 11b and the recessed portions 11a are formed in the substrate 10 on the lower sides of the corresponding heaters 30. Because of this, heat generated from the heater portions 30 can be made unlikely to transfer to the membrane 11b side of the substrate 10. Consequently, heat generated from the heater portions 30 can be made likely to transfer to the corresponding sensor portions 20. Because of this, variation in temperature of the sensor portions 20 becomes unlikely to occur when heating the sensor portions 20 with the corresponding heater portions 30 in the first magnetization step and the second magnetization step. Because of this, the accuracy of temperature control of the sensor portions 20 can be increased.

(Eleventh Embodiment)

In the heretofore described ninth embodiment, a description has been given of an example wherein heater portions formed in a square shape seen in the thickness direction of the substrate 10 are used as the heater portions 30, but a description will be given of an example wherein heater portions formed so as to surround corresponding regions 12a of the substrate 10 on the lower sides of the sensor portions 20 are used instead.

Figure 17A:
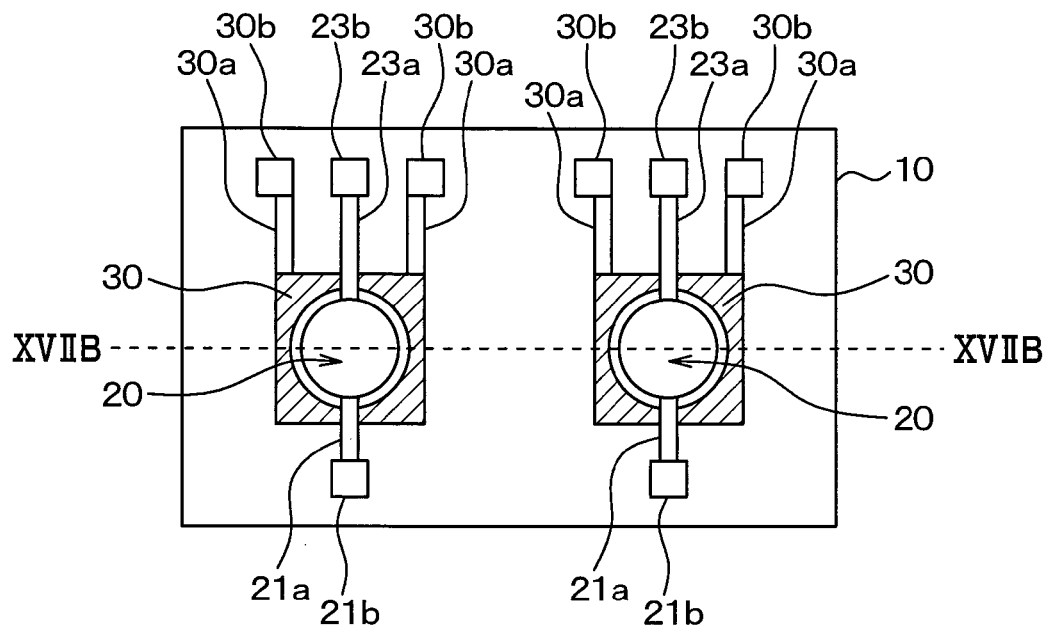
FIG. 17A is a plan view of a magnetic sensor device according to an eleventh embodiment of the present disclosure.
Figure 17B:
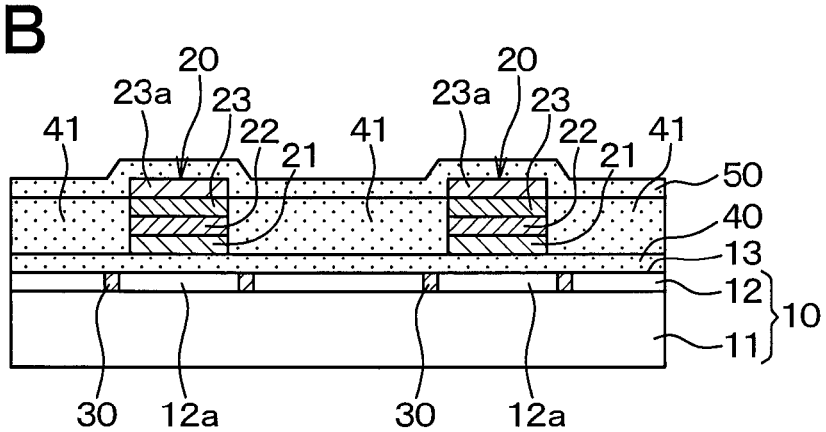
FIG. 17B is a XVIIB-XVIIB sectional view of FIG. 17A.

FIG. 17A is a plan view of a magnetic sensor device of this embodiment, and FIG. 17B is a XVIIB-XVIIB sectional view of FIG. 17A. In FIGS. 17A and 17B, numerals and signs the same as those in FIGS. 13A and 13B indicate the same portions.

The heater portions 30 of this embodiment are formed so that the inside contour is circular, and the outside contour is square, as seen in the thickness direction of the substrate 10, as shown in FIG. 17A. Because of this, the heater portions 30 are formed, spaced apart from the corresponding regions 12a of the substrate 10 on the lower sides of the sensor portions 20, so as to surround the corresponding regions 12a.

According to this embodiment heretofore described, the heater portions 30 are formed so as to surround the corresponding regions 12a of the substrate 10 on the lower sides of the sensor portions 20. That is, the heater portions 30 are formed in the substrate 10 so as to surround the corresponding sensor portions 20. Because of this, the degree of freedom in selecting a material used as a base material of the sensor portions 20 (that is, a material used for the insulating film 40) is increased. Consequently, the crystallinity of the film configuring the sensor portions 20 can be improved.

(Twelfth Embodiment)

In this embodiment, a description will be given of an example wherein a membrane is provided in a region of the substrate 10 corresponding to the heater portion 30 for each sensor portion 20 in the magnetic sensor device of the heretofore described eleventh embodiment.

Figure 18A:
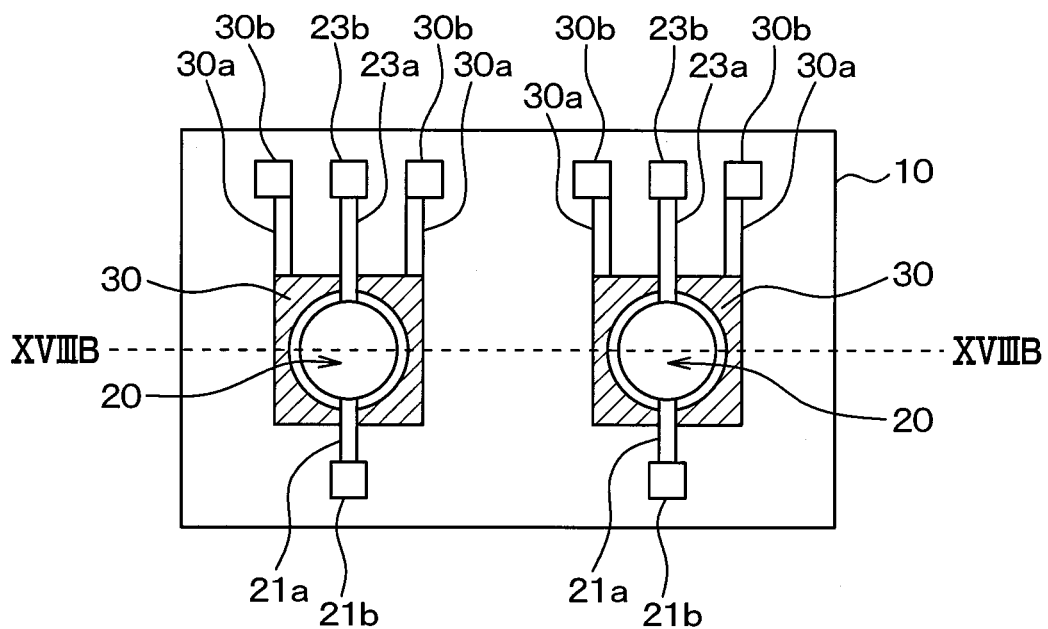
FIG. 18A is a plan view of a magnetic sensor device according to a twelfth embodiment of the present disclosure.
Figure 18B:
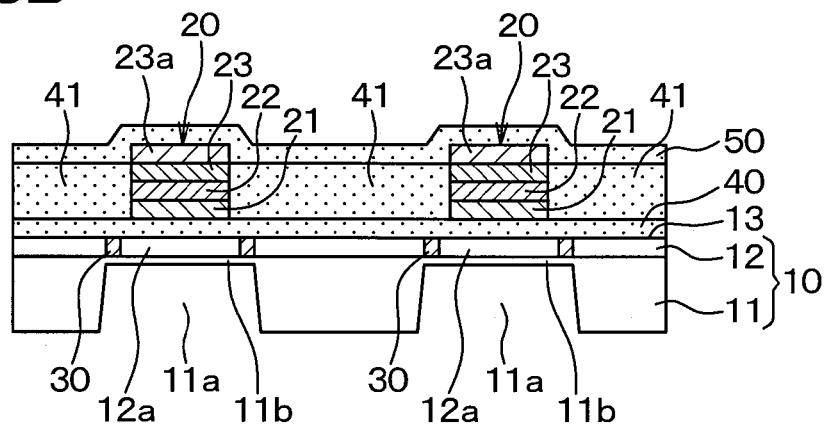
FIG. 18B is a XVIIIB-XVIIIB sectional view of FIG. 18A.

FIG. 18A is a plan view of a magnetic sensor device according to this embodiment, and FIG. 18B is a XVIIIB-XVIIIB sectional view of FIG. 18A. In FIGS. 18A and 18B, numerals and signs the same as those in FIGS. 17A and 17B indicate the same portions.

In the magnetic sensor device of this embodiment, the recessed portion 11a is provided in a region of the substrate 10 corresponding to the heater portion 30 and the sensor portion 20 for each sensor portion 20. By so doing, the membrane 11b can be formed in the substrate 10 on the lower side of the heater portion 30 and the sensor portion 20 for each sensor portion 20. Because of this, by heat generated from the heater portions 30 when heating the sensor portions 20 with the corresponding heater portions 30 in the first and second magnetization steps being made unlikely to transfer to the substrate 10 side, the heat generated from the heater portions 30 can be made likely to transfer to the sensor portion 20 side. Consequently, the accuracy of temperature control of the sensor portions 20 can be increased.

(Thirteenth Embodiment)

In the heretofore described ninth to twelfth embodiments, a description has been given of an example wherein the heater portions 30 are formed in the substrate 10, but in this embodiment, a description will be given of an example wherein the heater portions 30 are formed on the same plane as the sensor portions 20 instead.

Figure 19A:
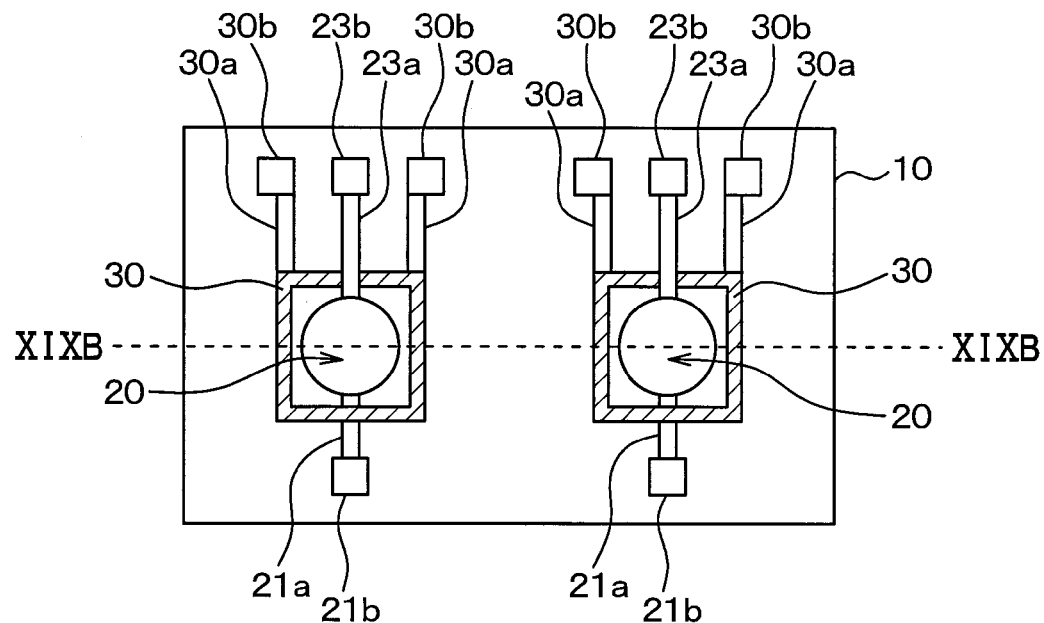
FIG. 19A is a plan view of a magnetic sensor device according to a 4thirteenth embodiment of the present disclosure.
Figure 19B:
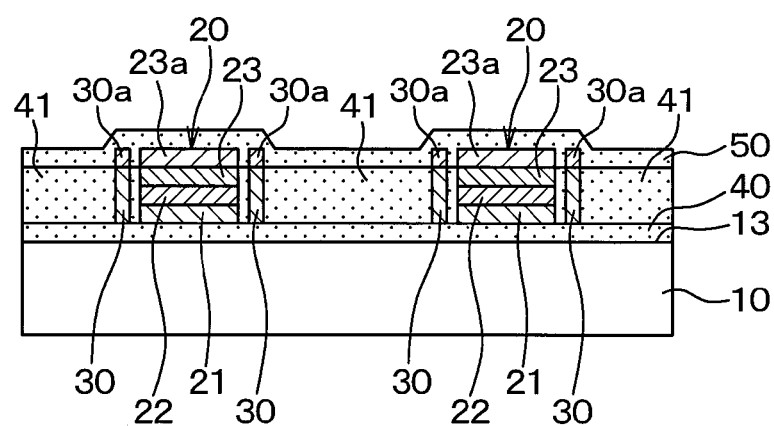
FIG. 19B is a XIXB-XIXB sectional view of FIG. 19A.

FIG. 19A is a plan view of a magnetic sensor device according to this embodiment, and FIG. 19B is a XIXB-XIXB sectional view of FIG. 19A. In FIGS. 19A and 19B, numerals and signs the same as those in FIGS. 13A and 13B indicate the same portions.

The heater portion 30 of this embodiment is formed on the upper side of the insulating film 40 (that is, on the one surface 13 side of the substrate 10) for each sensor portion 20. The substrate 10 of this embodiment is a semiconductor substrate. The heater portions 30 are formed so as to surround the corresponding sensor portions 20. Specifically, the heater portions 30 are formed so that the inside contour is square, and the outside contour is square, as seen in the thickness direction of the substrate 10. By so doing, the heater portions 30 are formed, spaced apart from the corresponding sensor portions 20, around the corresponding sensor portions 20.

Next, a description will be given, referring to FIGS. 20A to 20D and 21A to 21D, of a manufacturing method of the magnetic sensor device of this embodiment. Each of FIGS. 20A to 20D and 21A to 21D corresponds to the XIXB-XIXB section of FIG. 19A.

Figure 20A:
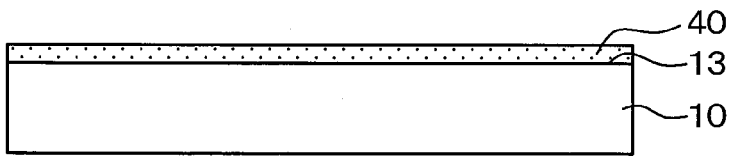
FIGS. 20A to 20D are diagrams showing one portion of manufacturing steps of the magnetic sensor device according to the thirteenth embodiment.

Firstly, in the step shown in FIG. 20A, the insulating film 40 is formed on the one surface 13 of the substrate 10 by a thermal oxidation method, a CVD method, or the like.

Figure 20B:
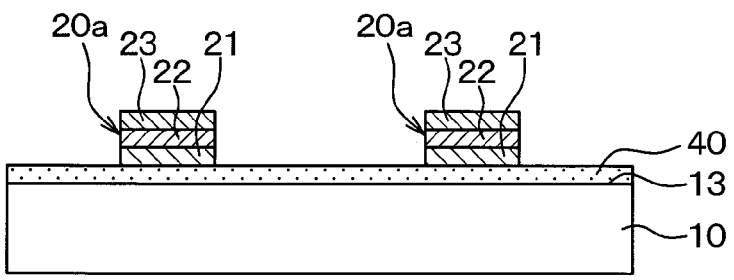

Next, in the step shown in FIG. 20B, two sensor main bodies 20a, each of which is formed of the lower electrode 21, the magneto resistance element portion 22, and the upper electrode 23, are formed on the insulating film 40 by sputtering, etching, or the like.

Figure 20C:
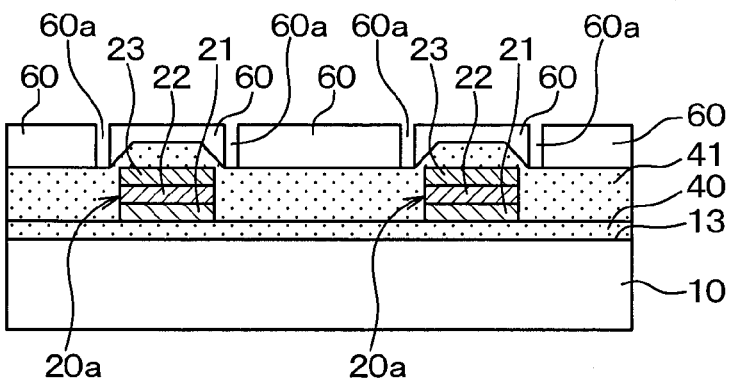

Next, in the step shown in FIG. 20C, a resist 60 is applied so as to cover the two sensor main bodies 20a and the insulating film 40, and patterning is carried out on the applied resist 60 by photolithography or the like. By so doing, a region 60a from which the resist 60 is removed is formed around each of the two sensor main bodies 20a.

Figure 20D:
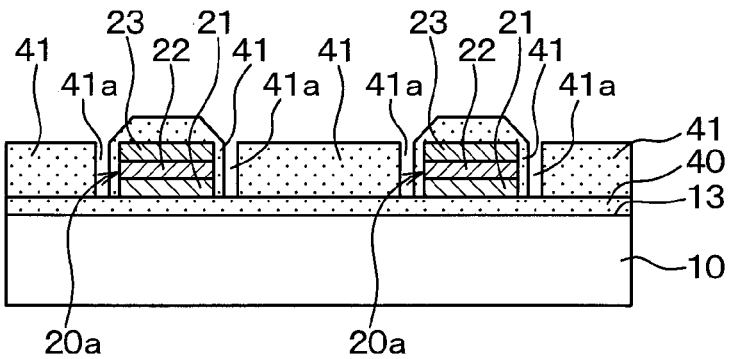

Next, in the step shown in FIG. 20D, hole portions 41a are formed one in each of portions of the insulating film 40 corresponding to the regions 60a by dry etching or the like.

Figure 21A:
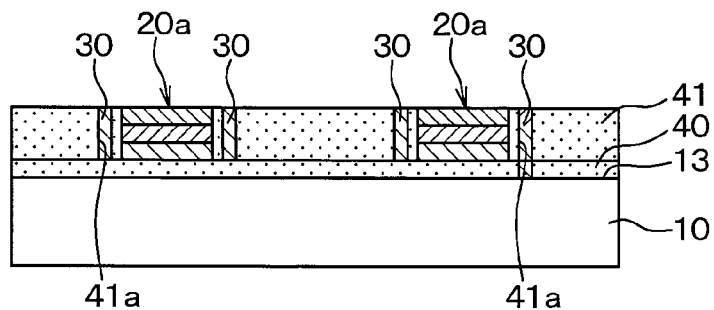
FIGS. 21A to 21D are diagrams showing one portion of manufacturing steps of the magnetic sensor device according to the thirteenth embodiment.

Next, in the step shown in FIG. 21A, a material (for example, polysilicon) of the heater portions 30 is embedded in the hole portion 41a of the insulating film 40 for each sensor main body 20a by sputtering. As a result of this, a side of the heater portions 30 and the sensor main bodies 20a opposite to the substrate 10 is formed to be flat by dry etching or the like. By so doing, the heater portions 30 and the sensor main bodies 20a are exposed on the upper side seen in the drawing (that is, the side opposite to the substrate 10).

Figure 21B:
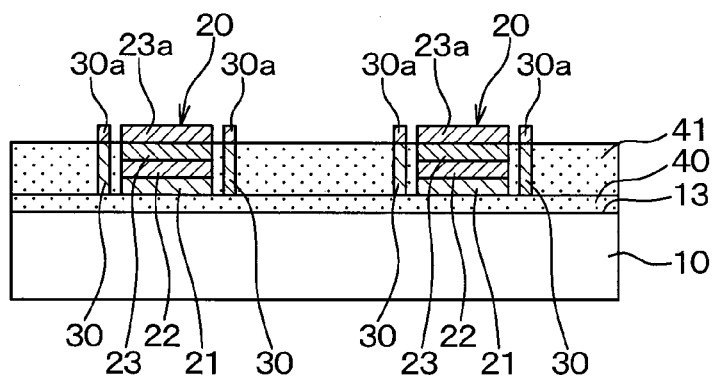

Next, in the step shown in FIG. 21B, the upper electrode wires 23a and the heater portion wires 30a, formed from a metal material, are formed by sputtering, patterning, or the like. Furthermore, as well as a metal material being embedded in the hole portions formed in the insulating film 40, a metal material is deposited on the insulating film 40 by sputtering or the like, and patterning is carried out. By so doing, the lower electrode wires 21a connected to the corresponding lower electrodes 21, the heater portion pads 30b, the lower electrode pads 21b, and the upper electrode pads 23b are formed.

Figure 21C:
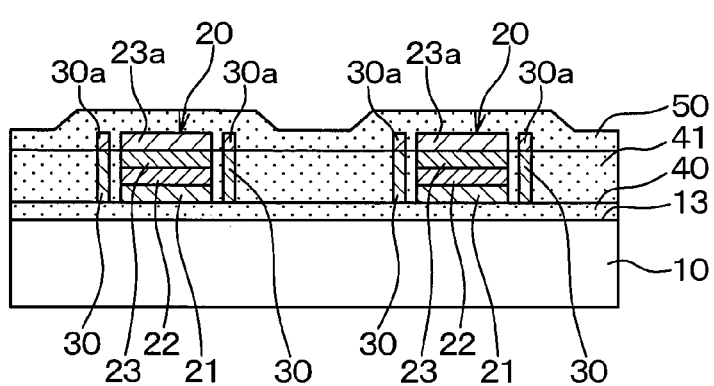

Next, in the step shown in FIG. 21C, the protective film 50 covering the upper electrode wires 23a, the heater portion wires 30a, and the insulating film 41 is formed. Because of the above, the two sensor portions 20 are formed on the substrate 10. Subsequently, in the same way as in the heretofore described first embodiment, magnetizations of the pin magnetic layers 22a of the magneto resistance element portions 22 of the two sensor portions 20 are carried out, one each, in the first and second magnetization steps.

According to this embodiment heretofore described, the heater portions 30 are formed around the corresponding sensor portions 20 on the upper side of the insulating film 40. Because of this, the degree of freedom in selecting a material used as a base material of the sensor portions 20 (that is, a material used for the insulating film 40) is increased, Consequently, the crystallinity of the film configuring the sensor portions 20 can be improved.

(Fourteenth Embodiment)

In this embodiment, a description will be given of an example wherein a membrane is provided in a region of the substrate 10 corresponding to the heater portion 30 for each sensor portion 20 in the magnetic sensor device of the heretofore described thirteenth embodiment.

Figure 22A:
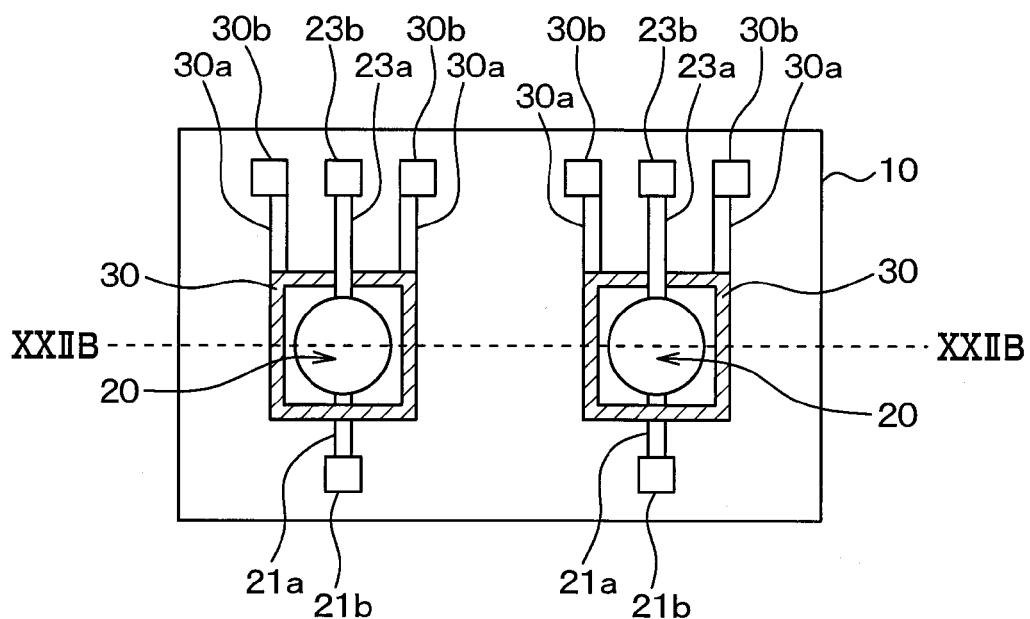
FIG. 22A is a plan view of a magnetic sensor device according to a fourteenth embodiment of the present disclosure.
Figure 22B:
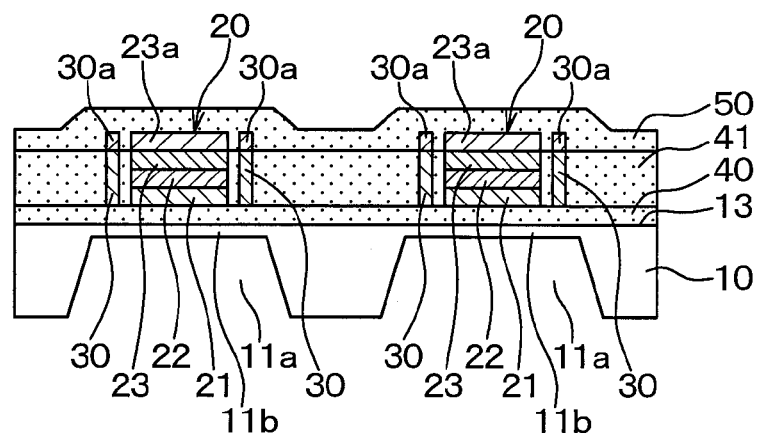
FIG. 22B is a XXIIB-XXIIB sectional view of FIG. 22A.

FIG. 22A is a plan view of a magnetic sensor device according to this embodiment, and FIG. 22B is a XXIIB-XXIIB sectional view of FIG. 22A. In FIGS. 22A and 22B, numerals and signs the same as those in FIGS. 19A and 19B indicate the same portions.

Membranes (thin films) 11b are formed in regions of the substrate 10 of the magnetic sensor device of this embodiment corresponding to the heater portions 30, as shown in FIG. 22B.

Next, a description will be given, referring to FIGS. 20A to 20D and 21A to 21D, of a manufacturing method of the magnetic sensor device of this embodiment.

Figure 21D:
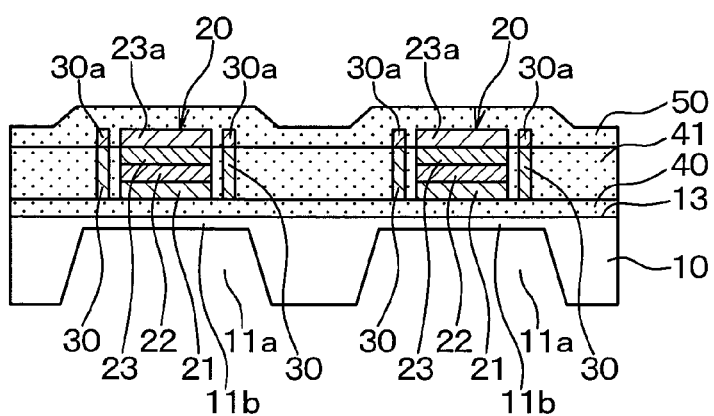

In this embodiment, in the same way as in the heretofore described thirteenth embodiment, after forming the two sensor portions 20 on the substrate 10 in the steps of FIGS. 20A to 20D and 21A to 21C, the recessed portion 11a is formed in the region of the substrate 10 corresponding to the heater portion 30 for each sensor portion 20 by wet etching or dry etching in the step shown in FIG. 21D. By so doing, the membrane 11b can be formed in the substrate 10 on the lower side of the heater portion 30 for each sensor portion 20. Subsequently, in the same way as in the heretofore described first embodiment, magnetizations of the pin magnetic layers 22a of the magneto resistance element portions 22 of the two sensor portions 20 are carried out, one each, in the first and second magnetization steps.

According to this embodiment heretofore described, the membranes 11b and the recessed portions 11a are formed in the substrate 10 on the lower sides of the corresponding heater portions 30. Because of this, in the same way as in the heretofore described tenth embodiment, heat generated from the heater portions 30 can be made likely to transfer to the sensor portion 20 side, Because of this, variation in temperature of the sensor portions 20 is unlikely to occur when heating the sensor portions 20 with the corresponding heater portions 30 in the first magnetization step and the second magnetization step. For this reason, the accuracy of temperature control of the sensor portions 20 can be increased.

(Fifteenth Embodiment)

In the heretofore described thirteenth and fourteenth embodiments, a description has been given of an example wherein the heater portions 30 and the sensor portions 20 are formed on the same plane, but in this embodiment, a description will be given of an example wherein the heater portions 30 are formed immediately above the corresponding sensor portions 20 instead.

Figure 23A:
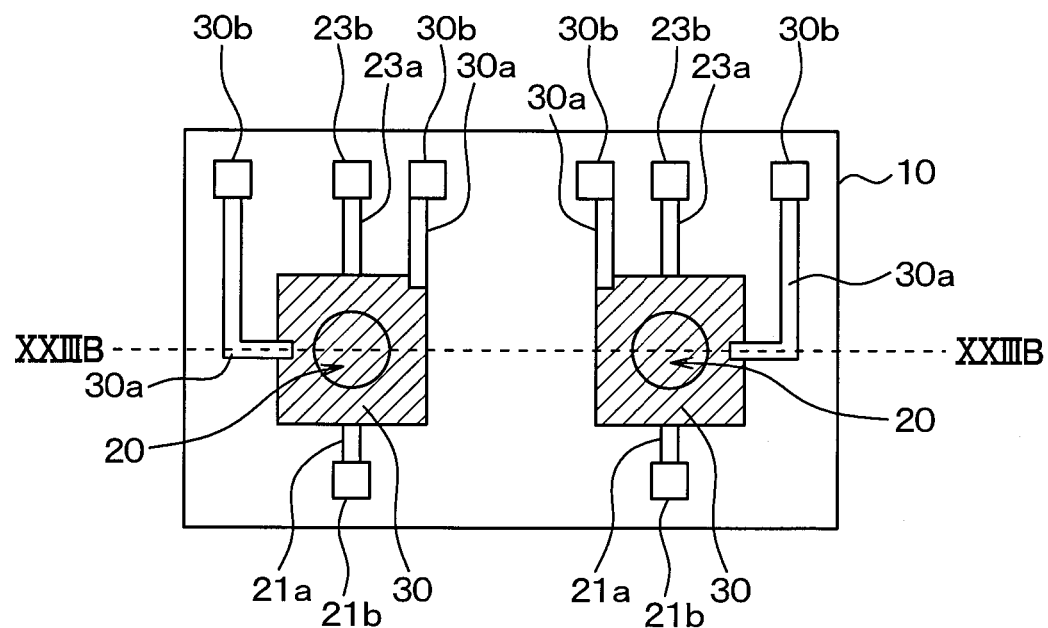
FIG. 23A is a plan view of a magnetic sensor device according to a fifteenth embodiment of the present disclosure.
Figure 23B:
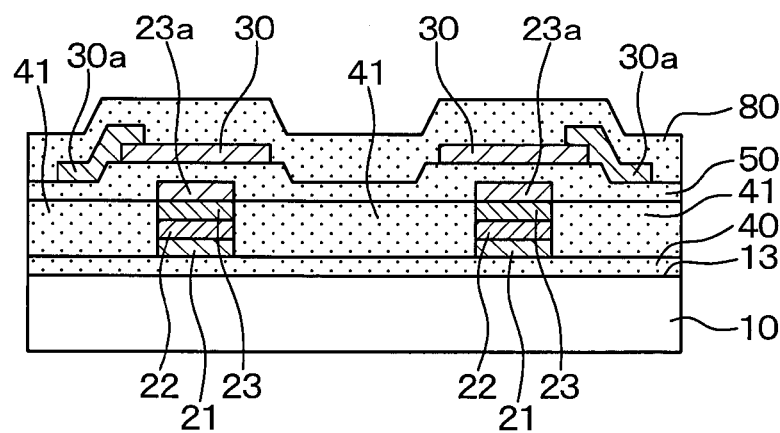
FIG. 23B is a XXIIIB-XXIIIB sectional view of FIG. 23A.

FIG. 23A is a plan view of a magnetic sensor device according to this embodiment, and FIG. 23B is a XXIIIB-XXIIIB sectional view of FIG. 23A. In FIGS. 23A and 23B, numerals and signs the same as those in FIGS. 13A and 13B indicate the same portions.

In the magnetic sensor device of this embodiment, the heater portions 30 are disposed on the upper side of the protective film 50 (that is, on the side opposite to the corresponding sensor portions 20 across the protective film 50). The heater portions 30 are formed in a square shape seen in the thickness direction, The planar direction area of the heater portions 30 is larger than the planar direction area of the sensor portions 20. A protective film 80 is provided on the upper side of the heater portions 30 and the heater portion wires 30a.

In this embodiment, the heater portion pads 30b, the upper electrode pads 23b, and the lower electrode pads 21b are disposed on the upper side of the protective film 80.

Next, a description will be given, referring to FIGS. 24A to 25D, of a manufacturing method of the magnetic sensor device of this embodiment. Each of FIGS. 24A to 24D and 25A to 25D corresponds to the XXIIIB-XXIIIB section of FIG. 23A.

Figure 24A:
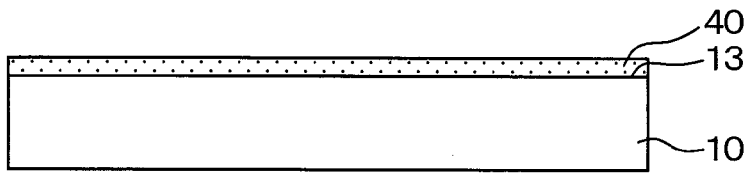
FIGS. 24A to 24D are diagrams showing one portion of manufacturing steps of the magnetic sensor device according to the fifteenth embodiment.

Firstly, in the step shown in FIG. 24A, the insulating film 40 is formed on the one surface 13 of the substrate 10 by a thermal oxidation method, a CVD method, or the like.

Figure 24B:
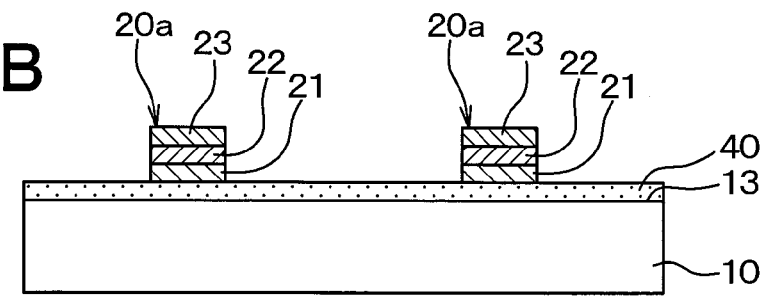

Next, in the step shown in FIG. 24B, two sensor main bodies 20a, each of which is formed of the lower electrode 21, the magneto resistance element portion 22, and the upper electrode 23, are formed on the insulating film 40 by sputtering, etching, or the like.

Figure 24C:
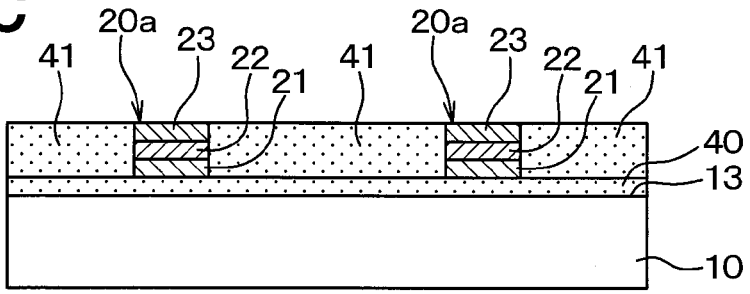

Next, in the step shown in FIG. 24C, the insulating film 41 is formed on the insulating film 40 by sputtering, etching, or the like.

Figure 24D:
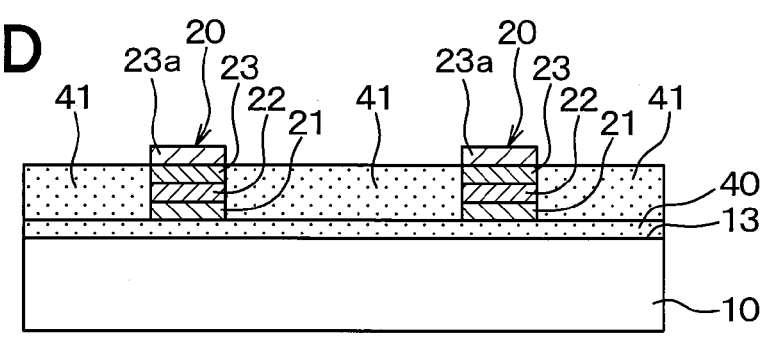

Next, in the step shown in FIG. 24D, the upper electrode wires 23a are formed one on each of the upper sides of the two sensor main bodies 20a by sputtering, etching, or the like.

Figure 25A:
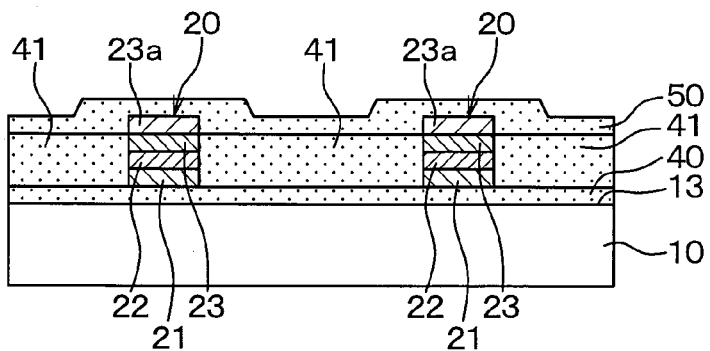
FIGS. 25A to 25D are diagrams showing one portion of manufacturing steps of the magnetic sensor device according to the fifteenth embodiment.

Next, in the step shown in FIG. 25A, the protective film 50 is formed on the upper side of the two sensor main bodies 20a and the insulating film 41 by sputtering or the like.

Figure 25B:
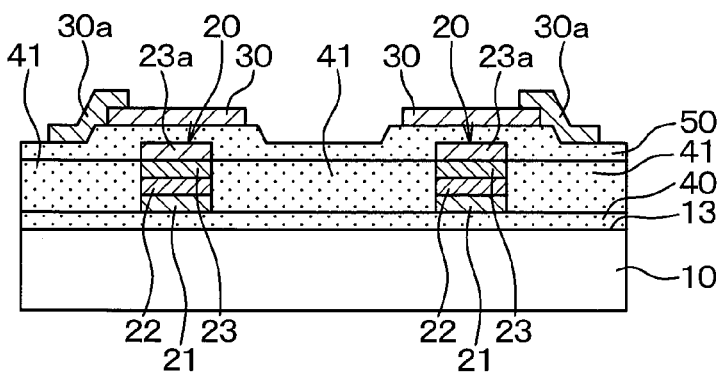

Next, in the step shown in FIG. 25B, the heater portions 30 are formed, and the heater portion wires 30a are formed, one on each of the upper sides of the two sensor portions 20a, by sputtering, etching, or the like.

Figure 25C:
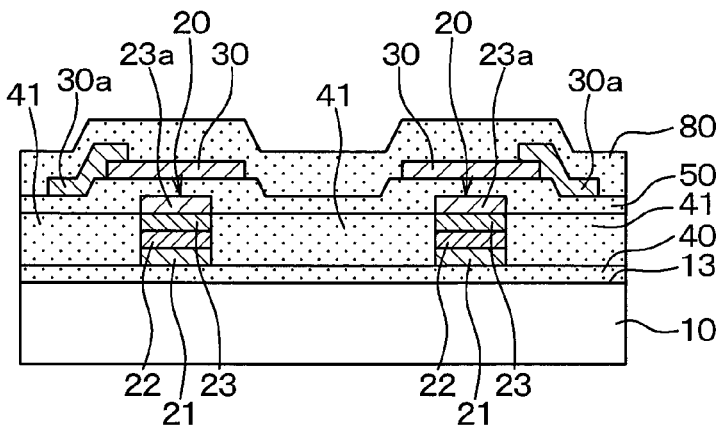
Figure 25D:
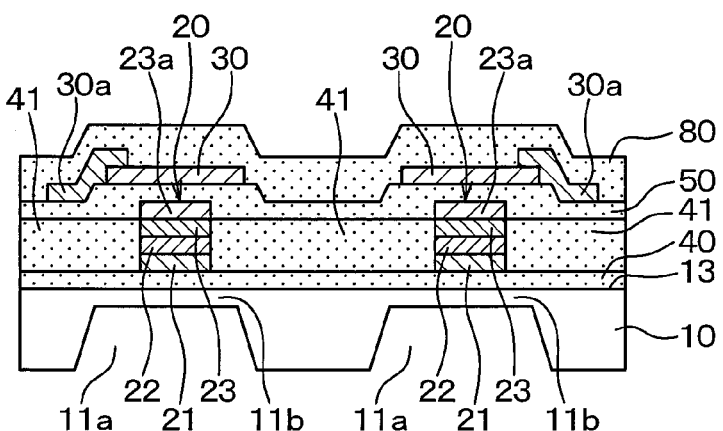

Next, in the step shown in FIG. 25C, the protective film is formed on the upper side of the two sensor main bodies 20a and the heater portions 30 by sputtering or the like. By so doing, two sensor portions are formed on the substrate 10. Subsequently, in the same way as in the heretofore described first embodiment, magnetizations of the pin magnetic layers 22a of the magneto resistance element portions 22 of the two sensor portions 20 are carried out, one each, in the first and second magnetization steps.

According to this embodiment heretofore described, the heater portions 30 are formed on the upper sides of the corresponding sensor portions 20 across the protective film 50. Because of this, the degree of freedom in selecting a material used as a base material of the sensor portions 20 (that is, a material used for the insulating film 40) is increased. Consequently, the crystallinity of the film configuring the sensor portions 20 can be improved.

(Sixteenth Embodiment)

In this embodiment, a description will be given of an example wherein a membrane is provided in a region of the substrate 10 corresponding to the heater portion 30 for each sensor portion 20 in the magnetic sensor device of the heretofore described fifteenth embodiment.

Figure 26A:
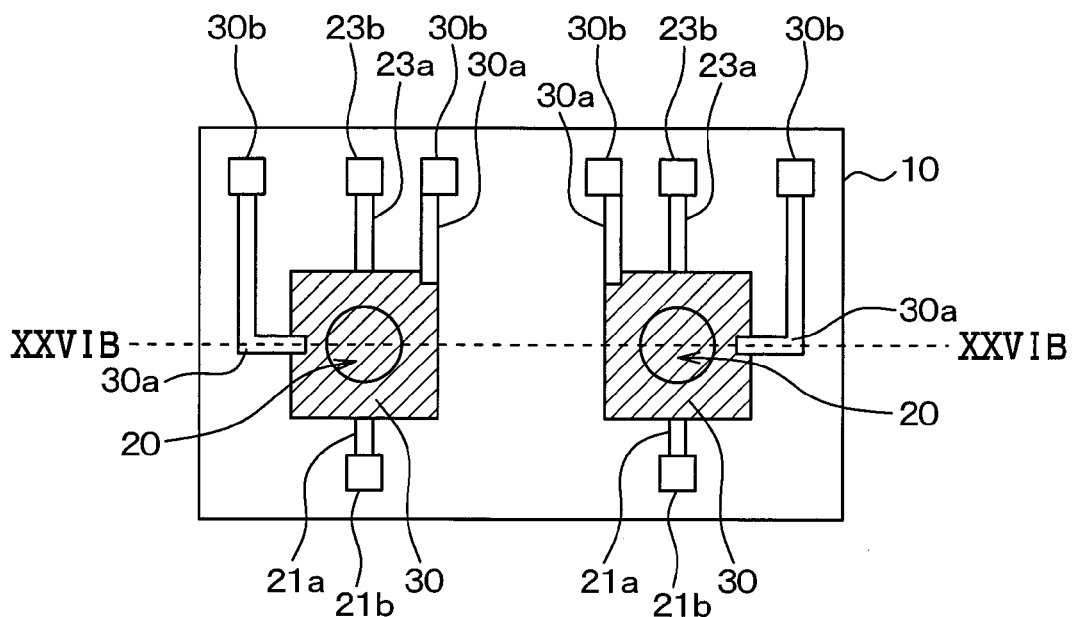
FIG. 26A is a plan view of a magnetic sensor device according to a sixteenth embodiment of the present disclosure.
Figure 26B:
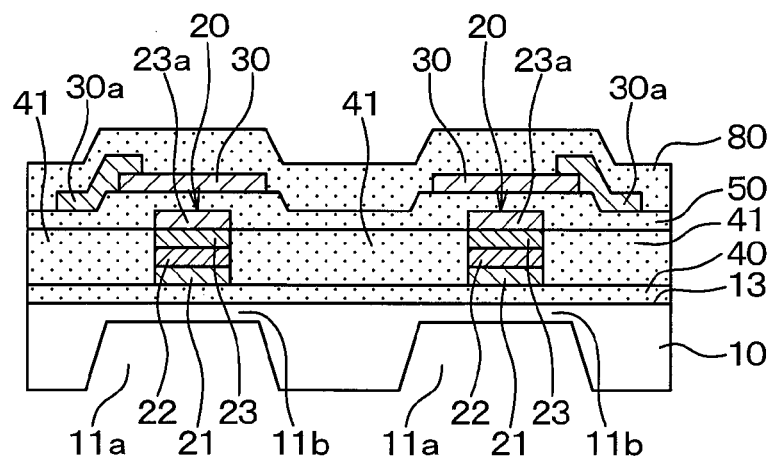
FIG. 26B is a XXVIB-XXVIB sectional view of FIG. 26A.

FIG. 26A is a plan view of a magnetic sensor device according to this embodiment, and FIG. 26B is a XXVIB-XXVIB sectional view of FIG. 26A. In FIGS. 26A and 26B, numerals and signs the same as those in FIGS. 23A and 23B indicate the same portions.

In the magnetic sensor device of this embodiment, the recessed portion 11a is provided in a region of the substrate 10 corresponding to the sensor portion 20 and the heater portion 30 for each sensor portion 20. Because of this, the membrane 11b can be formed in the substrate 10 on the lower side of the sensor portion 20 and the heater portion 30 for each sensor portion 20. Because of this, by making heat generated from the heater portions 30 unlikely to transfer to the substrate 10 side when heating the sensor portions 20 with the corresponding heater portions 30 in the first and second magnetization steps, heat generated from the heater portions 30 can be made likely to transfer to the sensor portion 20 side. Consequently, the accuracy of temperature control of the sensor portions 20 can be increased.

(Seventeenth Embodiment)

In the heretofore described ninth embodiment, a description has been given of an example wherein one heater portion 30 is provided for one sensor portion 20, but in this embodiment, a description will be given of an example wherein a plurality of heater portions 30 are provided for one sensor portion 20 instead.

Figure 27A:
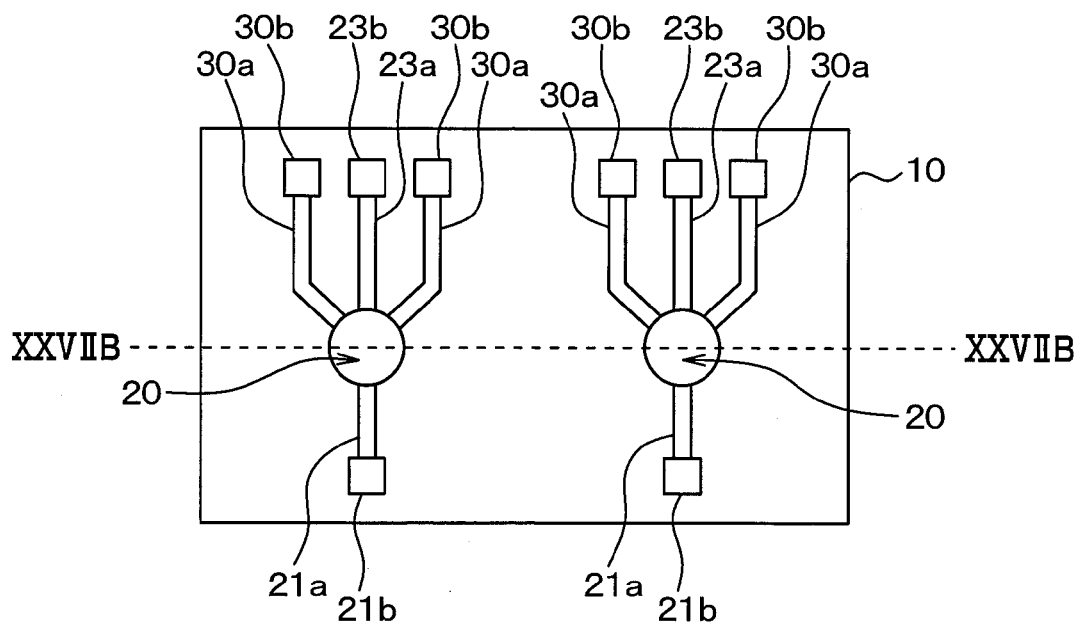
FIG. 27A is a plan view of a magnetic sensor device according to a seventeenth embodiment of the present disclosure.
Figure 27B:
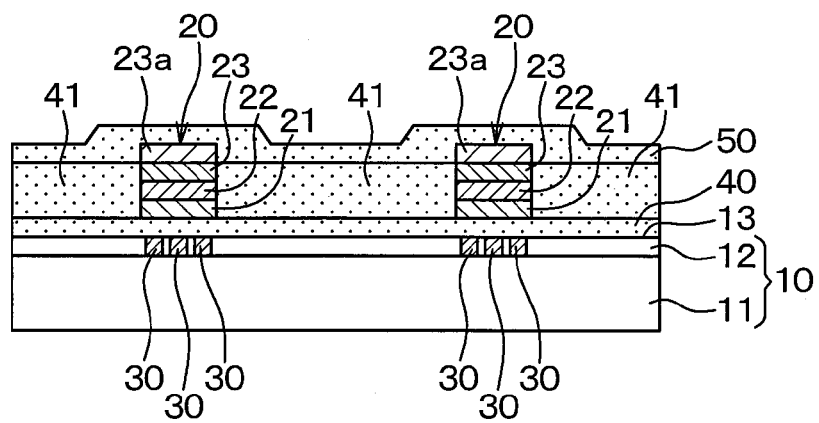
FIG. 27B is a XXVIIB-XXVIIB sectional view of FIG. 27A.

FIG. 27A is a plan view of a magnetic sensor device according to this embodiment, and FIG. 27B is a XXVIIB-XXVIIB sectional view of FIG. 27A. In FIGS. 27A and 27B, numerals and signs the same as those in FIGS. 13A and 13B indicate the same portions.

In the magnetic sensor device of this embodiment, three heater portions 30 are provided for one sensor portion 20 for each sensor portion 20. Each of the three heater portions 30 is smaller than the sensor portion 20. The three heater portions 30 are disposed separated from one another in the planar direction of the substrate 10. The three heater portions 30 are connected to each other. Because of this, the three heater portions 30 can be energized by applying voltage between two heater portion pads 30b. As a result of this, a planar direction temperature distribution becomes unlikely to occur in the sensor portions 20. Therefore, the accuracy of temperature control of the sensor portions 20 can be increased.

(Eighteenth Embodiment)

In this embodiment, a description will be given of an example wherein a membrane is provided in a region of the substrate 10 corresponding to the heater portion 30 for each sensor portion 20 in the magnetic sensor device of the heretofore described seventeenth embodiment.

Figure 28A:
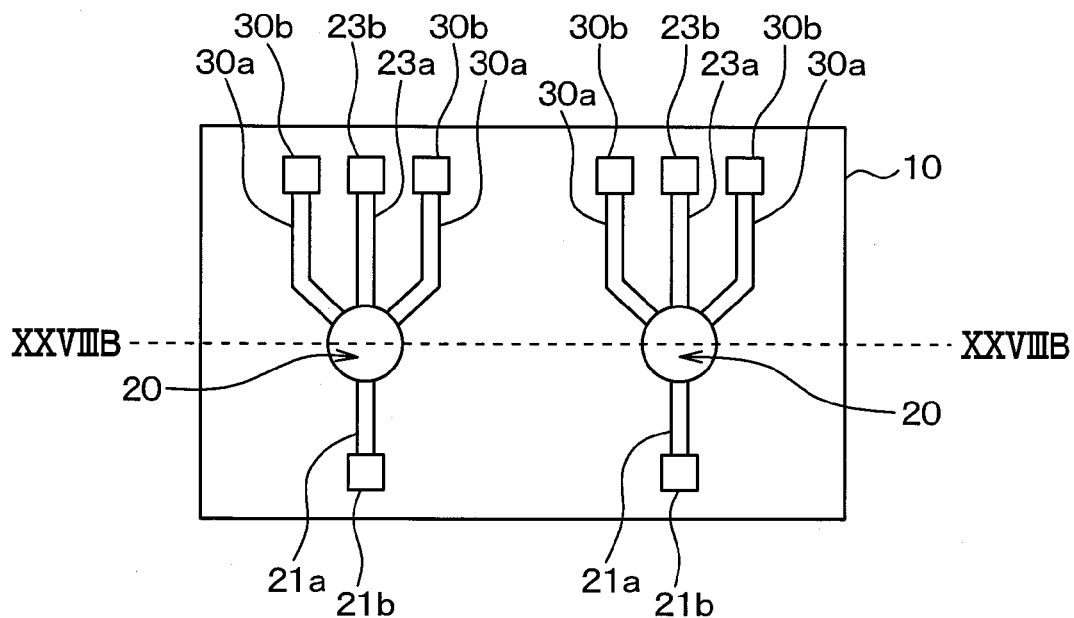
FIG. 28A is a plan view of a magnetic sensor device according to an eighteenth embodiment of the present disclosure.
Figure 28B:
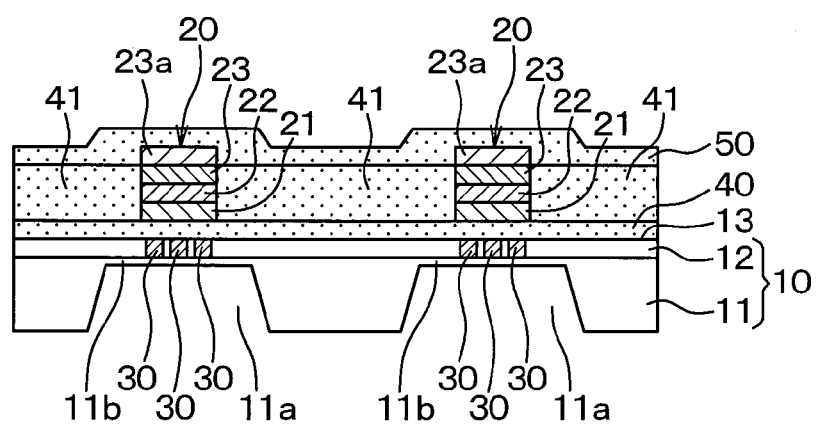
FIG. 28B is a XXVIIIB-XXVIIIB sectional view of FIG. 28A.

FIG. 28A is a plan view of a magnetic sensor device according to this embodiment, and FIG. 28B is a XXVIIIB-XXVIIIB sectional view of FIG. 28A. In FIGS. 28A and 28B, numerals and signs the same as those in FIGS. 27A and 27B indicate the same portions.

In the magnetic sensor device of this embodiment, the recessed portion 11a is provided in a region of the substrate 10 corresponding to the heater portion 30 for each sensor portion 20. By so doing, the membrane 11b can be formed in the substrate 10 on the lower side of the heater portion 30 for each sensor portion 20. Because of this, heat generated from the heater portions 30 can be prevented from transferring to the substrate 10 side when heating the sensor portions 20 with the corresponding heater portions 30 in the first and second magnetization steps. Consequently, the accuracy of temperature control of the sensor portions 20 can be increased.

(Nineteenth Embodiment)

In this embodiment a description will be given of an example wherein temperature sensors 90a and 90b are provided lateral to each heater portion 30 in the substrate 10 in the magnetic sensor device of the heretofore described ninth embodiment.

Figure 29A:
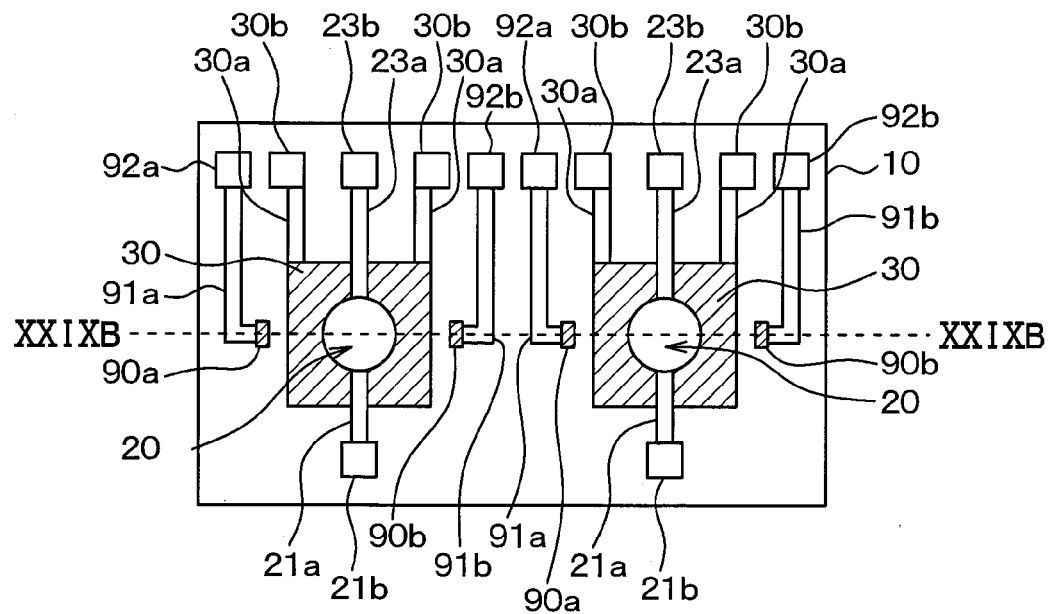
FIG. 29A is a plan view of a magnetic sensor device according to a nineteenth embodiment of the present disclosure.
Figure 29B:
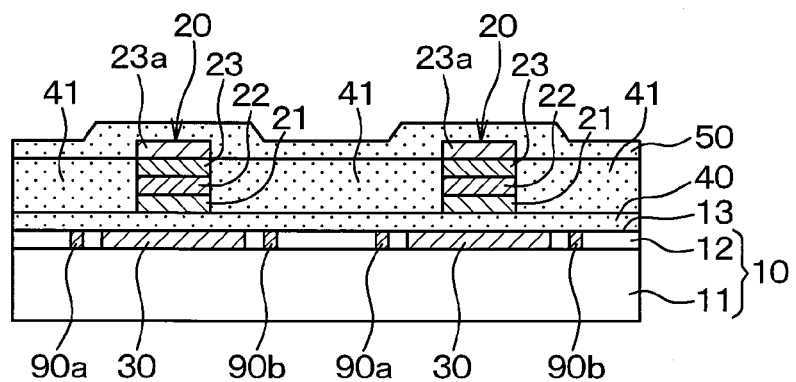
FIG. 29B is a XXIXB-XXIXB sectional view of FIG. 29A.

FIG. 29A is a plan view of a magnetic sensor device according to this embodiment, and FIG. 29B is a XXIXB-XXIXB sectional view of FIG. 29A. In FIGS. 29A and 29B, numerals and signs the same as those in FIGS. 13A and 13B indicate the same portions.

In the magnetic sensor device according to this embodiment, the temperature sensors 90a and 90b are provided for each sensor portion 20. The temperature sensors 90a and 90b, configuring a temperature detection portion, are provided lateral to (that is, in the planar direction of) each heater portion 30. That is, the temperature sensors 90a and 90b and the heater portions 30 are formed on the same plane. The temperature sensors 90a and 90b are formed from a material (for example, polysilicon) the same as that of the heater portion 30.

The magnetic sensor device of this embodiment is manufactured in the steps of FIGS. 14A to 14E and 15A to 15C in the same way as in the heretofore described ninth embodiment. In addition, the temperature sensors 90a and 90b are formed in a step of forming the heater portions 30 (a temperature detection portion formation step). That is, the temperature sensors 90a and 90b and the heater portions 30 are formed in the same step. In addition, the temperature sensors 90a and 90b of this embodiment are used in order to control the temperature of the heater portions 30 when magnetizations of the pin magnetic layers 22a of the magneto resistance element portions 22 of the two sensor portions 20 are carried out, one each, in the first and second magnetization steps.

In this embodiment, temperature sensor pads 92*a* and 92*b* are disposed on the upper side of the insulating film 41. The temperature sensor pad 92*a* is connected to the temperature sensor 90*a* via a temperature sensor electrode 91*a*. The temperature sensor pad 92*b* is connected to the temperature sensor 90*b* via a temperature sensor electrode 91*b*. The temperature sensors 90*a* and 90*b* are connected by an unshown wiring portion.

In the first and second magnetization steps of this embodiment, a resistance value between the temperature sensor pads 92*a* and 92*b* (that is, a combined resistance value of the temperature sensors 90*a* and 90*b*) is detected as a detected temperature of the heater portion 30 for each sensor portion 20. In addition, the temperature of the heater portion 30 is feedback controlled, by using the detected temperature of the heater portion 30 detected in this way, so as to be brought closer to a target value.

According to this embodiment heretofore described, in the magnetic sensor device, the temperature sensors 90*a* and 90*b* are formed in the planar direction with respect to each heater portion 30. Because of this, the temperature of the heater portion 30 can be feedback controlled using the temperature of the heater portion 30 detected by the temperature sensors 90*a* and 90*b*. Because of this, the accuracy of temperature control of the heater portions 30 can be increased in the first and second magnetization steps. In addition to this, the temperature sensors 90*a* and 90*b* are formed lateral to the heater portion 30 from a material (for example, polysilicon) the same as that of the heater portion 30. Because of this, no additional step is necessary in manufacturing steps.

(Twentieth Embodiment)

In this embodiment, a description will be given of an example wherein a membrane is provided in a region of the substrate 10 corresponding to the heater portion 30 for each sensor portion 20 in the magnetic sensor device of the heretofore described nineteenth embodiment.

Figure 30A:
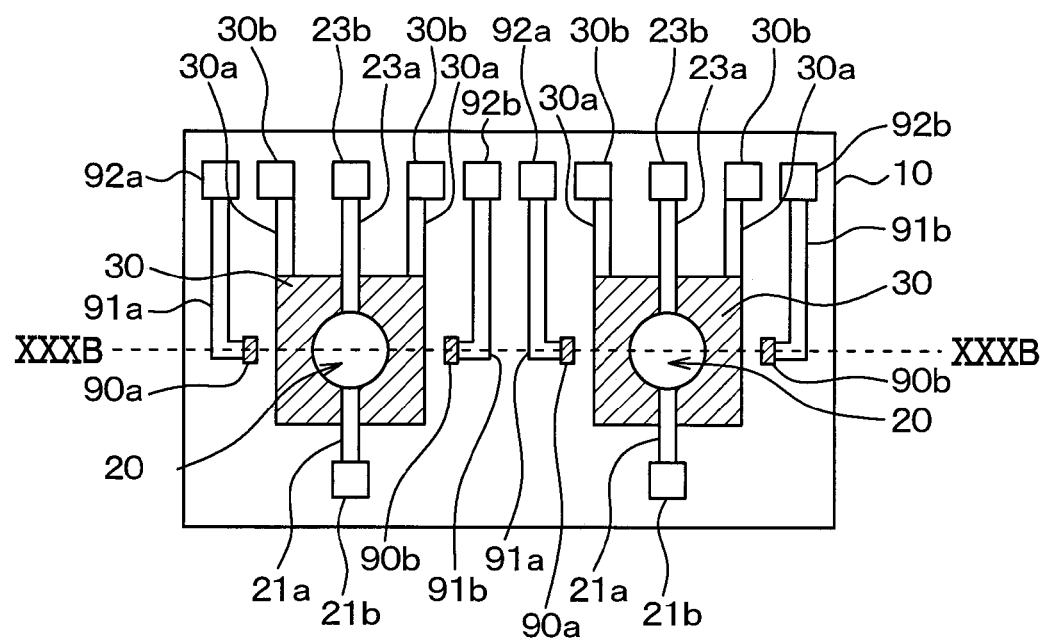
FIG. 30A is a plan view of a magnetic sensor device according to a twentieth embodiment of the present disclosure.
Figure 30B:
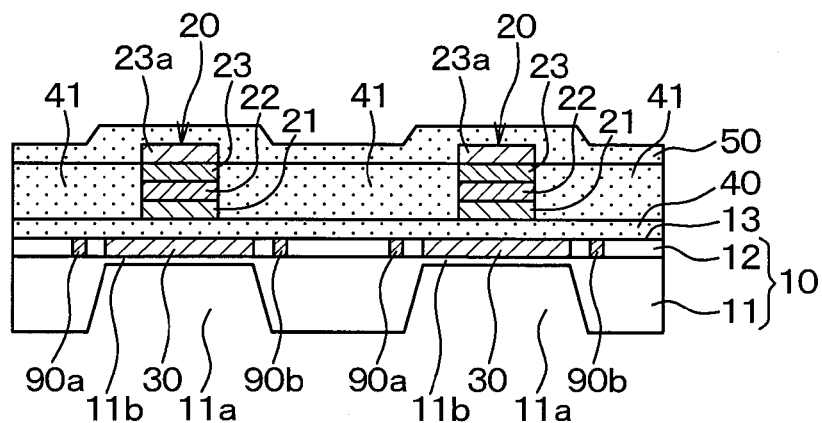
FIG. 30B is a XXXB-XXXB sectional view of FIG. 30A.

FIG. 30A is a plan view of a magnetic sensor device according to this embodiment, and FIG. 30B is a XXXB-XXXB sectional view of FIG. 30A. In FIGS. 30A and 30B, numerals and signs the same as those in FIGS. 29A and 29B indicate the same portions.

In the magnetic sensor device of this embodiment, the recessed portion 11*a* is provided in a region of the substrate 10 corresponding to the heater portion 30 for each sensor portion 20. By so doing, the membrane 11*b* can be formed in the substrate 10 on the lower side of the heater portion 30 for each sensor portion 20. Because of this, heat generated from the heater portions 30 can be made likely to transfer to the corresponding sensor portions 20 when heating the sensor portions 20 with the corresponding heater portions 30. Consequently, the accuracy of temperature control of the sensor portions 20 can be increased.

(Other Embodiments)

In the heretofore described twelfth and sixteenth embodiments, a description has been given of an example wherein the recessed portion 11*a* (that is, the membrane 11*b*) is formed in the region of the substrate 10 corresponding to the heater portion 30 and the sensor portion 20, but without being limited to this, an arrangement may be adopted such that the recessed portion 11*a* (that is, the membrane 11*b*) is formed in a region of the substrate 10 corresponding to at least either the heater portion 30 or the sensor portion 20.

That is, the thickness direction dimension of a portion of the substrate 10 corresponding to either the heater portion 30 or the magneto resistance element portion 20 is made smaller than the thickness direction dimension of a portion other than the portion of the substrate 10 corresponding to the heater portion 30 and the magneto resistance element portion 20.

In the heretofore described seventeenth embodiment, a description has been given of an example wherein three heater portions 30 are provided for one sensor portion 20, but in place of this, an arrangement may be adopted such that three heater portions 30, or four or more heater portions 30, are provided for one sensor portion 20.

The configurations shown in the heretofore described first to twentieth embodiments are examples, and without being limited to the heretofore shown configurations, other configurations which can realize the present disclosure can also be adopted. For example, in each heretofore described embodiment, the magnetic sensor device has been described as being applied to a vehicle but, of course, without being limited to a vehicle, can be widely utilized for detecting a rotation angle.

In the heretofore described first to twentieth embodiments, the magneto resistance element portions 22 have been configured as TMR elements, but may be configured as GMR elements.

In the heretofore described nineteenth and twentieth embodiments, a description has been given of an example wherein the temperature sensor pads 92*a* and 92*b* are connected, and the combined resistance value of the temperature sensors 90*a* and 90*b* is detected as the detected temperature of the heater portion 30, but in place of this, the resistance value of each of the temperature sensors 90*a* and 90*b* may be detected as the detected temperature of the corresponding heater portion 30.

In the heretofore described nineteenth and twentieth embodiments, the probes 50 have been used in order to heat the heater portion 30 by causing current to flow therethrough, but this is one example of a heating method, and an arrangement may be such that a wire connected to the heater portion pad 30*b* is formed in the magnetic sensor device, and current is caused to flow through the heater portion 30 via the wire.

In the heretofore described first to twentieth embodiments, it has been described that two sensor portions 20 are formed on the substrate 10, but an arrangement may be such that a large number of sensor portions 20 are formed on a wafer-like substrate 10, and magnetization of the pin magnetic layers 22*a* may be selectively carried out. By dividing a wafer after the magnetization, a large number of magnetic sensor devices can be manufactured from one wafer.

In the first to twentieth embodiments, a description has been given of an example wherein the heater portions 30 are formed from polysilicon, but without being limited to this, the heater portions 30 may be formed from any one of the materials of single-crystal silicon, platinum, NiCr (nickel chrome), TaN (tantalum nitride), SiC (silicon carbide), or W (tungsten).

In the heretofore described first to twentieth embodiments, a two-way configuration with the first magnetization step and the second magnetization step has been adopted, but a three or more way configuration may be adopted. That is, as the two-way magnetization described in each heretofore described embodiment is established, of course, a three or more way magnetization, such as a three-way magnetization or a four-way magnetization, is also established in the same way.

A combination of two or more combinable embodiments of the heretofore described first to twentieth embodiments and modification examples may be implemented as a disclosure. For example, a combination of the circuit portions 60 and the trenches 70 in the heretofore described first to eighth embodiments may be implemented as a disclosure in the heretofore described ninth to twentieth embodiments.

(Twenty-first Embodiment)

Hereafter, a description will be given, referring to the drawings, of a twenty-first embodiment of the present disclosure. A magnetic sensor device according to this embodiment is used for, for example, an automobile's engine rotation speed detection or wheel rotation angle detection. In this embodiment, a description will be given taking a rotation angle sensor, which detects a rotation angle, as an example of the magnetic sensor device.

Figure 31A:
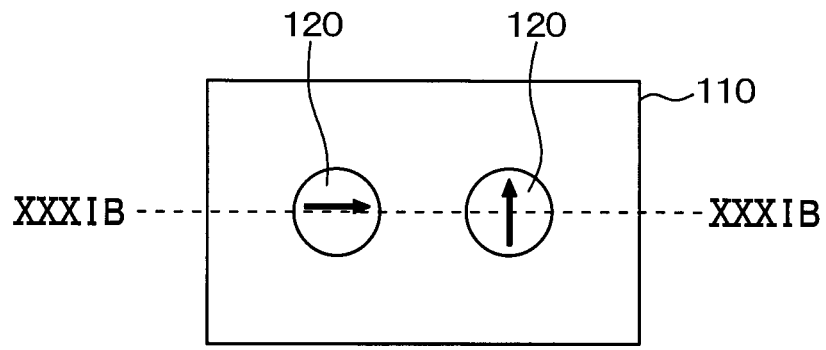
FIG. 31A is a plan view of a magnetic sensor device according to a twenty-first embodiment of the present disclosure.
Figure 31B:
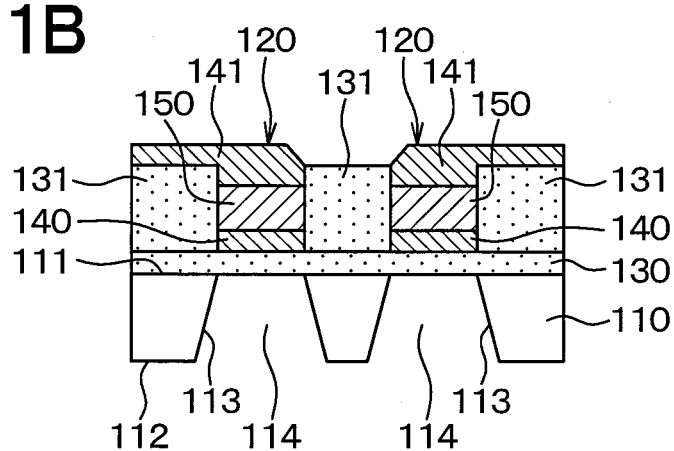
FIG. 31B is a XXXIB-XXXIB sectional view of FIG. 31A.

FIG. 31A is a plan view of the magnetic sensor device according to this embodiment, and FIG. 31B is a XXXIB-XXXIB sectional view of FIG. 31A. The magnetic sensor device includes two sensor portions 120 on a substrate 110, as shown in FIGS. 31A and 31B. The sensor portions 120 are elements whose resistance values change when the elements are influenced by an external magnetic field. The sensor portions 120 according to this embodiment are configured as tunneling magneto resistance elements (TMR elements).

The substrate 110 is a several hundred μm thick semiconductor substrate formed from Si or the like. Also, the substrate 110 has one surface 111 and the other surface 112.

An insulating film 130 is formed on the substrate 110. In addition, the sensor portions 120 are formed on the insulating film 130. Each of the sensor portions 120 includes a lower electrode 140 provided on the insulating film 130, a magneto resistance element portion 150, and an upper electrode 141 provided on the magneto resistance element portion 150.

Figure 32:
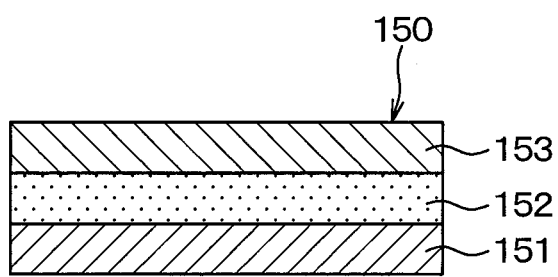
FIG. 32 is a sectional view of a magneto resistance element portion shown in FIG. 31A.

FIG. 32 is a sectional view of the magneto resistance element portion 150. As shown in this diagram, the magneto resistance element portion 150 is such that a TMR element is configured by a pin magnetic layer 151, a tunneling layer 152, and a free magnetic layer 153 being formed in order.

The pin magnetic layer 151 is a ferromagnetic metal layer, positioned on the insulating film 130 side of the free magnetic layer 153, whose magnetization direction is fixed. The tunneling layer 152 is an insulating layer for causing current to flow from the free magnetic layer 153 to the pin magnetic layer 151 using the tunneling effect. The free magnetic layer 153 is a ferromagnetic metal layer whose magnetization direction changes by the layer being influenced by an external magnetic field.

The magneto resistance element portions 150 with this kind of configuration are positioned above the one surface 111 of the substrate 110. In addition, the magnetization directions of the pin magnetic layers 151 differ between one magneto resistance element portion 150 and the other magneto resistance element portion 150 in a planar direction parallel to the one surface 111 of the substrate 110. In this embodiment, the magnetization directions differ 90° from one another. Because of this, the resistance value of one magneto resistance element portion 150 is, for example, a cosine curve output in accordance with the rotation angle, while the resistance value of the other magneto resistance element portion 150 is, for example, a sine curve output in accordance with the rotation angle.

The sensor portions 120 are laid out in a circular form, as shown in FIG. 31A. The reason for making the planar layout of the sensor portions 120 circular in this way is that magnetization characteristics improve. The planar layout of the sensor portions 120 may be elliptical, rather than being perfectly circular. Of course, the planar layout of the sensor portions 120, not being limited to being circular or elliptical, may be polygonal.

Also, an insulating film 131 is formed around the layered structures of the sensor portions 120 so as to make contact with the side surfaces of the layered structures. An insulating material, such as a high-dielectric thermally oxidized film, CVD oxide film, CVD nitride film, or TEOS oxide film, is used for the insulating film 131 and the heretofore described insulating film 130. As a specific example, the insulating films 130 and 131 are of $SiO_2$, SiN, or the like.

In addition, the substrate 110 according to this embodiment has grooves 113. The grooves 113, being portions of the other surface 112 of the substrate 110 which are recessed toward the one surface 111 side, are provided corresponding to the magneto resistance element portions 50. Because of the grooves 113, the thickness of portions of the substrate 110 corresponding to the magneto resistance element portions 150 is smaller than the thickness of a portion of the substrate 110 differing from the relevant portions. Because of this, space portions 14 are formed in portions in which the grooves 113 are formed. That is, it can be said that the substrate 110 has the space portions 114, one each, in the portions corresponding to the magneto resistance element portions 150.

At this point, in this embodiment, the grooves 113 are formed in the substrate 110 so that the insulating film 130 is exposed. Because of this, the substrate 110 has no thickness in the portions of the substrate 110 in which the grooves 113 are formed. In other words, the grooves 113 according to this embodiment are through holes. However, the space portions 114 are formed as a result of the thickness of the portions of the substrate 110 in which the grooves 113 are formed being reduced. Consequently, a structure wherein the grooves 113 penetrate the substrate 110 is also included in the heretofore described structure wherein "the thickness of portions of the substrate 110 corresponding to the corresponding magneto resistance element portions 150 is smaller than the thickness of a portion of the substrate 110 differing from the relevant portions."

The space portions 114, as they are portions wherein some portions of the substrate 110 are removed, are portions whose thermal conductivity is lower than that of the substrate 110. Because of this, the space portions 114 perform a role in suppressing thermal diffusion when locally heating the substrate 110 when magnetizing the pin magnetic layers 151 of the magneto resistance element portions 150.

Also, the area of the groove 113 bottom portions is larger than the area of the magneto resistance element portions 150. Because of this, a structure is adopted wherein thermal diffusion to the other magneto resistance element portion 150 is suppressed by the space portion 114 when magnetizing the pin magnetic layers 151.

Each lower electrode 140 is connected to an unshown lower electrode pad formed on the insulating film 130 via an unshown lower electrode wire connected to the relevant lower electrode 140. The lower electrode wires are formed so as to penetrate the insulating film 131. The lower electrode pads are connected one to each unshown signal processing chip.

Also, each upper electrode 141 is connected to an unshown upper electrode pad formed on the insulating film 130 via an unshown upper electrode wire connected to the relevant upper electrode 141. The upper electrode wires are formed on the insulating film 131. The upper electrode pads are connected one to each unshown signal processing chip.

The above is the overall configuration of the magnetic sensor device according to this embodiment. Next, a description will be given, referring to FIGS. 33A to 35B, of a manufacturing method of the magnetic sensor device with the heretofore described configuration. Each of FIGS. 33A to 35B shows a sectional view of a structure wherein two magneto resistance element portions 150 are taken to be one sensor portion 120.

Figure 33A:
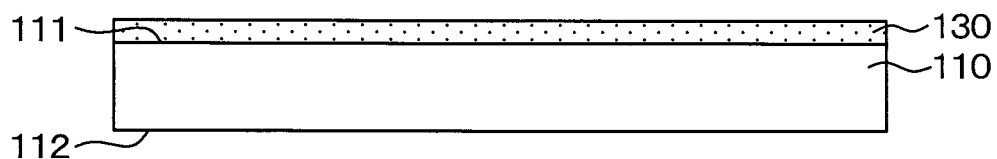
FIGS. 33A to 33C are diagrams showing manufacturing steps of the magnetic sensor device shown in FIGS. 31A and 32.

Firstly, in the step shown in FIG. 33A, the insulating film 130 with a thickness of, for example, several μm is formed on the one surface 111 of the substrate 110 by a CVD method or the like.

Figure 33B:
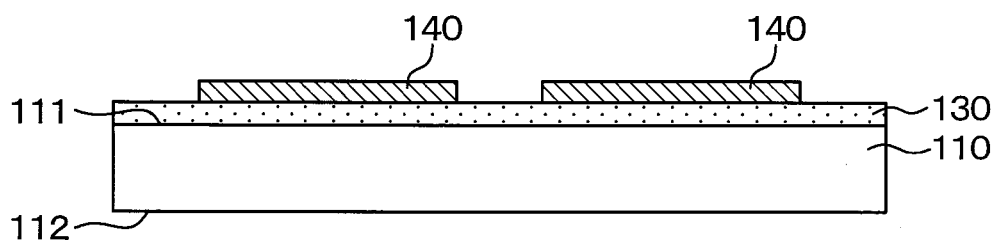

Continuing, in the step shown in FIG. 33B, a metal layer forming the lower electrodes 140 is formed by sputtering or the like. In addition, the metal layer is etched by milling, or the like, thereby forming the lower electrodes 140. A metal layer patterning is carried out on the metal layer forming the lower electrodes 140 so that one portion of each lower electrode wire is left.

Figure 33C:
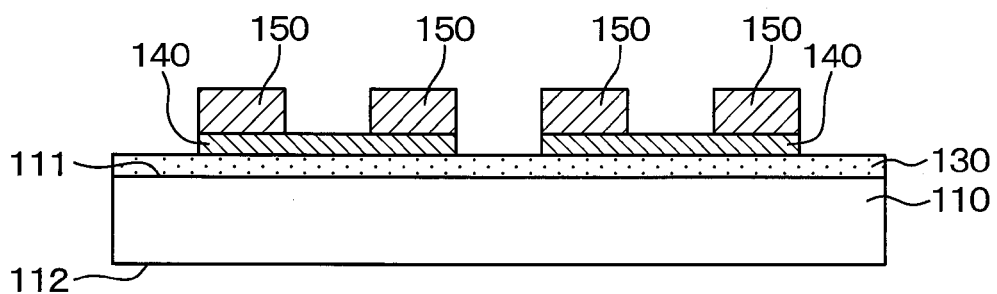

In the step shown in FIG. 33C, individual layers forming the magneto resistance element portions 150 are formed in order on the lower electrodes 140 by sputtering or the like. In addition, the layers are etched by milling, or the like, thereby forming a pair of magneto resistance element portions 150 on each lower electrode 140 (an element portion formation step).

Figure 34A:
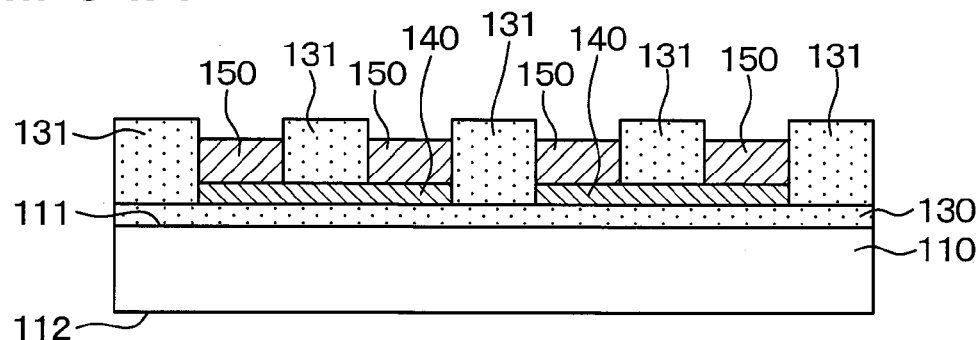
FIGS. 34A to 34C are diagrams showing manufacturing steps following FIG. 33C.

In the step shown in FIG. 34A, the insulating film 131 is formed on the insulating film 130 by a liftoff method. By so doing, the insulating film 131 covers the side surfaces of the lower electrodes 140 and the magneto resistance electrode portions 150. Unshown hole portions connecting one with one portion of each lower electrode wire are formed in the insulating film 131.

Figure 34B:
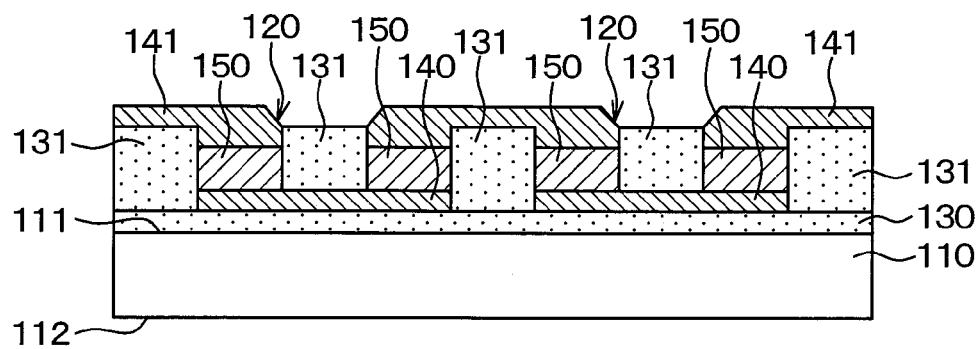

In addition, in the step shown in FIG. 34B, as well as a metal material being embedded in the unshown hole portions formed in the insulating film 131, a metal layer forming the upper electrodes 141 is formed on the magneto resistance element portions 150 by sputtering or the like. Also, the metal layer is etched by milling or the like. By so doing, the upper electrodes 141, the lower electrode wires connected to the lower electrodes 140, the upper electrode wires connected to the upper electrodes 141, and the lower electrode pads and the upper electrode pads, which are connected to these respective wires, are formed. Two sensor portions 120 are formed on the substrate 110 in this way.

Figure 34C:
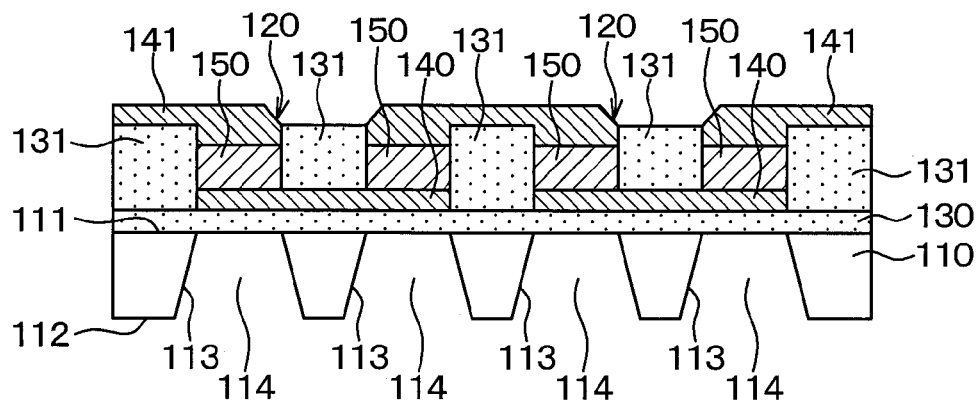

In the step shown in FIG. 34C, the space portions 114 are formed in the substrate 110 (a space portion formation step). In order to do this, wet etching is carried out on the other surface 112 side of the substrate 110 using a Si etchant such as KOH or TMAH. By so doing, the grooves 113 are formed in the other surface 112 of the substrate 110 on the side opposite to the one surface 111, thereby forming the space portions 114.

At this point, the grooves 113 are formed so that the thickness of the portion of the substrate 110 corresponding to each magneto resistance element portion 150 is smaller than the thickness of the portion differing from the relevant portions, but in this embodiment, etching is carried out until the insulating film 130 is exposed. That is, the portions of the substrate 110 corresponding to the magneto resistance element portions 150 are removed. Also, the grooves 113 are formed so that the area of the groove 113 bottom portions is larger than the area of the magneto resistance element portions 150, that is, each magneto resistance element portion 150 is included within the region of the bottom portion of the corresponding groove 113.

Figure 35A:
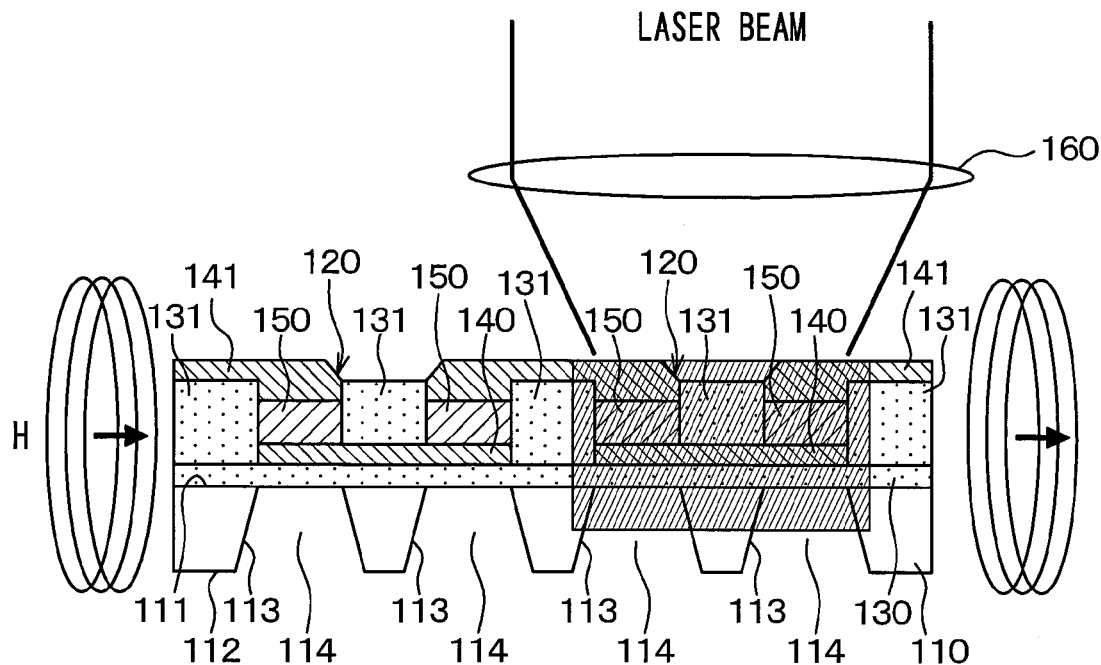
FIGS. 35A and 35B are diagrams showing manufacturing steps following FIG. 34C, particularly, diagrams showing magnetization steps.
Figure 35B:
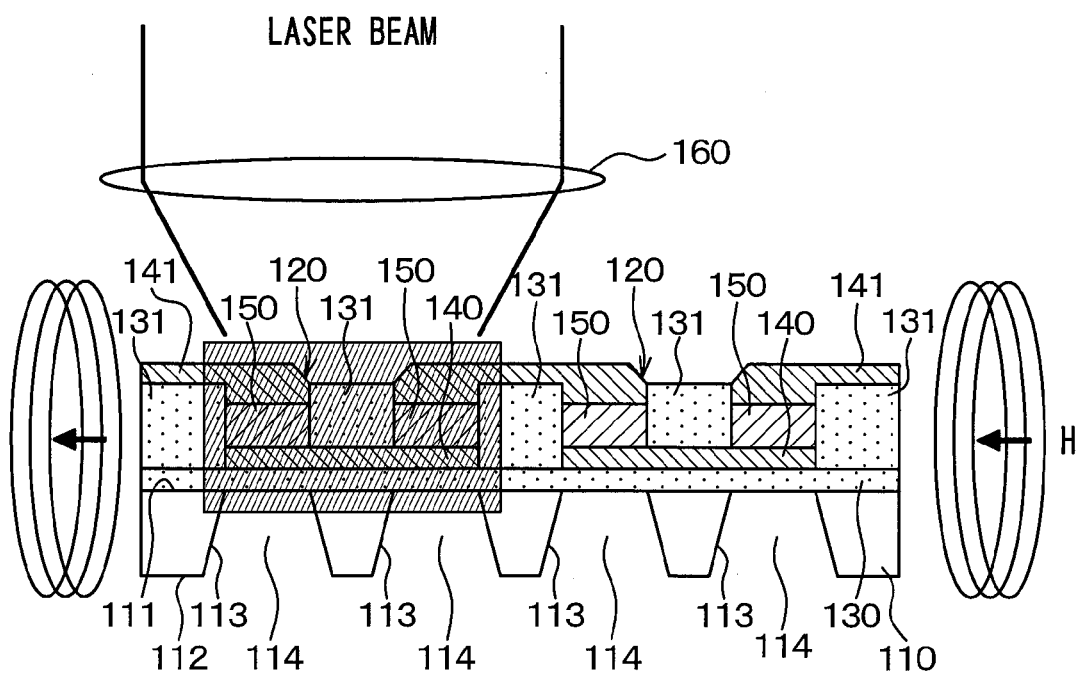

Subsequently, the magnetization steps shown in FIGS. 35A and 35B are carried out. Firstly, in the step shown in FIG. 35A, magnetization of the pin magnetic layer 151 of one magneto resistance element portion 150 is carried out (a first magnetization step). Specifically, the substrate 110 on which the magneto resistance element portions 150 are formed is disposed in a magnetic field (H) whose magnetization direction is set to a first direction in the planar direction of the one surface 111 of the substrate 110, and one magneto resistance element portion 150 is locally heated, thus carrying out an in-field anneal. That is, an external magnetic field is applied to all the sensor portions 120, and the magneto resistance element portion 150 of the sensor portion 120 intended to be magnetized is locally and selectively heated to around 300° C.

In this embodiment, a laser beam is focused by a lens 160, and one magneto resistance element portion 150 is locally irradiated with the focused laser beam. A heated portion is shown by hatching in FIG. 35A. A semiconductor laser or a YAG laser is used for laser beam irradiation. Laser heating has advantages in that a laser beam irradiation time is short, and that there is little variation in temperature.

It is preferable that the spot diameter of the laser beam focused by the lens 160 is of a size completely covering the one magneto resistance element portion 150. By so doing, the whole of the one magneto resistance element portion 50 can be evenly heated.

The pin magnetic layer 151 configuring the one magneto resistance element portion 150 is magnetized so that the magnetization direction of the relevant pin magnetic layer 151 is the first direction in the above way. At this time, the magnetization can be carried out while confirming the output, of the magnetic sensor device.

When heating, a two-stage heating may be carried out wherein, firstly, the whole of the magnetic sensor device is heated to in the order of 150° C., and after that, laser beam irradiation is implemented.

Continuing, in the step shown in FIG. 35B, magnetization of the pin magnetic layer 151 of the other magneto resistance element portion 150 is carried out (a second magnetization step). Specifically, the substrate 110 on which the magneto resistance element portions 150 are formed is disposed in a magnetic field wherein the magnetization direction is set to a second direction, differing from the first direction, in the planar direction of the one surface 111 of the substrate 110. The second direction is a direction tilted at 90° to the first direction.

In addition, in the same way as in the first magnetization step, the other magneto resistance element portion 150 is heated by being locally irradiated with a laser beam, thus carrying out an In-field anneal. By so doing, the pin magnetic layer 151 configuring the relevant magneto resistance element portion 150 is magnetized in the second direction. At this time, the magnetization direction can be adjusted with a high degree of accuracy by adjusting the direction of the substrate 110 in a magnetic field while confirming the output of the magnetic sensor device. A heated portion is shown by hatching in FIG. 35B in the same way as in FIG. 35A.

A magnetic sensor device wherein the pin magnetic layers 151, one each, of two sensor portions 120 formed on one substrate 110 are magnetized in differing directions is completed in this way. That is, the output of one magneto resistance element portion 150 is of a cosine-curve resistance value, while the output of the other magneto resistance element portion 150 is of a sine-curve resistance value.

Next, a description will be given of a method of detecting a rotation angle as a physical amount when the magnetic sensor device is influenced by an external magnetic field. In order to detect a rotation angle, current is caused to flow through the magneto resistance element portions 150 via the corresponding lower electrode pads and upper electrode pads.

In addition, for example, an unshown magnet is disposed above the magnetic sensor device, and on the magnet rotating by a handle being operated, a magnetic field which the free magnetic layers 153 receive from the magnet changes. That is, by each magneto resistance element portion 150 being influenced by an external magnetic field, the size of current flowing through each magneto resistance element portion 50, that is, the resistance value, changes based on a change in the resistance value of each magneto resistance element portion 150.

At this point, each of the cosine-curve resistance value output by one magneto resistance element portion 150 and the sine-curve resistance value output by the other magneto resistance element portion 50 is loaded into an external computing chip, and arc-tangent computed by this chip. By so doing, an output which changes at regular angles in accordance with a rotation angle of −180° to +180°, that is, 360°, is obtained. Consequently, a magnet rotation angle corresponding to the size of the output can be obtained.

As heretofore described, this embodiment is characterized in that the space portion 114 which reduces the thickness of the portion of the substrate 110 corresponding to each magneto resistance element portion 50 is formed by forming the groove 113 in the portion of the substrate 110 corresponding to each magneto resistance element portion 50.

As the space portions 114 are provided in the portions of the substrate 110 corresponding to the magneto resistance element portions 150, even in the event that the pin magnetic layer 151 of the magneto resistance element portion 150 is locally heated, the heat can be made unlikely to transfer to the other magneto resistance element portion 50 via the substrate 110. That is, the thermal conduction of the portions of the substrate 110 removed by the space portions 114 can be suppressed. Consequently, the effect of thermal diffusion on the other magneto resistance element portion 150 can be reduced in the magnetization steps.

Also, as the space portions 114 are provided in the substrate 110, the substrate 110 is superior in heat insulation between the magneto resistance element portions 150. Because of this, each magneto resistance element portion 150 can be reduced in size.

One magneto resistance element portion 150 corresponds to "one portion of a plurality of magneto resistance element portions", and the other magneto resistance element portion corresponds to "one portion differing from the one portion of the plurality of magneto resistance element portions".

(Twenty-second Embodiment)

Figure 36:
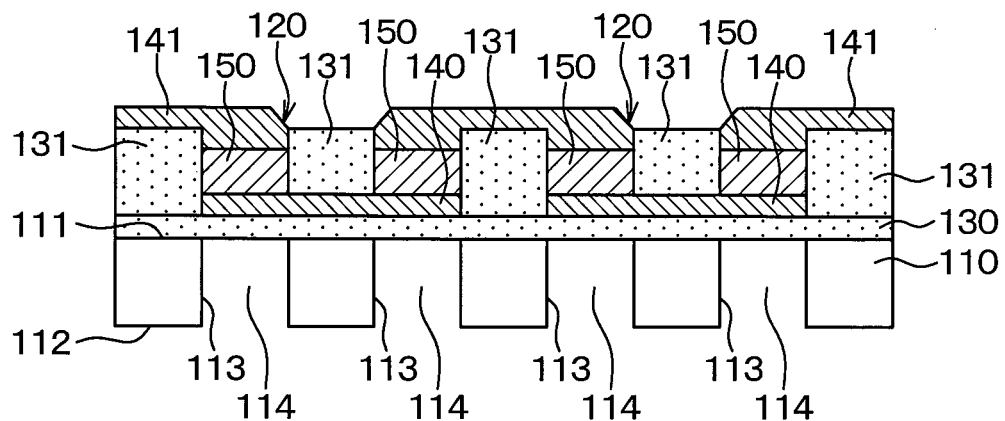
FIG. 36 is a sectional view including a magnetic sensor device according to a twenty-second embodiment of the present disclosure.

In this embodiment, a description will be given of a portion differing from the twenty-first embodiment. In the heretofore described twenty-first embodiment, in order to form the grooves 113, the substrate 110 has been wet etched in the step shown in FIG. 34C, but Si dry etching may be carried out. In this case, the side surfaces of the grooves 113 are formed perpendicularly to the other surface 112 of the substrate 110, as shown in FIG. 36.

(Twenty-third Embodiment)

Figure 37:
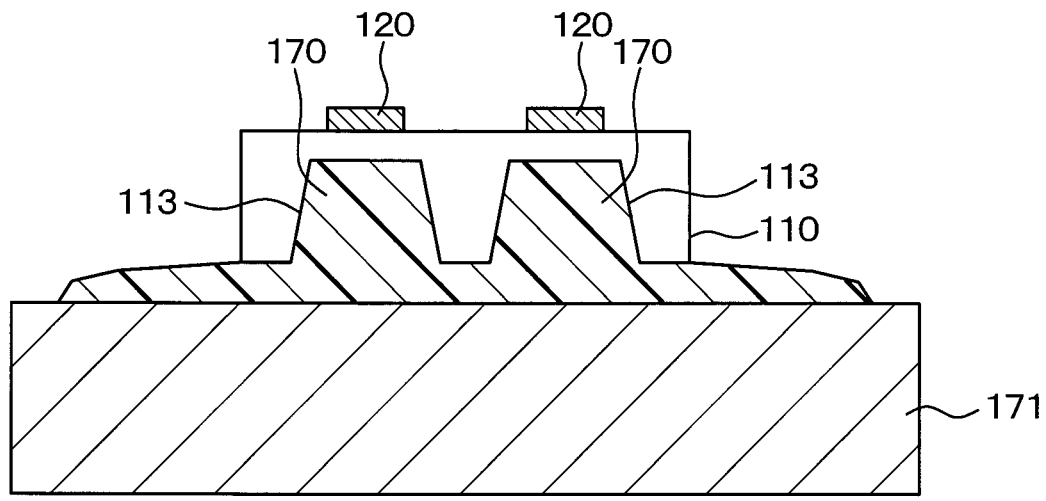
FIG. 37 is a sectional view including a magnetic sensor device according to a twenty-third embodiment of the present disclosure.

In this embodiment, a description will be given of portions differing from the twenty-first and twenty-second embodiments. FIG. 37 is a sectional view including a magnetic sensor device according to this embodiment. FIG. 37 schematically shows a section of the magnetic sensor device, and a detailed sectional view is the same as that of the heretofore described FIG. 31B.

As shown in FIG. 37, an embedded member 170 is embedded in the grooves 113. By so doing, the space portions 114 formed by the grooves 113 are filled with the embedded member 170. A resin, or the like, is used as a material of the embedded member 170.

Also, the embedded member 170 adheres to a package 171, such as a casing or a lead frame. By so doing, the magnetic sensor device is mounted on the package 171 across the embedded member 170.

A step of embedding the embedded member 170 is carried out after the second magnetization step. In this embedding step, not only are the grooves 113 simply filled with the embedded member 170, but the magnetic sensor device may be mounted on the package 171 across the embedded member 170.

The strength of the substrate 110 can be secured by the space portions 114 for suppression of thermal diffusion being filled with the embedded member 170 in the above way.

(Twenty-fourth Embodiment)

Figure 38A:
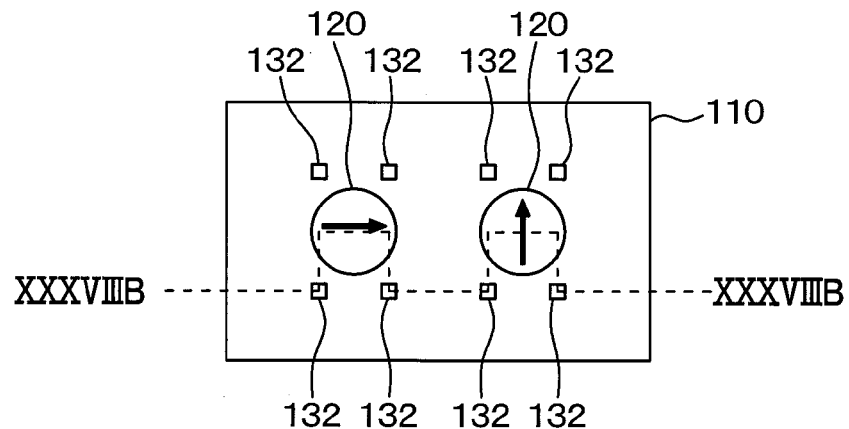
FIG. 38A is a plan view of a magnetic sensor device according to a thirty-fourth embodiment of the present disclosure.

In this embodiment, a description will be given of a portion differing from the twenty-first to twenty-third embodiments. FIG. 38A is a plan view of a magnetic sensor device according to this embodiment, and FIG. 38B is a XXXVIIIB-XXXVIIIB sectional view of FIG. 38A.

Figure 38B:
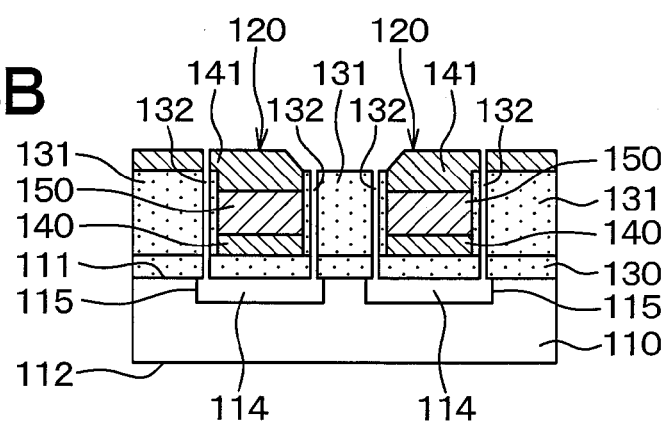
FIG. 38B is a XXXVIIIB-XXXVIIIB sectional view of FIG. 38A.

As shown in FIG. 38B, a hollow structure 115 is formed in a portion of the substrate 110 corresponding to each magneto resistance element portion 50. The space portions 114 are formed by the corresponding hollow structures 115.

In order to form the hollow structures 115, hole portions 132 are provided in the magnetic sensor device, as shown in FIG. 38A. In this embodiment, four hole portions 132 are provided around each sensor portion 120, but the number of hole portions 132 can be set as appropriate. In addition, the hole portions 132 each penetrate the upper electrode 141, the insulating film 131, and the insulating film 130, reach the substrate 110, and connect with the corresponding hollow structures 115. That is, the hole portions 132 are so-called etching holes for forming the hollow structures 115 in the substrate 110.

When forming the hollow structures 115 in the substrate 110 in this way, firstly, the hole portions 132 are formed so as to penetrate the upper electrodes 141, the insulating film 131, and the insulating film 130 in the step shown in FIG. 33C (the space portion formation step). The hole portions 132, which are etching holes, are formed by SiO2 dry etching or the like.

Continuing, an etching medium is introduced into the substrate 110 via the hole portions 132. There is a method whereby the space portions 114 are provided by sacrifice layer etching when forming the hollow structures 115. As an example of sacrifice layer etching, there is a method whereby a sacrifice layer Si is etched using XeF2, a method whereby a sacrifice layer SiO2 is etched using a hydrofluoric acid aqueous solution, a hydrofluoric acid, gas, or the like, a method whereby a sacrifice layer SiGe is etched using ClF3, or the like.

The hollow structures 115 are formed in a portion below the corresponding magneto resistance element portions 150 in the above way. By so doing, the space portions 114 can be formed.

(Twenty-fifth Embodiment)

In this embodiment, a description will be given of a portion differing from the twenty-fourth embodiment. In the twenty-third embodiment, the hollow structure 115 is formed for each magneto resistance element portion 150, but this embodiment is characterized in that the space portions 114 are connected with each other by connecting the hollow structures 115 with each other.

Figure 39:
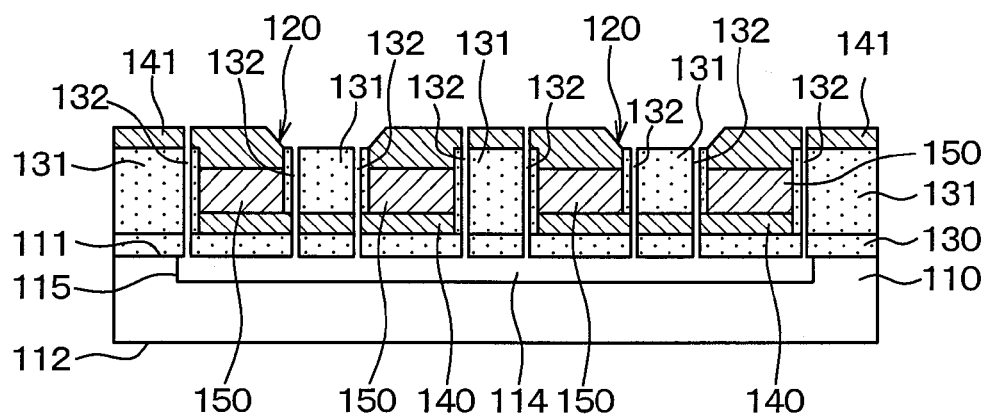
FIG. 39 is a sectional view including a magnetic sensor device according to a thirty-fifth embodiment of the present disclosure.

FIG. 39 is a sectional view including a magnetic sensor device according to this embodiment. As shown in this diagram, the hollow structures 115 provided corresponding to the magneto resistance element portions 150 are connected with each other into one hollow structure 115. As it is sufficient that the hollow structure 115 is provided corresponding to at least the magneto resistance element portions 150, a plurality of the hollow structures 115 do not have to be provided, and the hollow structure 115 may form a unified space portion 114, as shown in FIG. 39.

(Other Embodiments)

The configuration of the magnetic sensor device shown in each heretofore described embodiment is one example, and without being limited to the heretofore shown configurations, other configurations which can realize the invention can also be adopted. For example, in each heretofore described embodiment, the magnetic sensor device has been described as being applied to a vehicle but, of course, without being limited to a vehicle, can be widely utilized for detecting a rotation angle.

In each heretofore described embodiment, the magneto resistance element portions 150 have been configured as TMR elements, but may be configured as GMR elements.

In each heretofore described embodiment, the pin magnetic layer 151 of the magneto resistance element portion 150 has been locally heated by a laser beam being focused by the lens 160, but as a heating method, not only a laser, but also another method may be used. A description will be given, referring to FIGS. 40A to 40C, of this.

Figure 40A:
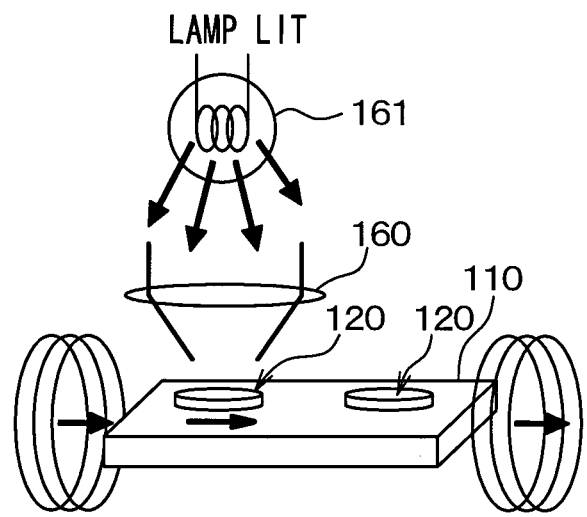
FIGS. 40A to 40C are diagrams for illustrating other embodiments.

Firstly, as shown in FIG. 40A, the pin magnetic layer 151 of the magneto resistance element portion 150 can be locally heated by lamp light emitted from a lamp 161 being focused by a lens 160. A xenon lamp, or the like, can be used as a lamp.

Figure 40B:
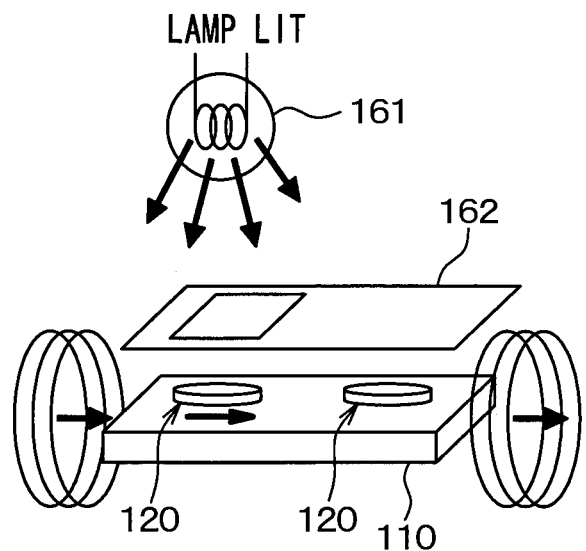

Also, as shown in FIG. 40B, a mask 162, rather than the lens 160, can be used as a portion for locally heating the magneto resistance element portion 150. A portion corresponding to the magneto resistance element portion 150 is opened in the mask 162, and the magneto resistance element portion 150 intended to be heated can be selected using this opening portion. The magneto resistance element portion 150 can be locally heated using the lamp 161 and the mask 162 in this way.

Figure 40C:
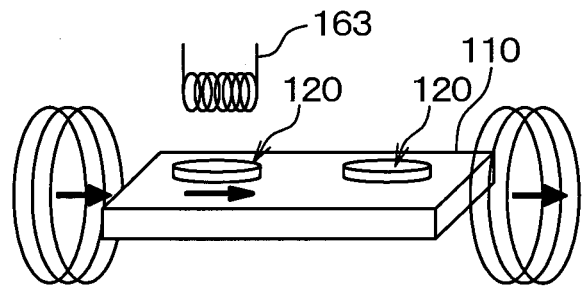

In addition, as shown in FIG. 40C, a heater 163 is disposed on the one surface 111 side of the substrate 110, and the magneto resistance element portion 150 can be locally heated with the heater 163 as a heat source. The magneto resistance element portion 150 may be locally heated by the heater 163 from the other surface 112 side of the substrate 110.

In each heretofore described embodiment, it has been described that two sensor portions 120 are formed on the substrate 110, but an arrangement may be such that a large number of sensor portions 120 are formed on a wafer-like substrate 110, and selective magnetization of the pin magnetic layers 151 may be carried out. By dividing a wafer after the magnetization, a large number of magnetic sensor devices can be manufactured from one wafer. When a large number of sensor portions 120 are formed on one wafer in this way, it is necessary to heat the whole of the one wafer, but when the magneto resistance element portion 150 is locally heated, and suppression of thermal diffusion is possible, as in each heretofore described embodiment, a large number of sensor portions 120 can be formed together on one wafer. Also, as a large number of sensor portions 120 are formed on one wafer, it is necessary to reduce variation in the magnetization directions of the pin magnetic layers 151 of the corresponding sensor portions 120, but as a local heating is carried out, as heretofore described, magnetization can be carried out while confirming the output of the sensor portions 120, and variation in the magnetization directions of the pin magnetic layers 151 can be reduced.

In the twenty-fourth embodiment, in order to form the hollow structures 115 in the substrate 110, the hole portions 132 penetrating the upper electrodes 141, the insulating film 131, and the insulating film 130 have been formed. However, the hollow structures 115 may be formed by the hole portions 132 in the substrate 110 being formed so as to extend from the other surface 112 side to the one surface 111 side of the substrate 110, and some portions of the substrate 110 on the one surface 111 side being removed via the hole portions 132 formed in the substrate 110.

In the twenty-fifth embodiment, a description has been given of a mode wherein the hollow structures 115 are connected, but with regard to the grooves 113 shown in the twenty-first to twenty-third embodiments too, one groove 113 corresponding to all the magneto resistance element portions 150 may be provided, rather than the groove 113 being formed for each magneto resistance element portion 50. Also, the one groove 113 may be filled with the embedded member 170 shown in the third embodiment.

The above disclosure has the following aspects.

According to a first aspect of the present disclosure, a manufacturing method of a magnetic sensor which includes: a substrate having one surface; and a plurality of magneto resistance element portions, arranged above the one surface of the substrate, each of which includes a free magnetic layer having a magnetization direction changeable in accordance with an external magnetic field and a pin magnetic layer having a fixed magnetization direction, wherein the fixed magnetization direction of the pin magnetic layer of one of the magneto resistance element portions is different from the fixed magnetization direction of the pin magnetic layer of another one of the magneto resistance element portions on a plane parallel to the one surface of the substrate, and wherein, when the external magnetic field is applied to each of the magneto resistance element portions, the magnetic sensor detects a physical amount based on a change in a resistance of each of the magneto resistance element portions, the manufacturing method of the magnetic sensor comprises: preparing the substrate; forming each of the magneto resistance element portions above the one surface of the substrate; forming a plurality of heater portions corresponding to the magneto resistance element portions, respectively; arranging the substrate, on which each of the magneto resistance element portions is formed, in the external magnetic field having an external magnetic field direction set to a first direction on the plane, heating with one portion of the heater portions corresponding to one portion of the plurality of magneto resistance element portions so as to execute a magnetic field annealing process, and thereby, magnetizing the pin magnetic layers of the one portion of the magneto resistance element portions in the first direction as the fixed magnetization direction; and arranging the substrate, on which each of the magneto resistance element portions is formed, in another external magnetic field having another external magnetic field direction set to a second direction on the plane different from the first direction, heating with another portion of the heater portions corresponding to another portion of the plurality of magneto resistance element portions different from the one portion of the plurality of magneto resistance element portions so as to execute another magnetic field annealing process, and thereby, magnetizing the pin magnetic layers of the another portion of the magneto resistance element portions in the second direction as the fixed magnetization direction.

According to this, by the heater portion corresponding to the magneto resistance element portion intended to be magnetized being heated in a magnetic field, only the relevant magneto resistance element portion can be magnetized. Also, by changing the direction of applied magnetic field, and heating the heater portion corresponding to another magneto resistance element portion, only the relevant magneto resistance element portion can be magnetized. In this way, each of the magneto resistance element portions formed on one substrate can be selectively magnetized in a differing magnetization direction. Also, as the direction of the substrate in a magnetic field can be adjusted while confirming the output of the magnetic sensor in the magnetization steps, variation in the output of the magnetic sensor can be corrected more in comparison with a case of realizing multipolarization by combining chips differing in magnetization direction. Because of this, a decrease in detection accuracy due to an assembly error of chips differing in magnetization direction can be prevented. Also, as the heater portions are heated by causing current to flow through the heater portions, the magneto resistance element portions can be extensively heated at one time, and a processing time can be shortened.

Alternatively, in the forming of the plurality of heater portions, each of the heater portions may be formed at a position in the substrate corresponding to a respective magneto resistance element portion.

Alternatively, in the forming of each of the magneto resistance element portions, each of the magneto resistance element portions may be formed above the one surface of the substrate so as to be positioned above a corresponding heater portion.

Alternatively, in the forming of the plurality of heater portions, each heater portion may be formed so that an area of the heater portion on the one surface of the substrate is larger than a corresponding magneto resistance element portion. In this case, as the whole of each of the magneto resistance element portions is heated by the corresponding heater portion, the pin magnetic layer can be reliably heated.

Alternatively, in the forming of each of the magneto resistance element portions, a trench may be formed in the substrate between the one portion of the heater portions corresponding to the one portion of the plurality of magneto resistance element portions and the another portion of the heater portions corresponding to the another portion of the plurality of magneto resistance element portions different from the one portion of the plurality of magneto resistance element portions. In this case, as the heat of one heater portion becomes unlikely to transfer to the other heater portion side owing to the existence of the trench, thermal diffusion of the heater portions can be suppressed.

Alternatively, in the forming of each of the magneto resistance element portions, the trench may be formed in the substrate so as to surround each of the heater portions. In this case, thermal diffusion of the heater portions can be more effectively suppressed.

Alternatively, in the forming of each of the magneto resistance element portions, after the trench is formed, the trench may be filled with an insulating body. In this case, as the insulating body which is a substance differing from the substrate is positioned in the trench, thermal diffusion of the heater portions can be effectively suppressed by the insulating body.

Alternatively, in the forming of the plurality of heater portions, one common heater corresponding to the one portion of the plurality of magneto resistance element portions may be formed, and another common heater corresponding to the another portion of the plurality of magneto resistance element portions different from the one portion of the plurality of magneto resistance element portions may be formed. In this case, the whole of one portion of the plurality of magneto resistance element portions can be heated by one heater portion, and these magneto resistance element portions can be magnetized together. In the same way, the whole of one portion differing from the one portion of the plurality of magneto resistance element portions can be heated by one heater portion, and these magneto resistance element portions can be magnetized together. Also, as it is sufficient to bias one heater portion, it is not necessary to carry out a heating operation on each of a plurality of heater portions. Consequently, a heater portion heating operation can be easily carried out.

Alternatively, in the forming of the plurality of heater portions, each heater portion corresponding to a respective magneto resistance element portion may be formed so as to surround the respective magneto resistance element portion. In this case, the range of choices for a base material of the magneto resistance element portions widens, and the crystallinity of a film configuring the magneto resistance element portions can be improved.

Alternatively, in the forming of the plurality of heater portions, each heater portion, which is smaller than a corresponding magneto resistance element portion, may be formed.

Alternatively, in the forming of the plurality of heater portions, each heater portion may have a plurality of heater sections, and the plurality of heater sections are formed so as to correspond to one of the magneto resistance element portions. In this case, when heating the magneto resistance element portion with the plurality of heater portions, the temperature distribution of the magneto resistance element portion can be homogenized.

Alternatively, in the forming of the plurality of heater portions, the plurality of the heater sections may be formed to be separated from each other on a same plane.

Alternatively, in the forming of the plurality of heater portions, each heater portion may be formed on a same plane of a corresponding magneto resistance element portion so as to surround the corresponding magneto resistance element portion. In this case, the range of choices for a base material of the magneto resistance element portions widens, and the crystallinity of a film configuring the magneto resistance element portions can be improved.

Alternatively, in the forming of the plurality of heater portions, each heater portion may be formed on an upper side of a corresponding magneto resistance element portion. In this case, the range of choices for a base material of the magneto resistance element portions widens, and the crystallinity of a film configuring the magneto resistance element portions can be improved.

Alternatively, the manufacturing method of the magnetic sensor may further comprises: forming a plurality of temperature detection portions corresponding to the plurality of heater portions, respectively, each temperature detection portion detecting temperature of a corresponding heater portion. In this case, a feedback control of the temperature of the heater portions can be implemented by using the temperature detected by the temperature detection portions. Because of this, the accuracy of temperature control of the heater portions can be improved.

Alternatively, in the forming of the plurality of temperature detection portions, each temperature detection portion may be formed in a same plane of a corresponding heater portion.

Alternatively, the manufacturing method of the magnetic sensor may further comprises: making a thickness of a portion of the substrate in a thickness direction, which corresponds to at least one of the heater portions and the magneto resistance element portions, smaller than a thickness of another portion of the substrate other than the portion of the substrate corresponding to the heater portions and the magneto resistance element portions. In this case, when heating the magneto resistance element portions with the heater portions, heat can be made likely to transfer from the heater portions to the magneto resistance element portion side. Because of this, the accuracy of temperature control of the heater portions can be improved.

Alternatively, in the forming of the plurality of heater portions, a circuit portion for calculating the physical amount based on an output of each of the magneto resistance element portions may be formed on the substrate. In this case, it is not necessary to prepare the circuit portion as a separate chip, and the magneto resistance element portions and the circuit portion can be integrated on the substrate.

Alternatively, in the forming of the plurality of heater portions, each heater portion may be made of any one of materials of polysilicon, single-crystal silicon, platinum, nickel chrome, tantalum nitride, silicon carbide and tungsten. A material of the heater portions can be selected in this way. When forming the heater portions using polysilicon as a material, there is an advantage of easily making the heater portions. Also, when forming the heater portions using single-crystal silicon as a material, there is an advantage of being able to accurately control the temperature of the heater portions when heating the heater portions. Furthermore, when forming the heater portions using platinum as a material, there is an advantage of being able to reduce cost.

According to a second aspect of the present disclosure, a magnetic sensor comprises: a substrate having one surface; and a plurality of magneto resistance element portions, disposed above the one surface of the substrate, each of which includes: a free magnetic layer having a magnetization direction changeable in accordance with an external magnetic field; and a pin magnetic layer having a fixed magnetization direction. The magnetization direction of the pin magnetic layer of one of the magneto resistance element portions is different from the magnetization direction of the pin magnetic layer of another one of the magneto resistance element portions on a plane parallel to the one surface of the substrate. When the external magnetic field is applied to each of the magneto resistance element portions, the magnetic sensor detects a physical amount based on a change in a resistance of each of the magneto resistance element portions. The magnetic sensor further comprises: a plurality of heater portions corresponding to the magneto resistance element portions, respectively, wherein each heater portion heats a corresponding pin magnetic layer when the pin magnetic layer is magnetized, so that the pin magnetic layer of the one of the magneto resistance element portions is magnetized in a direction as the fixed magnetization direction, which is different from the fixed magnetization direction of the pin magnetic layer of the another one of the magneto resistance element portions.

According to the heretofore described magnetic sensor, as the substrate has the heater portions corresponding to the magneto resistance element portions, a magnetic sensor which can selectively magnetize the pin magnetic layer of the magneto resistance element portion intended to be magnetized can be provided. Also, as magnetization can be carried out while adjusting the direction of the substrate in a magnetic field while confirming the output of the magnetic sensor, variation in the output of the magnetic sensor can be corrected more in comparison with a case of realizing multipolarization by combining chips differing in magnetization direction. Because of this, a magnetic sensor with no decrease in detection accuracy due to an assembly error of chips differing in magnetization direction, and with good detection accuracy can be provided. Also, as the heater portions are heated by causing current to flow through the heater portions, the magneto resistance element portions can be extensively heated at one time, and a processing time can be shortened.

According to a third aspect of the present disclosure, a manufacturing method of a magnetic sensor which includes: a substrate having one surface; and a plurality of magneto resistance element portions, arranged above the one surface of the substrate, each of which includes a free magnetic layer having a magnetization direction changeable in accordance with an external magnetic field and a pin magnetic layer having a fixed magnetization direction, wherein the fixed magnetization direction of the pin magnetic layer of one of the magneto resistance element portions is different from the fixed magnetization direction of the pin magnetic layer of another one of the magneto resistance element portions on a plane parallel to the one surface of the substrate, and wherein, when the external magnetic field is applied to each of the magneto resistance element portions, the magnetic sensor detects a physical amount based on a change in a resistance of each of the magneto resistance element portions, the manufacturing method of the magnetic sensor comprises: preparing the substrate; forming each of the magneto resistance element portions above the one surface of the substrate; forming a plurality of space portions in certain portions of the substrate corresponding to the magneto resistance element portions, respectively, so that a thickness of each certain portion of the substrate is smaller than a thickness of another portion of the substrate different from the certain portions; arranging the substrate, on which each of the magneto resistance element portions is formed, in the external magnetic field having an external magnetic field direction set to a first direction on the plane, heating one portion of the plurality of magneto resistance element portions locally so as to execute a magnetic field annealing process, and thereby, magnetizing the pin magnetic layers of the one portion of the magneto resistance element portions in the first direction as the fixed magnetization direction; and arranging the substrate, on which each of the magneto resistance element portions is formed, in another external magnetic field having another external magnetic field direction set to a second direction on the plane different from the first direction, heating another portion of the plurality of magneto resistance element portions different from the one portion of the plurality of magneto resistance element portions so as to execute a magnetic field annealing process, and thereby, magnetizing the pin magnetic layers of the another portion of the magneto resistance element portions in the second direction as the fixed magnetization direction.

According to the heretofore described manufacturing method, as the space portions are provided in portions of the substrate corresponding to the magneto resistance element portions, the thermal conduction of portions of the substrate reduced in thickness by the space portions can be suppressed. Consequently, the influence of thermal diffusion on the other magneto resistance element portions can be reduced in the magnetization steps.

Alternatively, in the forming of the plurality of space portions, each space portion may be formed by forming a groove in another surface opposite to the one surface of the substrate.

Alternatively, an embedded member may be embedded in each groove after the magnetizing of the pin magnetic layers of the another portion of the magneto resistance element portions.

Alternatively, in the forming of the plurality of space portions, the space portions may be formed by forming hollow structures in the certain portions of the substrate corresponding to the magneto resistance element portions, respectively.

Alternatively, in the forming of the plurality of space portions, the space portions corresponding to the magneto resistance element portions, respectively, may be formed so as to connect to each other.

According to a third aspect of the present disclosure, a magnetic sensor comprises: a substrate having one surface;

and a plurality of magneto resistance element portions, disposed above the one surface of the substrate, each of which includes: a free magnetic layer having a magnetization direction changeable in accordance with an external magnetic field; and a pin magnetic layer having a fixed magnetization direction. The magnetization direction of the pin magnetic layer of one of the magneto resistance element portions is different from the magnetization direction of the pin magnetic layer of another one of the magneto resistance element portions on a plane parallel to the one surface of the substrate. When the external magnetic field is applied to each of the magneto resistance element portions, the magnetic sensor detects a physical amount based on a change in a resistance of each of the magneto resistance element portions. The substrate includes a plurality of space portions disposed in certain portions of the substrate corresponding to the magneto resistance element portions, respectively, so that a thickness of each certain portion of the substrate is smaller than a thickness of another portion of the substrate different from the certain portions.

As the substrate has the space portions corresponding to the magneto resistance element portions in this way, a structure wherein the thermal conduction of the portions of the substrate reduced in thickness by the space portions can be suppressed can be adopted. Consequently, a structure wherein, when magnetizing the pin magnetic layer of the magneto resistance element portion, the influence of thermal diffusion on the other magneto resistance element portion can be reduced can be adopted.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A magnetic sensor comprising:
   a substrate having one surface; and
   a plurality of magneto resistance element portions, disposed above the one surface of the substrate, each of which includes: a free magnetic layer having a magnetization direction changeable in accordance with an external magnetic field; and a pin magnetic layer having a fixed magnetization direction,
   wherein the magnetization direction of the pin magnetic layer of one of the magneto resistance element portions is different from the magnetization direction of the pin magnetic layer of another one of the magneto resistance element portions on a plane parallel to the one surface of the substrate,
   wherein, when the external magnetic field is applied to each of the magneto resistance element portions, the magnetic sensor detects a physical amount based on a change in a resistance of each of the magneto resistance element portions,
   the magnetic sensor further comprising:
   a plurality of heater portions, each corresponding to one of the magneto resistance element portions,
   wherein one of the heater portions corresponding to the one of the magneto resistance element portions heats a corresponding pin magnetic layer under a condition that the substrate is arranged in the external magnetic field having an external magnetic field direction set to a first direction on the plane when the pin magnetic layer is magnetized, so that the pin magnetic layer of the one of the magneto resistance element portions is magnetized in the first direction as the fixed magnetization direction, which is different from the fixed magnetization direction of the pin magnetic layer of the another one of the magneto resistance element portions that is magnetized in a second direction as the fixed magnetization direction in such a manner that another one of the heater portions corresponding to the another one of the magneto resistance element portions different from the one of the magneto resistance element portions heats a corresponding pin magnetic layer under a condition that the substrate is arranged in another external magnetic field having another external magnetic field direction set to the second direction on the plane different from the first direction.

2. The magnetic sensor according to claim 1,
   wherein the heater portions are disposed in the substrate.

3. The magnetic sensor according to claim 2,
   wherein the magneto resistance element portions are positioned above the corresponding heater portions, respectively.

4. The magnetic sensor according to claim 2,
   wherein an area of each heater portion on the one surface of the substrate is larger than a corresponding magneto resistance element portion.

5. The magnetic sensor according to claim 2,
   wherein each heater portion is arranged so as to surround a corresponding magneto resistance element portion.

6. The magnetic sensor according to claim 2,
   wherein each heater portion is smaller than a corresponding magneto resistance element portion.

7. The magnetic sensor according to claim 6,
   wherein a plurality of heater sections are arranged so as to correspond to one of the magneto resistance element portions.

8. The magnetic sensor according to claim 7,
   wherein the plurality of heater sections are arranged to be separated from each other on a same plane.

9. The magnetic sensor according to claim 1,
   wherein the substrate further includes a trench between one portion of the heater portions corresponding to one portion of the plurality of magneto resistance element pardons and another portion of the heater portions corresponding to another portion of the plurality of magneto resistance element portions different from the one portion of the plurality of magneto resistance element portions.

10. The magnetic sensor according to claim 9,
    wherein the trench is disposed in the substrate so as to surround each of the heater portions.

11. The magnetic sensor according to claim 9,
    wherein an insulating body is embedded in the trench.

12. The magnetic sensor according to claim 1,
    wherein
    the heater portions corresponding to one portion of the plurality of magneto resistance element portions are common, and
    the heater portions corresponding to another portion of the plurality of magneto resistance element portions different from the one portion of the plurality of magneto resistance element portions are common.

13. The magnetic sensor according to claim 1,
    wherein the heater portions and the magneto resistance element portions are disposed on a same plane, and wherein each heater portion surrounds a corresponding magneto resistance element portion.

14. The magnetic sensor according to claim 1,
wherein each heater portion is disposed on an upper side of a corresponding magneto resistance element portion.

15. The magnetic sensor according to claim 1, further comprising:
a plurality of temperature detection portions, arranged so as to correspond to the heater portions, respectively, each of which detects temperature of a corresponding heater portion.

16. The magnetic sensor according to claim 15,
wherein each temperature detection portion is disposed in a same plane as a corresponding heater portion.

17. The magnetic sensor according to claim 1,
wherein a thickness of a portion of the substrate in a thickness direction, which corresponds to at least one of the heater portions and the magneto resistance element portions, is smaller than a thickness of another portion of the substrate other than the portion of the substrate corresponding to the heater portions and the magneto resistance element portions.

18. The magnetic sensor according to claim 1,
wherein the substrate further includes a circuit portion which calculates the physical amount based on an output of each of the magneto resistance element portions.

19. The magnetic sensor according to claim 1,
wherein the heater portions are made of any one of polysilicon, single-crystal silicon, platinum, nickel chrome, tantalum nitride, silicon carbide, and tungsten.

20. A magnetic sensor comprising:
a substrate having a first surface;
a first magneto resistance element portion, disposed above the first surface of the substrate, and including
a first free magnetic layer having a first variable magnetization direction changeable in accordance with a variable external magnetic field, and
a first pin magnetic layer having a first fixed magnetization direction;
a first heater portion formed in a first position corresponding to the first magneto resistance element portion, the first heater portion being configured to heat the first pin magnetic layer;
a second magneto resistance element portion, disposed above the first surface of the substrate, and including
a second free magnetic layer having a second variable magnetization direction changeable in accordance with the variable external magnetic field, and
a second pin magnetic layer having a second fixed magnetization direction; and
a second heater portion formed in a second position corresponding to the second magneto resistance element portion, the second heater portion being configured to heat the second pin magnetic layer,
wherein
the first fixed magnetization direction is different from the second fixed magnetization direction in a plane parallel to the first surface of the substrate,
the first and second magneto resistance element portions are configured such that when the variable external magnetic field is applied to each of the first and second magneto resistance element portions, the magnetic sensor calculates a value based on a change in a resistance of each of the first and second magneto resistance element portions,
the first pin magnetic layer is configured such that when it is magnetized in the first fixed magnetization direction by the variable external magnetic field and heated by the first heater portion, it will become persistently magnetized in the first fixed magnetization direction, and
the second pin magnetic layer is configured such that when it is magnetized in the second fixed magnetization direction by the variable external magnetic field and heated by the second heater portion, it will become persistently magnetized in the second fixed magnetization direction.

21. The magnetic sensor according to claim 20, wherein the first and second heater portions are disposed in the substrate.

22. The magnetic sensor according to claim 21, wherein
the first magneto resistance element portion is positioned above the first heater portion, and
the second magneto resistance element portion is positioned above the second heater portion.

23. The magnetic sensor according to claim 21, wherein
an area of the first heater portion over the first surface of the substrate is larger than an area of the first magneto resistance element portion over the first surface of the substrate, and
an area of the second heater portion over the first surface of the substrate is larger than an area of the second magneto resistance element portion over the first surface of the substrate.

24. The magnetic sensor according to claim 21, wherein
the first heater portion is configured so as to surround the first magneto resistance element portion, and
the second heater portion is configured so as to surround the second magneto resistance element portion.

25. The magnetic sensor according to claim 21, wherein
an area of the first heater portion over the first surface of the substrate is smaller than an area of the first magneto resistance element portion over the first surface of the substrate, and
an area of the second heater portion over the first surface of the substrate is smaller than an area of the second magneto resistance element portion over the first surface of the substrate.

26. The magnetic sensor according to claim 25, further comprising
a third heater portion formed under the first magneto resistance element portion, the third heater portion being configured to heat the first pin magnetic layer,
a fourth heater portion formed under the second magneto resistance element portion, the fourth heater portion being configured to heat the second pin magnetic layer,
wherein
an area of the third heater portion over the first surface of the substrate is smaller than an area of the first magneto resistance element portion over the first surface of the substrate, and
an area of the fourth heater portion over the first surface of the substrate is smaller than an area of the second magneto resistance element portion over the first surface of the substrate.

27. The magnetic sensor according to claim 26, wherein the first, second, third, and fourth heater sections are arranged to be separated from each other on a same plane.

28. The magnetic sensor according to claim 20, wherein the substrate further includes a trench formed between the first and second heater portions.

29. The magnetic sensor according to claim 28, wherein an insulating body is embedded in the trench.

30. The magnetic sensor according to claim 20, wherein the substrate further includes a first trench formed to surround the first heater portion, and a second trench formed to surround the second heater portion.

31. The magnetic sensor according to claim 20, further comprising:
    a third magneto resistance element portion, disposed above the first surface of the substrate, and including
        a third free magnetic layer having a third variable magnetization direction changeable in accordance with a variable external magnetic field, and
        a third pin magnetic layer having a third fixed magnetization direction;
    a fourth magneto resistance element portion, disposed above the first surface of the substrate, and including
        a fourth free magnetic layer having a fourth variable magnetization direction changeable in accordance with the variable external magnetic field, and
        a fourth pin magnetic layer having a fourth fixed magnetization direction,
    wherein
    the first position of the first heater corresponds to the first and third magneto resistant element portions, and is configured to heat the first and third pin magnetic layers, and
    the second position of the second heater corresponds to the second and fourth magneto resistant element portions, and is configured to heat the second and fourth pin magnetic layers.

32. The magnetic sensor according to claim 20, wherein
    the first and second heater portions and the first and second magneto resistance element portions are disposed on a same plane,
    the first heater portion is configured to surround the first magneto resistance element portion, and
    the second heater portion is configured to surround the second magneto resistance element portion.

33. The magnetic sensor according to claim 20, wherein
    the first heater portion is formed above the first magneto resistance element portion, and
    the second heater portion is formed above the second magneto resistance element portion.

34. The magnetic sensor according to claim 20, further comprising:
    a first temperature detection portion, arranged so as to correspond to the first heater portion, and to detect a first temperature of the first heater portion, and
    a second temperature detection portion, arranged so as to correspond to the second heater portion, and to detect a second temperature of the second heater portion.

35. The magnetic sensor according to claim 34, wherein
    the first and second temperature detection portions are disposed in a same plane as the first and second heater portions.

36. The magnetic sensor according to claim 20, wherein
    a first thickness of a first portion of the substrate in a thickness direction, which corresponds to the first heater portion and the first magneto resistance element portion, is smaller than a thickness of a remaining portion of the substrate, and
    a second thickness of a second portion of the substrate in a thickness direction, which corresponds to the second heater portion and the second magneto resistance element portion, is smaller than the thickness of the remaining portion of the substrate.

37. The magnetic sensor according to claim 20, wherein
    the substrate further includes a circuit portion configured to calculate the value based on an output of the first and second magneto resistance element portions.

38. The magnetic sensor according to claim 20, wherein
    the first and second heater portions are made of any one of polysilicon, single-crystal silicon, platinum, nickel chrome, tantalum nitride, silicon carbide, and tungsten.

* * * * *